(12) United States Patent
Kurokawa et al.

(10) Patent No.: US 11,710,751 B2
(45) Date of Patent: Jul. 25, 2023

(54) SEMICONDUCTOR DEVICE AND MANUFACTURING METHOD THEREOF

(71) Applicant: Semiconductor Energy Laboratory Co., Ltd., Atsugi (JP)

(72) Inventors: Yoshiyuki Kurokawa, Sagamihara (JP); Takayuki Ikeda, Atsugi (JP); Hikaru Tamura, Zama (JP); Munehiro Kozuma, Isehara (JP); Masataka Ikeda, Atsugi (JP); Takeshi Aoki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/490,009

(22) Filed: Sep. 30, 2021

(65) Prior Publication Data

US 2022/0020793 A1 Jan. 20, 2022

Related U.S. Application Data

(63) Continuation of application No. 16/591,983, filed on Oct. 3, 2019, now Pat. No. 11,139,327, which is a (Continued)

(30) Foreign Application Priority Data

Mar. 8, 2010 (JP) ................................ 2010-050486

(51) Int. Cl.
  *H01L 27/146* (2006.01)
  *H01L 29/786* (2006.01)
  (Continued)

(52) U.S. Cl.
  CPC .. *H01L 27/14616* (2013.01); *H01L 27/14603* (2013.01); *H01L 27/14636* (2013.01);
  (Continued)

(58) Field of Classification Search
  CPC ......... H01L 27/14616; H01L 27/14603; H01L 27/14636; H01L 27/14643; H01L 29/7869;
  (Continued)

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

CN   101515594 A   8/2009
EP      1259066 A  11/2002
(Continued)

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.
(Continued)

*Primary Examiner* — Albert H Cutler
(74) *Attorney, Agent, or Firm* — Robinson Intellectual Property Law Office; Eric J. Robinson

(57) ABSTRACT

In a CMOS image sensor in which a plurality of pixels is arranged in a matrix, a transistor in which a channel formation region includes an oxide semiconductor is used for each of a charge accumulation control transistor and a reset transistor which are in a pixel portion. After a reset operation of the signal charge accumulation portion is performed in all the pixels arranged in the matrix, a charge accumulation operation by the photodiode is performed in all the pixels, and a read operation of a signal from the pixel is performed per row. Accordingly, an image can be taken without a distortion.

4 Claims, 38 Drawing Sheets

Related U.S. Application Data continuation of application No. 15/177,460, filed on Jun. 9, 2016, now Pat. No. 10,535,691, which is a continuation of application No. 14/986,119, filed on Dec. 31, 2015, now Pat. No. 9,515,107, which is a continuation of application No. 14/827,809, filed on Aug. 17, 2015, now Pat. No. 9,257,567, which is a continuation of application No. 14/600,279, filed on Jan. 20, 2015, now Pat. No. 9,153,619, which is a continuation of application No. 13/942,428, filed on Jul. 15, 2013, now Pat. No. 8,964,085, which is a continuation of application No. 13/037,889, filed on Mar. 1, 2011, now Pat. No. 8,654,231.

(51) Int. Cl.
  *H01L 31/105*  (2006.01)
  *H04N 25/63*  (2023.01)
  *H04N 25/75*  (2023.01)
  *H04N 25/76*  (2023.01)

(52) U.S. Cl.
  CPC .... *H01L 27/14643* (2013.01); *H01L 29/7869* (2013.01); *H01L 31/1055* (2013.01); *H04N 25/63* (2023.01); *H04N 25/75* (2023.01); *H04N 25/76* (2023.01); *H01L 27/14632* (2013.01)

(58) Field of Classification Search
  CPC .......... H01L 31/1055; H01L 27/14632; H04N 5/361; H04N 5/374; H04N 5/378; H04N 25/63; H04N 25/75; H04N 25/76
  See application file for complete search history.

(56) References Cited

U.S. PATENT DOCUMENTS

| | | | |
|---|---|---|---|
| 5,812,191 A | 9/1998 | Orava et al. | |
| 6,294,274 B1 | 9/2001 | Kawazoe et al. | |
| 6,480,227 B1 | 11/2002 | Yoneyama | |
| 6,563,174 B2 | 5/2003 | Kawasaki et al. | |
| 6,727,522 B1 | 4/2004 | Kawasaki et al. | |
| 6,747,638 B2 | 6/2004 | Yamazaki et al. | |
| 6,855,937 B2 | 2/2005 | Tashiro et al. | |
| 7,046,282 B1 | 5/2006 | Zhang et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,115,923 B2 | 10/2006 | Hong | |
| 7,129,500 B2 | 10/2006 | Tashiro et al. | |
| 7,129,979 B1 | 10/2006 | Lee | |
| 7,153,719 B2 | 12/2006 | Patrick et al. | |
| 7,176,462 B2 | 2/2007 | Mabuchi | |
| 7,211,825 B2 | 5/2007 | Shih et al. | |
| 7,214,974 B2 | 5/2007 | Shin | |
| 7,235,772 B2 | 6/2007 | Ko et al. | |
| 7,238,544 B2 | 7/2007 | Hong | |
| 7,271,430 B2 | 9/2007 | Park et al. | |
| 7,271,835 B2 | 9/2007 | Iizuka et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,410,823 B2 | 8/2008 | Shin | |
| 7,411,209 B2 | 8/2008 | Endo et al. | |
| 7,417,268 B2 | 8/2008 | Cazaux et al. | |
| 7,427,736 B2 | 9/2008 | Xu et al. | |
| 7,453,065 B2 | 11/2008 | Saito et al. | |
| 7,453,087 B2 | 11/2008 | Iwasa | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,511,275 B2 | 3/2009 | Mabuchi | |
| 7,517,714 B2 | 4/2009 | Park et al. | |
| 7,525,523 B2 | 4/2009 | Yamazaki et al. | |
| 7,592,655 B2 | 9/2009 | Ohkawa et al. | |
| 7,638,825 B2 | 12/2009 | Hong | |
| 7,663,165 B2 | 2/2010 | Mouli | |
| 7,674,650 B2 | 3/2010 | Akimoto et al. | |
| 7,687,832 B2 | 3/2010 | Patrick et al. | |
| 7,732,819 B2 | 6/2010 | Akimoto et al. | |
| 7,755,016 B2 | 7/2010 | Toda et al. | |
| 7,855,369 B2 | 12/2010 | Takahashi | |
| 7,952,627 B2 | 5/2011 | Morimoto et al. | |
| 7,956,915 B2 | 6/2011 | Gomi | |
| 7,965,329 B2 | 6/2011 | Mccarten et al. | |
| 8,102,441 B2 | 1/2012 | Kume | |
| 8,115,846 B2 | 2/2012 | Chuang et al. | |
| 8,134,151 B2 | 3/2012 | Imai | |
| 8,188,524 B2 | 5/2012 | Lee | |
| 8,455,809 B2 | 6/2013 | Kudo | |
| 8,471,939 B2 | 6/2013 | Tivarus et al. | |
| 8,586,979 B2 | 11/2013 | Son et al. | |
| 8,642,402 B2 | 2/2014 | Yano et al. | |
| 8,817,143 B2 | 8/2014 | Murata et al. | |
| 8,975,103 B2 | 3/2015 | Lee | |
| 9,006,635 B2 | 4/2015 | Kurokawa et al. | |
| 9,111,837 B2 | 8/2015 | Takamiya et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0096443 A1 | 5/2003 | Hwang | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0096124 A1 | 5/2004 | Nakamura | |
| 2004/0099886 A1 | 5/2004 | Rhodes et al. | |
| 2004/0113151 A1 | 6/2004 | Sekine | |
| 2004/0127038 A1 | 7/2004 | Carcia et al. | |
| 2004/0178430 A1 | 9/2004 | Rhodes et al. | |
| 2004/0188597 A1* | 9/2004 | Inoue ............... H01L 27/14603 250/214 R |
| 2005/0017302 A1 | 1/2005 | Hoffman | |
| 2005/0057680 A1 | 3/2005 | Agan | |
| 2005/0199959 A1 | 9/2005 | Chiang et al. | |
| 2006/0035452 A1 | 2/2006 | Carcia et al. | |
| 2006/0038904 A1 | 2/2006 | Kudoh | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0157760 A1 | 7/2006 | Hayashi et al. | |
| 2006/0157761 A1* | 7/2006 | Park ................... H04N 5/3745 257/293 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208285 A1 | 9/2006 | Inoue et al. | |
| 2006/0208291 A1 | 9/2006 | Koizumi et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0018075 A1 | 1/2007 | Cazaux et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0069258 A1 | 3/2007 | Ahn | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |

(56) References Cited

U.S. PATENT DOCUMENTS

| | | |
|---|---|---|
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0258008 A1 | 11/2007 | Kameshima et al. |
| 2007/0272922 A1 | 11/2007 | Kim et al. |
| 2007/0278536 A1 | 12/2007 | Adachi |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0054319 A1 | 3/2008 | Mouli |
| 2008/0073653 A1 | 3/2008 | Iwasa |
| 2008/0083950 A1 | 4/2008 | Pan et al. |
| 2008/0088724 A1 | 4/2008 | Kudoh |
| 2008/0106191 A1 | 5/2008 | Kawase |
| 2008/0128689 A1 | 6/2008 | Lee et al. |
| 2008/0128768 A1 | 6/2008 | Kao |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0296645 A1 | 12/2008 | Itonaga |
| 2009/0001380 A1 | 1/2009 | Yang et al. |
| 2009/0068773 A1 | 3/2009 | Lai et al. |
| 2009/0072122 A1 | 3/2009 | Tada et al. |
| 2009/0073325 A1 | 3/2009 | Kuwabara et al. |
| 2009/0101948 A1 | 4/2009 | Park et al. |
| 2009/0114910 A1 | 5/2009 | Chang |
| 2009/0134336 A1 | 5/2009 | Takahashi |
| 2009/0134399 A1 | 5/2009 | Sakakura et al. |
| 2009/0146967 A1 | 6/2009 | Ino et al. |
| 2009/0152506 A1 | 6/2009 | Umeda et al. |
| 2009/0152541 A1 | 6/2009 | Maekawa et al. |
| 2009/0179239 A1 | 7/2009 | Park et al. |
| 2009/0201400 A1 | 8/2009 | Zhang et al. |
| 2009/0278122 A1 | 11/2009 | Hosono et al. |
| 2009/0280600 A1 | 11/2009 | Hosono et al. |
| 2009/0295769 A1 | 12/2009 | Yamazaki et al. |
| 2009/0316030 A1 | 12/2009 | Dai |
| 2010/0045833 A1 | 2/2010 | Iwabuchi et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117991 A1 | 5/2010 | Koyama et al. |
| 2010/0128004 A1 | 5/2010 | Harada et al. |
| 2010/0177226 A1 | 7/2010 | Itonaga et al. |
| 2010/0182282 A1 | 7/2010 | Kurokawa et al. |
| 2010/0182469 A1 | 7/2010 | Takamiya et al. |
| 2010/0238135 A1 | 9/2010 | Brown et al. |
| 2011/0043488 A1 | 2/2011 | Kurokawa et al. |
| 2011/0102620 A1 | 5/2011 | Sakano et al. |
| 2011/0109781 A1 | 5/2011 | Sato |
| 2011/0128400 A1 | 6/2011 | Wakano et al. |
| 2011/0176038 A1 | 7/2011 | Kurokawa et al. |
| 2011/0181749 A1 | 7/2011 | Yamada |
| 2011/0187911 A1 | 8/2011 | Shinohara |
| 2012/0019699 A1 | 1/2012 | Masuda et al. |
| 2012/0033117 A1 | 2/2012 | Murata et al. |
| 2012/0081585 A1 | 4/2012 | Takenaka |
| 2013/0038768 A1 | 2/2013 | Maruyama et al. |
| 2013/0049082 A1 | 2/2013 | Kato et al. |
| 2013/0201376 A1 | 8/2013 | Kato et al. |
| 2013/0207125 A1 | 8/2013 | Yamazaki et al. |
| 2014/0139713 A1 | 5/2014 | Gomi et al. |
| 2014/0267864 A1 | 9/2014 | Kurokawa et al. |
| 2016/0005783 A1 | 1/2016 | Itonaga et al. |
| 2016/0014365 A1 | 1/2016 | Mizuguchi |

FOREIGN PATENT DOCUMENTS

| | | |
|---|---|---|
| EP | 1515540 A | 3/2005 |
| EP | 1703563 A | 9/2006 |
| EP | 1737044 A | 12/2006 |
| EP | 2086013 A | 8/2009 |
| EP | 2151740 A | 2/2010 |
| EP | 2157615 A | 2/2010 |
| EP | 2178293 A | 4/2010 |
| EP | 2190188 A | 5/2010 |
| EP | 2226847 A | 9/2010 |
| EP | 2242248 A | 10/2010 |
| EP | 2280536 A | 2/2011 |
| EP | 2378763 A | 10/2011 |
| EP | 2378764 A | 10/2011 |
| EP | 2479983 A | 7/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-285472 A | 10/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-246580 A | 8/2002 |
| JP | 2002-289859 A | 10/2002 |
| JP | 2002-345797 A | 12/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-111590 A | 4/2004 |
| JP | 2004-273614 A | 9/2004 |
| JP | 2004-273732 A | 9/2004 |
| JP | 2006-191236 A | 7/2006 |
| JP | 2007-006478 A | 1/2007 |
| JP | 2007-074435 A | 3/2007 |
| JP | 2007-184928 A | 7/2007 |
| JP | 2008-042714 A | 2/2008 |
| JP | 2008-258716 A | 10/2008 |
| JP | 2009-040628 A | 2/2009 |
| JP | 2009-105381 A | 5/2009 |
| JP | 2009-130209 A | 6/2009 |
| JP | 2009-135350 A | 6/2009 |
| JP | 2009-218218 A | 9/2009 |
| JP | 2009-535819 | 10/2009 |
| JP | 2009-540628 | 11/2009 |
| JP | 2010-025218 A | 2/2010 |
| JP | 2010-050146 A | 3/2010 |
| JP | 2010-074138 A | 4/2010 |
| JP | 2010-252118 A | 11/2010 |
| KR | 2005-0026897 A | 3/2005 |
| KR | 2005-0115813 A | 12/2005 |
| KR | 2006-0060695 A | 6/2006 |
| KR | 2006-0101179 A | 9/2006 |
| KR | 2007-0053248 A | 5/2007 |
| KR | 2008-0106120 A | 12/2008 |
| TW | 200931962 | 7/2009 |
| WO | WO-2004/114391 | 12/2004 |
| WO | WO-2005/022638 | 3/2005 |
| WO | WO-2006/023428 | 3/2006 |
| WO | WO-2007/145346 | 12/2007 |
| WO | WO-2008/027392 | 3/2008 |
| WO | WO-2008/096768 | 8/2008 |
| WO | WO-2009/099814 | 8/2009 |

(56) References Cited

FOREIGN PATENT DOCUMENTS

| WO | WO-2009/119417 | 10/2009 |
|---|---|---|
| WO | WO-2009/144993 | 12/2009 |

OTHER PUBLICATIONS

International Search Report (Application No. PCT/JP2011/054211) dated Mar. 29, 2011.
Written Opinion (Application No. PCT/JP2011/054211) dated Mar. 29, 2011.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven By the Threshold Voltage Controlled Amorphous GIZO (Ga2O3—In2O3-ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2: AL and SN-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AMOLED Driven by PEALD Grown ZnO TFT", IMID '07 DIGEST, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions On Electron Devices, Jul. 1, 1995, vol. 42, No. 7, pp. 1240-1246.
Kikuchi.H et al., "39.1 Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor forthe Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure To Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Chinese Office Action (Application No. 201180012932.2) dated Nov. 3, 2014.
Taiwanese Office Action (Application No. 105125301) dated Jan. 25, 2017.
Korean Office Action (Application No. 2017-7027316) dated Oct. 16, 2017.
Korean Office Action (Application No. 2018-7018410) dated Jul. 6, 2018.
Park.J et al., "Control of threshold voltage in ZnO-based oxide thin film transistors", Appl. Phys. Lett. (Applied Physics Letters) , Jul. 23, 2008, vol. 93, No. 3, pp. 033513-1-033513-3.
Fish.A et al., "Chapter 4: Active Pixel Sensor Design: From Pixels to Systems", CMOS Imagers: From Phototransduction to Image Processing, 2004, pp. 99-139.
German Office Action (Application No. 112011100842.2) dated Nov. 16, 2020.

\* cited by examiner

SEMICONDUCTOR DEVICE AND MANUFACTURING METHOD THEREOF

TECHNICAL FIELD

One embodiment of the present invention relates to a semiconductor device in which pixels each provided with a photosensor are arranged in a matrix and to a driving method of the semiconductor device. Further, one embodiment of the present invention relates to an electronic device including the semiconductor device.

Note that the semiconductor device in this specification refers to all devices that can function by utilizing semiconductor characteristics, and electro-optic devices, semiconductor circuits, and electronic devices are all semiconductor devices.

BACKGROUND ART

As a semiconductor device in which pixels each provided with a photosensor are arranged in a matrix, an image sensor is known. The image sensors are provided in many portable devices such as a digital camera or a cellular phone as imaging elements. In recent years, the definition of imaging has been increased, the portable devices have been downsized, and power consumption has been reduced; therefore, a pixel in the image sensor has been made smaller.

As an image sensor in general use, two kinds of sensors are known: a charge coupled device (CCD) sensor and a complementary metal oxide semiconductor (CMOS) sensor. The CCD sensor is an image sensor in which charge is transmitted by a vertical CCD and a horizontal CCD. The CMOS sensor is an image sensor formed using a CMOS process. In the CMOS sensor, reading of charge can be controlled per pixel unit by switching of a MOS transistor.

The CCD sensor has high sensitivity; however, when excessive light is incident on part of a photodiode, charge which is greater than or equal to the maximum permissible value flows into a vertically transfer CCD, and a longitudinal emission line, called a smear, is generated. Further, the CCD has problems such as high production cost with a dedicated process and large power consumption due to many power sources.

In contrast, although the CMOS sensor has lower sensitivity than the CCD sensor, a general-purpose CMOS process can be utilized and circuits can be integrated in one chip. Therefore, the CMOS sensor can achieve low cost and low power consumption. Further, the CMOS sensor amplifies a signal in a pixel and outputs it; therefore, the influence of noise can be reduced. In addition, because the method for transmitting charge by the CMOS sensor is different from that by the CCD sensor, a smear is not generated.

However, for the conventional CMOS sensor, a rolling shutter system by which pixels arranged in a matrix are driven per row has been adopted. This rolling shutter system had a problem that an image was warped when an image of an object which moves fast was taken. In contrast, for the CCD sensor, a global shutter system by which charge is accumulated at the same time in all the pixels is adopted.

As a means in which the CMOS sensor with global shutter is used, Patent Document 1 discloses a technique in which a mechanical shutter is used together to control the current of a photodiode. In addition, Patent Document 2 discloses a technique in which a path ejecting unwanted charge which is generated in a photodiode after light exposure is terminated is provided to suppress leakage of accumulated charge.

REFERENCE

[Patent Document 1] Japanese Published Patent Application No. 2006-191236

[Patent Document 2] Japanese Published Patent Application No. 2004-111590

DISCLOSURE OF INVENTION

Reading of a CMOS sensor is performed by a sequential selection method. Because the time to read data from each pixel varies in the case of a sensor with global shutter, a charge holding period gets longer as the order of a pixel from which data is read is later.

When this charge holding period gets longer, charge flows out by leakage current and the like of a transistor forming a pixel, so that original data is lost. In particular, there were problems that the leakage of charge becomes significant and charge cannot be held for a long period of time when the off-state current of the transistor is high.

Therefore, in the techniques disclosed in the above-described patent documents, behavior of a photodiode is controlled by any method; however, the countermeasure against dark current of a photodiode has not been made. In addition, by addition of a mechanical shutter or of a new switching element, there was a problem in high cost and a complicated control.

Thus, one embodiment of the present invention disclosed in this specification provides a structure of a pixel circuit which solves at least one or more of the above-described problems, and a driving method of a pixel.

One embodiment of the present invention relates to a semiconductor device in which a photosensor with global shutter is included in each of pixels arranged in a matrix, charge is accumulated in the pixels, and the leakage of charge from an accumulated charge holding portion can be suppressed as much as possible in a period from the termination of an accumulation period to the reading of the last row.

One embodiment of the present invention disclosed in this specification is a semiconductor device including a plurality of pixels arranged in a matrix, and each of the plurality of pixels includes a photodiode, a signal charge accumulation portion, and a plurality of transistors. A channel formation region in at least one or more of the plurality of transistors includes an oxide semiconductor. After a reset operation of the signal charge accumulation portion is performed in all the pixels arranged in the matrix at substantially the same time, a charge accumulation operation by the photodiode is performed in all the pixels at substantially the same time, and a read operation of a signal from the pixels is performed per row.

The plurality of transistors is a charge accumulation control transistor of which one of a source and a drain is electrically connected to the photodiode; a reset transistor of which one of a source and a drain is electrically connected to the other of the source and the drain of the charge accumulation control transistor; an amplifying transistor of which a gate is electrically connected to the other of the source and the drain of the charge accumulation control transistor and the one of the source and the drain of the reset transistor; and a selection transistor of which one of a source and a drain is electrically connected to the one of the source and the drain of the amplifying transistor.

The plurality of transistors may be a charge accumulation control transistor of which one of a source and a drain is electrically connected to the photodiode; a reset transistor of which one of a source and a drain is electrically connected to the other of the source and the drain of the charge accumulation control transistor; and an amplifying transistor of which a gate is electrically connected to the other of the source and the drain of the charge accumulation control transistor and the one of the source and the drain of the reset transistor.

Gates of the reset transistors in all the pixels in the above-described two structures are electrically connected to each other, and the transistors can be operated at the same time with one input signal.

The plurality of transistors may be a charge accumulation control transistor of which one of a source and a drain is electrically connected to the photodiode; an amplifying transistor of which a gate is electrically connected to the other of the source and the drain of the charge accumulation control transistor; and a selection transistor of which one of a source and a drain is electrically connected to one of a source and a drain of the amplifying transistor.

Gates of the charge accumulation control transistors in all the pixels in the above-described three structures are electrically connected to each other, and the transistors can be operated at the same time with one input signal.

The plurality of transistors may be an amplifying transistor of which a gate is electrically connected to the photodiode; and a selection transistor of which one of a source and a drain is electrically connected to one of a source and a drain of the amplifying transistor.

Another embodiment of the present invention disclosed in this specification is a semiconductor device including a plurality of pixels arranged in a matrix, and each of the plurality of pixels includes a photodiode, a signal charge accumulation portion, a transistor, and a capacitor. A channel formation region in the transistor includes an oxide semiconductor. After a reset operation of the signal charge accumulation portion is performed in all the pixels arranged in the matrix at substantially the same time, a charge accumulation operation by the photodiode is performed in all the pixels at substantially the same time, and a read operation of a signal from the pixels is performed per row.

The transistor is an amplifying transistor of which a gate is electrically connected to the photodiode and one electrode of the capacitor.

Here, in the transistor whose channel formation region includes an oxide semiconductor, a highly-purified oxide semiconductor layer with a very few carriers is employed. Specifically, in the transistor including the oxide semiconductor layer, off-state current density per micrometer in a channel width at room temperature can be less than or equal to 10 aA ($1\times10^{-17}$ A/μm), further less than or equal to 1 aA ($1\times10^{-18}$ A/μm), or still further less than or equal to 10 zA ($1\times10^{-20}$ A/μm). In particular, it is preferable to use a transistor including an oxide semiconductor for the charge accumulation control transistor and/or the reset transistor in order to prevent leakage of charge from the signal charge accumulation portion.

Another embodiment of the present invention disclosed in this specification is a driving method of a semiconductor device including a plurality of pixels arranged in a matrix, each of the plurality of pixels including a photodiode, a charge accumulation control transistor of which one of a source and a drain is electricity connected to the photodiode, a reset transistor of which one of a source and a drain is electricity connected to the other of the source and the drain of the charge accumulation control transistor, an amplifying transistor of which a gate is electrically connected to the other of the source and the drain of the charge accumulation control transistor and the one of the source and the drain of the reset transistor, and a selection transistor of which one of a source and a drain is electricity connected to one of a source and a drain of the amplifying transistor. The driving method includes the steps of: turning on the charge accumulation control transistor in each of the pixels; turning on the reset transistor in each of the pixels, and setting a potential of a signal charge accumulation portion in each of the pixels to a reset potential; turning off the reset transistor in each of the pixels, and changing the potential of the signal charge accumulation portion in each of the pixels; turning off the charge accumulation control transistor in each of the pixels, and holding the potential of the signal charge accumulation portion in each of the pixels; and turning on the selection transistor per row sequentially, and outputting a signal corresponding to the potential of the signal charge accumulation portion in each of the pixels from the amplifying transistor in each of the pixels.

Another embodiment of the present invention disclosed in this specification is a driving method of a semiconductor device including a plurality of pixels arranged in a matrix, each of the plurality of pixels including a photodiode, a charge accumulation control transistor of which one of a source and a drain is electricity connected to the photodiode, a reset transistor of which one of a source and a drain is electricity connected to the other of the source and the drain of the charge accumulation control transistor, an amplifying transistor of which a gate is electrically connected to the other of the source and the drain of the charge accumulation control transistor and the one of the source and the drain of the reset transistor, and a selection transistor of which one of a source and a drain is electricity connected to one of a source and a drain of the amplifying transistor. The driving method includes the steps of: turning on the charge accumulation control transistor in each of the pixels; turning on the reset transistor in each of the pixels, and setting a potential of a signal charge accumulation portion in each of the pixels to a reset potential; turning off the charge accumulation control transistor in each of the pixels, and changing a potential of a cathode of the photodiode in each of the pixels; turning off the reset transistor in each of the pixels, and holding the potential of the signal charge accumulation portion in each of the pixels; turning on the charge accumulation control transistor in each of the pixels, and changing the potential of the signal charge accumulation portion in each of the pixels; turning off the charge accumulation control transistor in each of the pixels, and holding the potential of the signal charge accumulation portion; and turning on the selection transistor per row sequentially, and outputting a signal corresponding to the potential of the signal charge accumulation portion in each of the pixels from the amplifying transistor in each of the pixels.

According to one embodiment of the present invention, a CMOS image sensor in which the leakage of charge from the accumulated charge holding portion can be suppressed as much as possible in a period from the termination of the accumulation period to the reading of the last row and in which an image without a distortion can be taken can be provided.

BEST MODE FOR CARRYING OUT THE INVENTION

Figure 1:
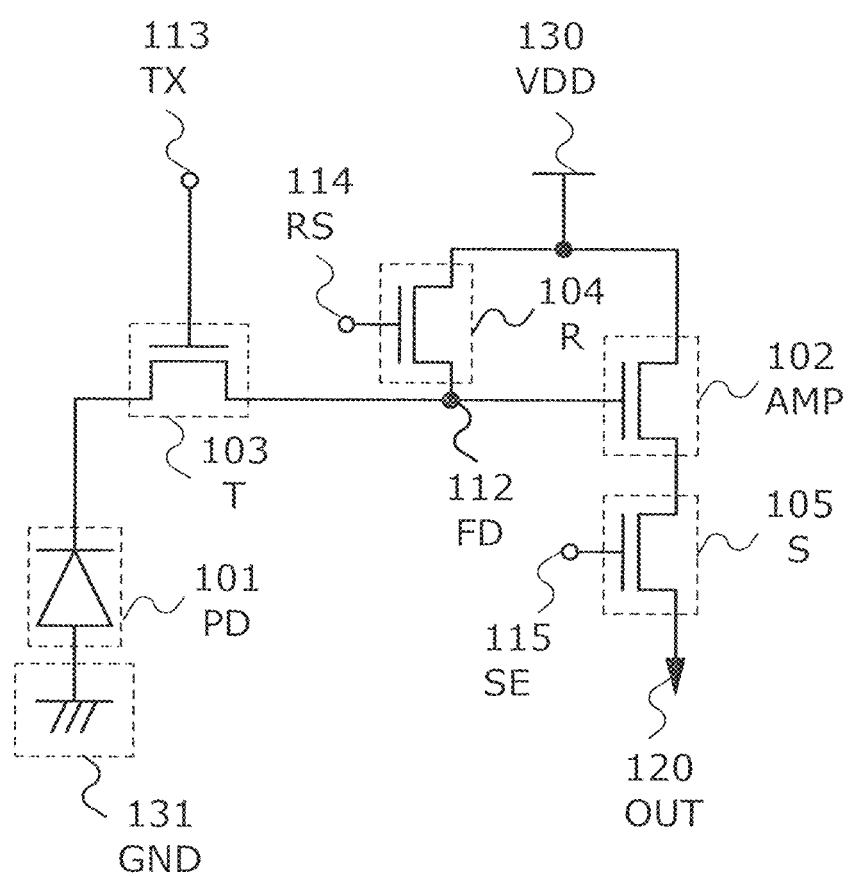
FIG. 1 is a diagram illustrating a circuit configuration of a pixel in an image sensor.

Hereinafter, embodiments and examples of the present invention will be described in detail with reference to the accompanying drawings. However, the present invention is not limited to the description below, and it is easily understood by those skilled in the art that modes and details disclosed herein can be modified in various ways without departing from the spirit and scope of the present invention. Therefore, the present invention is not construed as being limited to description of the embodiments and examples. In the drawings for describing the embodiments and examples, the same portions or portions having a similar function are denoted by the same reference numerals, and description of such portions is not repeated.

Note that this specification, a CMOS sensor is a name used to be distinguished from a CCD sensor and refers to all image sensors formed using a general process of a field effect transistor. Therefore, one embodiment of the present invention is not limited to the case where a CMOS circuit is used in a pixel portion or a peripheral circuit portion.

Embodiment 1

In this embodiment, a semiconductor device which is one embodiment of the present invention will be described with reference to drawings. FIG. 1 is an example of a circuit configuration of a pixel in an image sensor.

The pixel in the image sensor includes a photodiode 101 (PD), an amplifying transistor 102 (AMP), a charge accumulation control transistor 103 (T), a reset transistor 104 (R), and a selection transistor 105 (S).

Next, functions and arrangement of elements and wirings are described.

The photodiode 101 generates current in accordance with the amount of light incident on the pixel. The amplifying transistor 102 outputs a signal which corresponds to a potential of a signal charge accumulation portion 112 (FD). The charge accumulation control transistor 103 controls charge accumulation in the signal charge accumulation portion 112 performed by the photodiode 101. The reset transistor 104 controls the initialization of the potential of the signal charge accumulation portion 112. The selection transistor 105 controls the selection of the pixel in reading. The signal charge accumulation portion 112 is a charge holding node and holds charge which varies depending on the amount of light received by the photodiode 101.

A charge accumulation control signal line 113 (TX) is a signal line which controls the charge accumulation control transistor 103. A reset signal line 114 (RS) is a signal line which controls the reset transistor 104. A selection signal line 115 (SE) is a signal line which controls the selection transistor 105. An output signal line 120 (OUT) is a signal line serving as an output destination of a signal generated by the amplifying transistor 102. A power supply line 130

(VDD) is a signal line which supplies power supply voltage. A ground potential line 131 (GND) is a signal line which sets a reference potential.

Note that transistors and wirings are named for convenience. Any of names is acceptable as long as the transistors have the functions described above and the wirings have the functions as described above.

A gate of the charge accumulation control transistor 103 is connected to the charge accumulation control signal line 113, one of a source and a drain of the charge accumulation control transistors 103 is connected to a cathode of the photodiode 101, and the other of the source and the drain of the charge accumulation control transistors 103 is connected to the signal charge accumulation portion 112. In addition, an anode of the photodiode 101 is connected to the ground potential line 131. Here, a charge holding capacitor may be connected between the signal charge accumulation portion 112 and the ground potential line 131.

Note that although a substantial signal charge accumulation portion is the capacitance of a depletion layer in the vicinity of a source region or drain region of a transistor, the gate capacitance of an amplifying transistor, or the like, the signal charge accumulation portion is conveniently described as part of a circuit diagram in this specification. Therefore, description of arrangement should follow the circuit diagram.

A gate of the amplifying transistor 102 is connected to the signal charge accumulation portion 112, one of a source and a drain of the amplifying transistor 102 is connected to the power supply line 130, and the other of the source and the drain of the amplifying transistor 102 is connected to one of a source and a drain of the selection transistor 105.

A gate of the reset transistor 104 is connected to the reset signal line 114, one of a source and a drain of the reset transistor 104 is connected to the power supply line 130, and the other of the source and the drain of the reset transistor 104 is connected to the signal charge accumulation portion 112.

A gate of the selection transistor 105 is connected to the selection signal line 115, and the other of the source and the drain of the selection transistor 105 is connected to the output signal line 120.

Next, a structure of each element illustrated in FIG. 1 is described.

The photodiode 101 can be formed using a silicon semiconductor with a pn junction or a pin junction. Here, a pin photodiode in which an i-type semiconductor layer is formed using amorphous silicon is used. If amorphous silicon is used, the amorphous silicon has optical absorption properties in a visible light wavelength region; therefore, a visible light sensor in which an infrared ray cut filter does not have to be provided can be formed at low cost. In contrast, because crystalline silicon also has optical absorption properties in an infrared wavelength region, when an i-type semiconductor layer of a pin photodiode is formed using crystalline silicon and the pin photodiode is combined with an infrared ray transmission filter, only infrared rays can be detected.

Although the charge accumulation control transistor 103, the reset transistor 104, the amplifying transistor 102, and the selection transistor 105 can also be formed using silicon semiconductor, these are preferably formed using an oxide semiconductor. A transistor including an oxide semiconductor has very low off-state current.

In particular, if the charge accumulation control transistor 103 and the reset transistor 104 which are connected to the signal charge accumulation portion 112 have large leakage current, the time when charge can be held in the signal charge accumulation portion 112 is not sufficient; therefore, at least the transistors are preferably formed using an oxide semiconductor. When a transistor including an oxide semiconductor is used for the transistors, unwanted leakage of charge through the photodiode can be prevented.

For the oxide semiconductor, a thin film represented by the chemical formula, $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. Because a transistor is formed using an oxide semiconductor, the off-state current can be drastically reduced.

Next, the operation of the pixel circuit of FIG. 1 is described with reference to timing charts illustrated in FIGS. 2A and 2B.

Figure 2A:
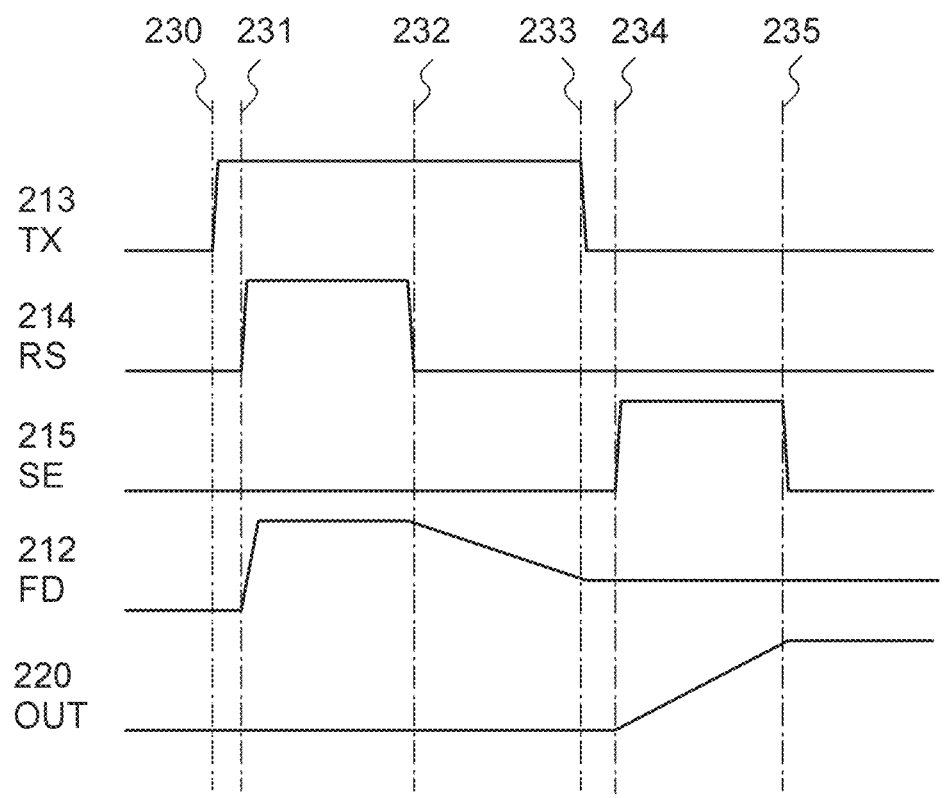
FIGS. 2A and 2B are timing charts each illustrating the operation of a pixel circuit in an image sensor.
Figure 2B:
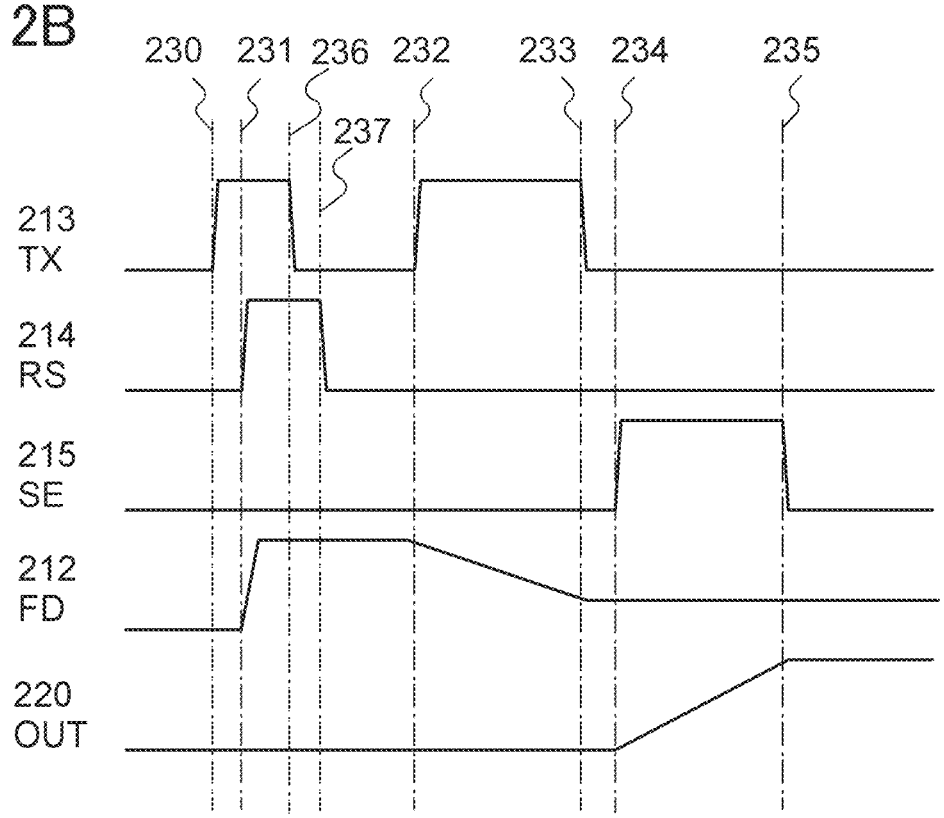

For simple description in FIGS. 2A and 2B, a potential 213 of the charge accumulation control signal line 113, a potential 214 of the reset signal line 114, and a potential 215 of the selection signal line 115 are provided as signals which vary between two levels. Note that because each potential is an analog signal, the potential can, in practice, have various levels in accordance with situations without limitation on two levels.

First, an operation mode according to FIG. 2A is described.

When the potential 213 of the charge accumulation control signal line 113 is set to a high level at time 230, and then the potential 214 of the reset signal line 114 is set to a high level at time 231, a potential 212 of the signal charge accumulation portion 112 is initialized to a potential of the power supply line 130 to be a reset potential. The above is a start of a reset operation.

The potential 214 of the reset signal line 114 is set to a low level at time 232, and the reset operation is terminated. At this time, the potential 212 of the signal charge accumulation portion 112 is held, and a reverse bias voltage is applied to the photodiode 101. This stage becomes a start of an accumulation operation. Then, reverse current corresponding to the amount of light flows to the photodiode 101, and the potential 212 of the signal charge accumulation portion 112 varies.

When the potential 213 of the charge accumulation control signal line 113 is set to a low level at time 233, a transfer of charge from the signal charge accumulation portion 112 to the photodiode 101 stops, and the potential 212 of the signal charge accumulation portion 112 is determined. At this stage, the accumulation operation is terminated.

When the potential 215 of the selection signal line 115 is set to a high level at time 234, charge is supplied from the power supply line 130 to the output signal line 120 in accordance with the potential 212 of the signal charge accumulation portion 112, and a read operation starts.

When the potential 215 of the selection signal line 115 is set to a low level at time 235, charge supplied from the power supply line 130 to the output signal line 120 is stopped, and a potential 220 of the output signal line is determined. At this stage, the read operation is terminated. After that, an operation returns to the operation at the time 230, and the same operations are repeated, whereby an image can be taken.

Next, an operation mode according to FIG. 2B is described.

When the potential 213 of the charge accumulation control signal line 113 is set to a high level at the time 230 and the potential 214 of the reset signal line 114 is set to a high level at the time 231, the potential 212 of the signal charge accumulation portion 112 and a potential of the cathode of the photodiode 101 are initialized to the potential of the power supply line 130 to be the reset potential. The above is a start of the reset operation.

When the potential 213 of the charge accumulation control signal line 113 is set to a low level at time 236 and then the potential 214 of the reset signal line 114 is set to a low level at time 237, the reset operation is terminated; accordingly, reverse current corresponding to the amount of light flows to the photodiode to which the reverse bias voltage is applied, whereby the potential of the cathode of the photodiode 101 varies.

When the potential 213 of the charge accumulation control signal line 113 is set to a high level again at the time 232, current flows by a difference in potential between the signal charge accumulation portion 112 and the cathode of the photodiode 101, and the potential 212 of the signal charge accumulation portion 112 varies.

The steps after that are the same as those of the operation mode according to FIG. 2A.

As a system of the accumulation operation and the read operation in all the pixels, the following two systems are known: a rolling shutter system, and a global shutter system. Differences of these systems are briefly described using a potential of the charge accumulation control signal line and a potential of the selection signal line.

Figure 3:
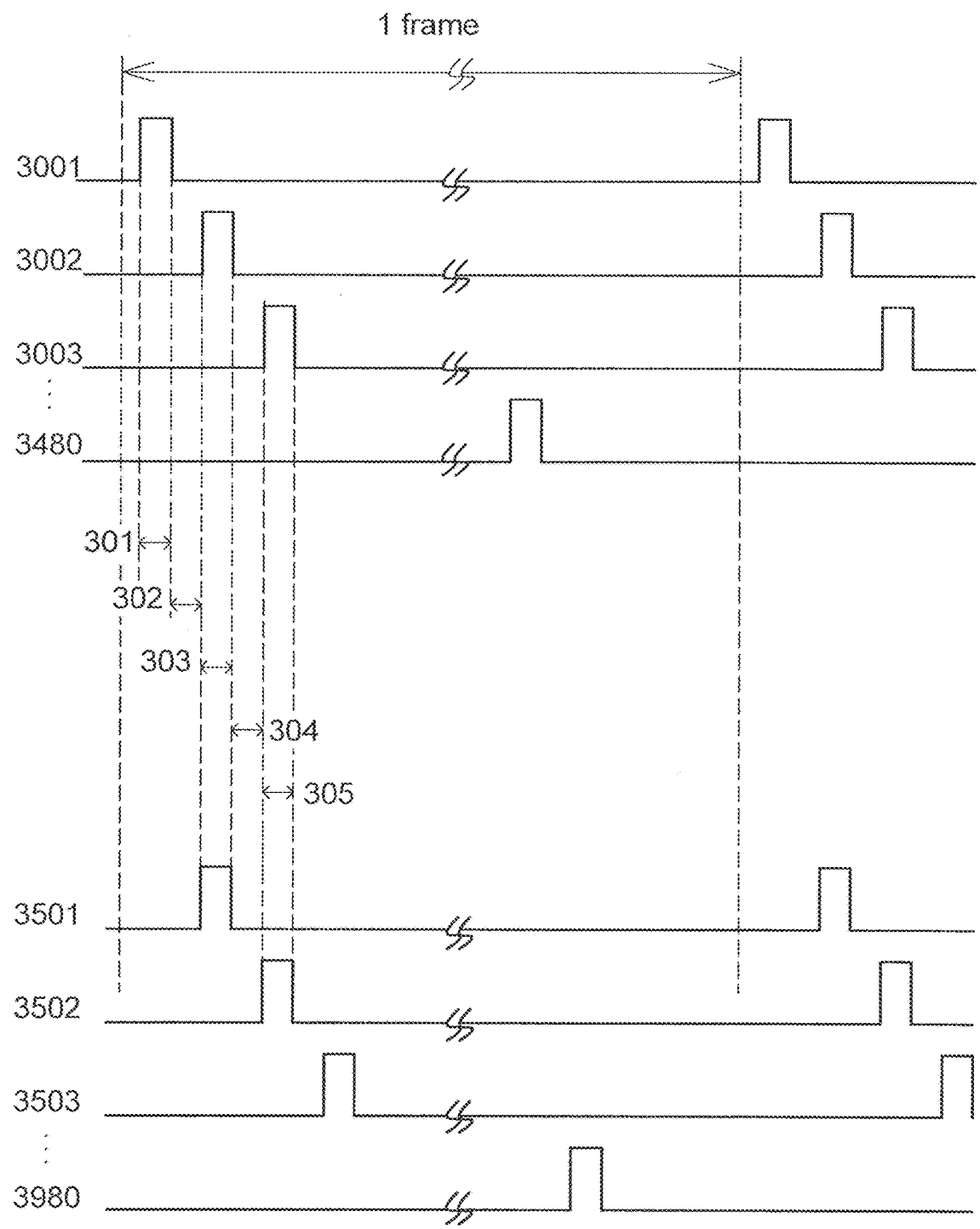
FIG. 3 is a timing chart illustrating the operation of a pixel circuit in an image sensor.

FIG. 3 is a timing chart of the case where the rolling shutter system is used. First, a potential 3001 of the first charge accumulation control signal line is set to a high level, and charge corresponding to the amount of light is accumulated in the signal charge accumulation portion in the pixel of the first row in an accumulation period 301. Next, the potential 3001 of the first charge accumulation control signal line is set to a low level, and a potential 3501 of the first the selection signal line is set to a high level after a charge holding period 302. After voltage corresponding to an accumulation potential is read in a period 303, the potential 3501 of the first the selection signal line is set to a low level.

In the period 303, a potential 3002 of the second charge accumulation control signal line is set to a high level, and charge corresponding to the amount of light is accumulated in the signal charge accumulation portion in the pixel of the second row. Next, the potential 3002 of the second charge accumulation control signal line is set to a low level, and a potential 3502 of the second the selection signal line is set to a high level after a charge holding period 304. After voltage corresponding to the accumulation potential is read in a period 305, the potential 3502 of the second the selection signal line is set to a low level.

Similarly, when the last row is, for example, the 480th row, potentials from a potential 3003 of the third charge accumulation control signal line to a potential 3480 of the 480th charge accumulation control signal line and potentials from a potential 3503 of the third selection signal line to a potential 3980 of the 480th selection signal line are controlled sequentially, whereby the read operation in all the pixels is performed. In this way, reading of one frame is completed.

In the rolling shutter system, charge accumulation to the signal charge accumulation portion in the pixel is performed per row; therefore, the timing of charge accumulation is different from each row. In other words, the rolling shutter system is a system in which the charge accumulation operation is not performed in all the pixels at the same time and a time difference of the accumulation operation occurs per row. Note that the charge holding period from the accumulation operation to the read operation is the same in all the rows.

Figure 4:
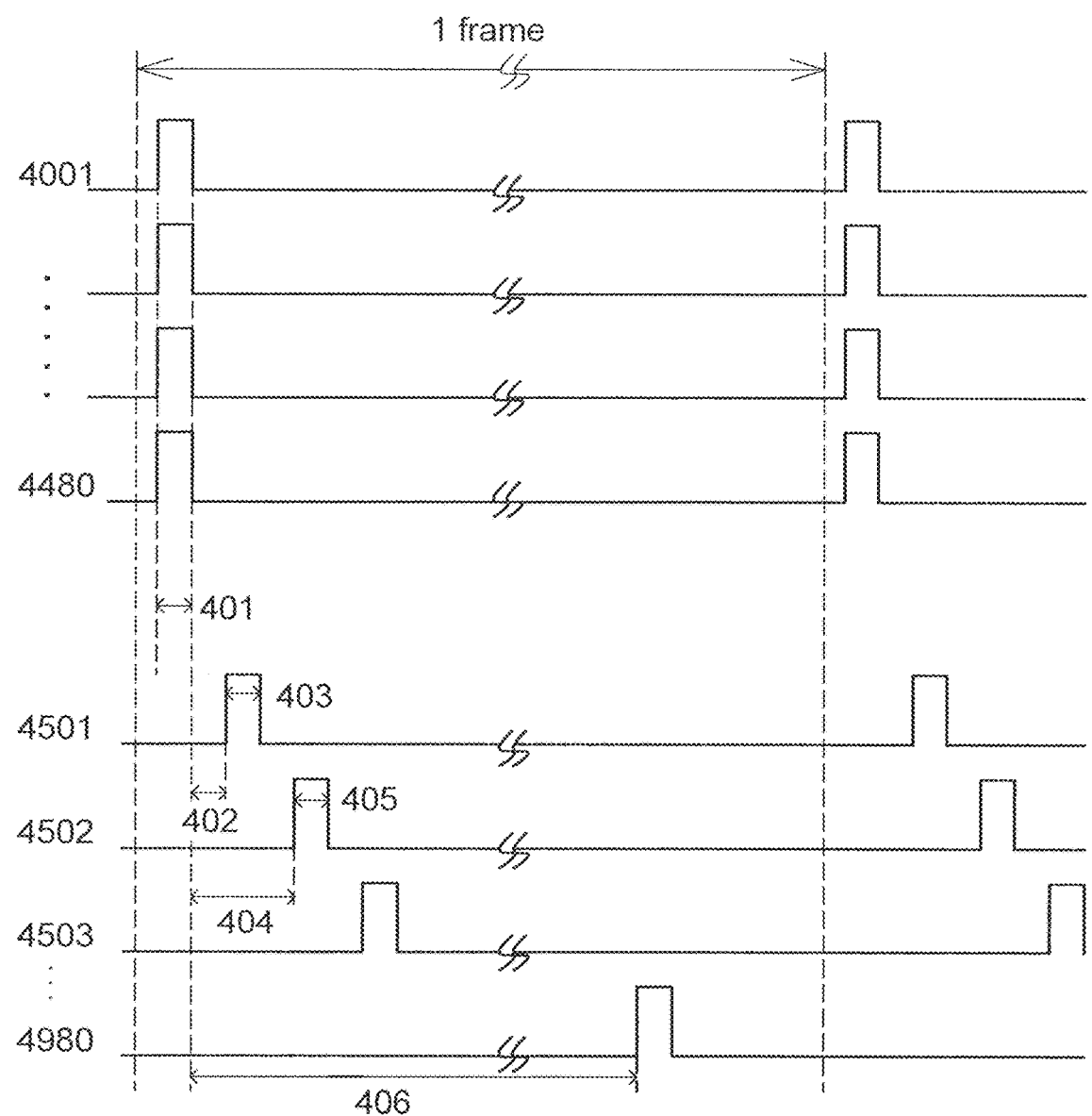
FIG. 4 is a timing chart illustrating the operation of a pixel circuit in an image sensor.

Next, the global shutter system is described using a timing chart of FIG. 4. Similarly to the above-described example, when the last row is the 480th row, potentials from a potential 4001 of the first charge accumulation control signal line of the first row to a potential of the 480th charge accumulation control signal line of the 480th row are set to high levels at the same time, whereby the charge accumulation operation is performed in all the pixels in a period 401 at the same time. In a period 403 after a charge holding period 402, a potential 4501 of the first the selection signal line is set to a high level, and the pixel of the first row is selected, whereby voltage corresponding to the accumulation potential is output.

Next, the potential 4501 of the selection signal line is set to a low level. In a period 405 after a charge holding period 404, a potential 4502 of the second the selection signal line is set to a high level, and the pixel of the second row is selected, whereby voltage corresponding to the accumulation potential is output.

After that, reading of each row is performed sequentially. In the last row, a potential 4980 of the 480th selection signal line is set to a high level after a charge holding period 406, and the pixel of the 480th row is selected, whereby voltage corresponding to the accumulation potential is output. In this way, reading of one frame is completed.

In the global shutter system, the timing of the charge accumulation to the signal charge accumulation portion is the same in all the pixels. Note that the period of time from the charge accumulation operation to the read operation is different from each row, and the charge holding period 406 up to the reading of the last row is the longest.

As described above, the global shutter system is advantageous in that an image can be taken without a distortion with respect to an object with movement because there is no time difference of the charge accumulation in all the pixels. However, a charge holding period is increased using the global shutter system; therefore, there is a problem that an image taken by a sensor with global shutter is easily affected by leakage due to the off-state current or the like of the charge accumulation control transistor or the reset transistor, as compared to an image taken by a sensor with rolling shutter.

Figure 5A:
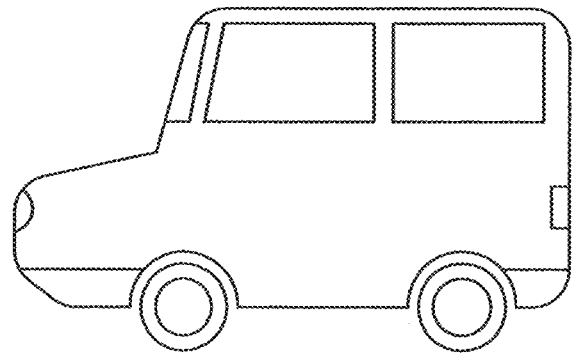
FIGS. 5A to 5C are diagrams illustrating examples of images taken by sensors with rolling shutter and global shutter.

Next, examples of images taken by sensors with rolling shutter and global shutter are described with reference to FIGS. 5A to 5C. Here, as an example of the case where an object moves fast, the case where an image of a moving car as illustrated in FIG. 5A is taken is considered.

Figure 5B:
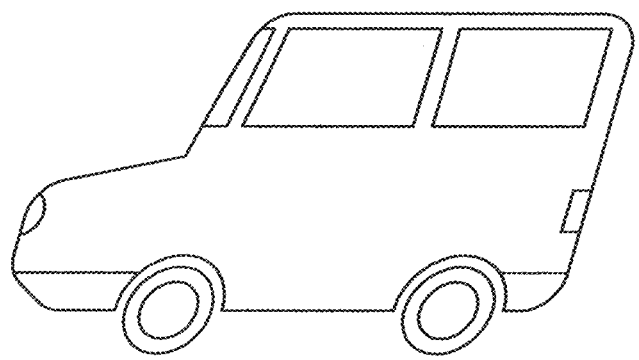
Figure 5C:
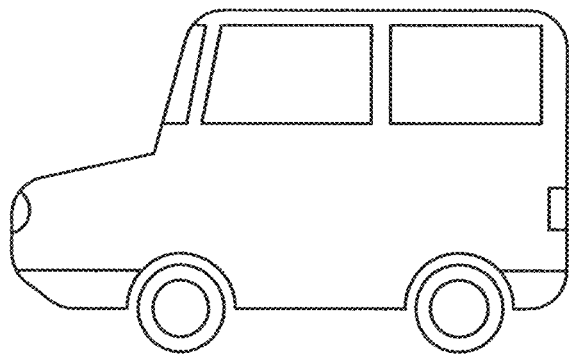

In the case where the rolling shutter system is used, the timing of the charge accumulation of the pixel is different from each row; therefore, imaging of the upper part of an image and imaging of the lower part of the image cannot be performed at the same time, and the image is generated as a distorted object as illustrated in FIG. 5B. In the rolling shutter system, a distortion of a taken image increases in particular when an object which moves fast is perceived; therefore, it is difficult to take an image of the actual shape of the object.

In contrast, in the case where the global shutter system is used, the timing of the charge accumulation of the pixel is the same in all the pixels. Therefore, because the whole frame can be taken instantaneously, an image without a distortion as illustrated in FIG. 5C can be taken. The global shutter system is an excellent system for taking an image of an object which moves fast.

As described above, it is found that not the rolling shutter system but the global shutter system is suitable for taking an image of an object which moves fast. Note that the conventional transistor used for a CMOS image sensor has large off-state current; therefore, a normal image cannot be taken by the CMOS image sensor with just global shutter.

Thus, in one embodiment of the present invention, a transistor including an oxide semiconductor, of which off-state current is extremely low, is used for a CMOS image sensor with global shutter, whereby a normal image can be taken.

Next, scientific calculation results on an image are described. An object used for the scientific calculation is an image with three blades, which is to serve as a rotor illustrated in FIG. 6. These three blades can rotate using a connection point of the blades as a central axis. This scientific calculation aims at taking an image for one frame when an image of three rotating blades is taken.

The software used for the scientific calculation is image processing software written in C language, which is used for calculating the timing of a charge accumulation operation and of a read operation in each pixel of an image sensor and the amount of leakage from a signal charge accumulation portion per row to create a picture.

FIGS. 7A to 7D illustrate the scientific calculation results. Note that the scientific calculation was performed under the following four conditions.

Figure 8:
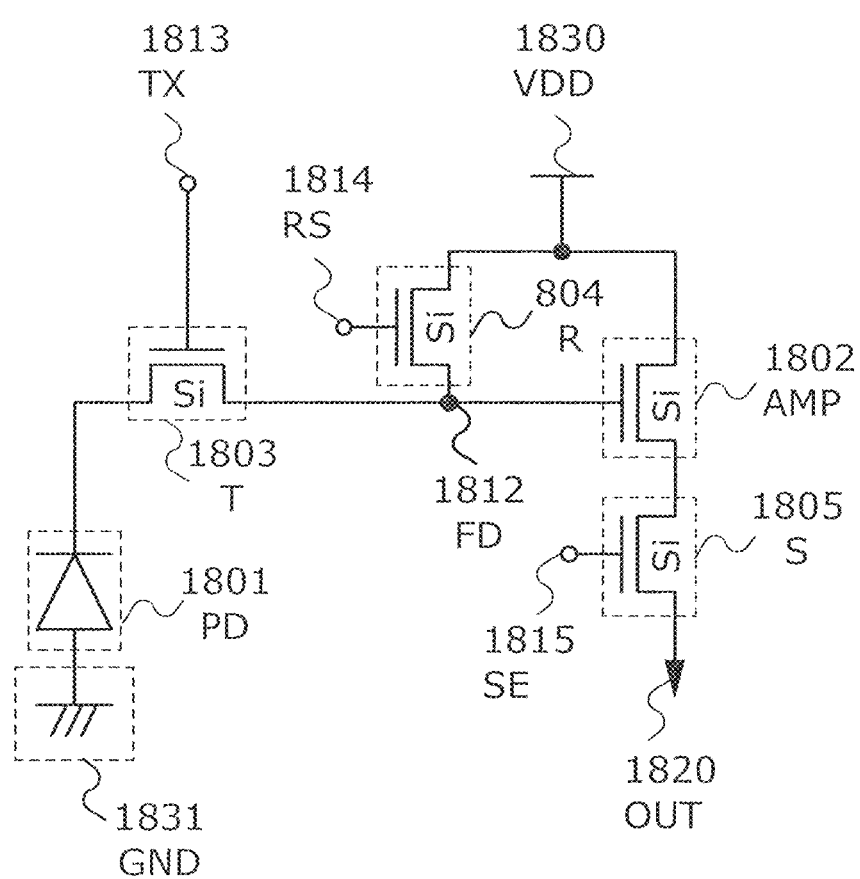
FIG. 8 is a diagram illustrating a circuit configuration of a pixel in an image sensor.

The first condition is to drive the VGA-size image sensor with rolling shutter, which has a pixel circuit illustrated in FIG. 8. Although the pixel circuit configuration of FIG. 8 is basically the same as that of the pixel circuit of FIG. 1, a charge accumulation control transistor 1803, a reset transistor 1804, an amplifying transistor 1802, and a selection transistor 1805 are transistors including a silicon semiconductor. Note that the operation of the pixel circuit including the following conditions is similar to that described with reference to FIG. 1 and FIGS. 2A and 2B.

The second condition is to drive the VGA-size image sensor with global shutter, which has the pixel circuit of FIG. 8. The structure of the circuit is the same as that of the first condition except for a shutter system.

Figure 9:
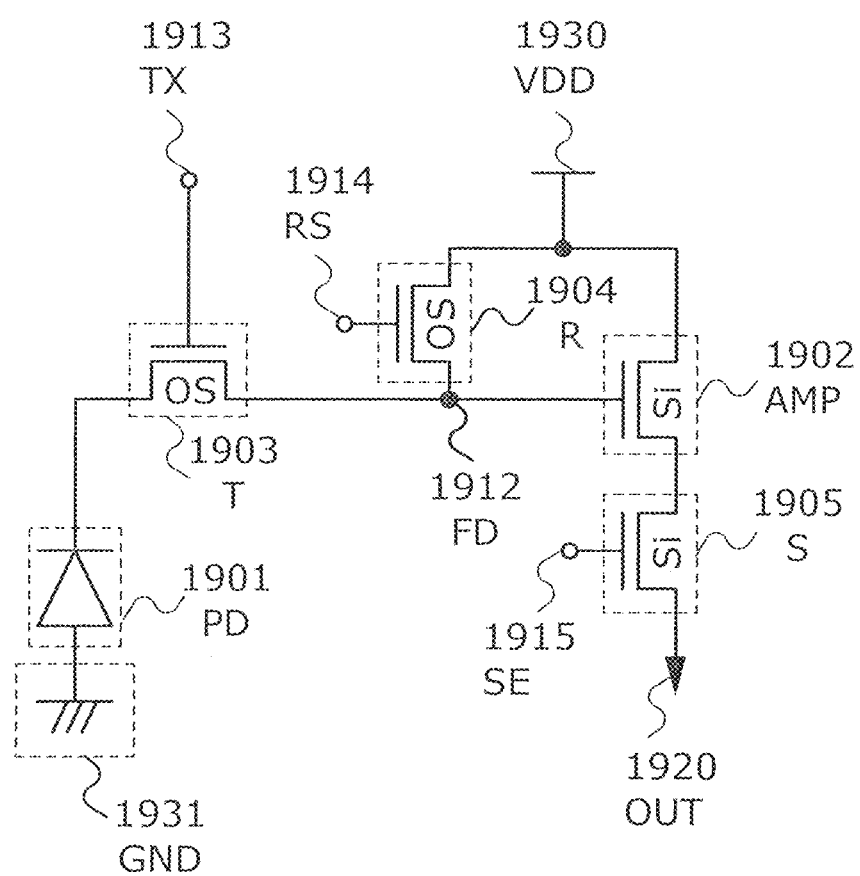
FIG. 9 is a diagram illustrating a circuit configuration of a pixel in an image sensor.

The third condition is to drive the VGA-size image sensor with rolling shutter, which has a pixel circuit of FIG. 9. Although a pixel circuit configuration of FIG. 9 is basically the same as that of the pixel circuit of FIG. 1, a charge accumulation control transistor 1903 and a reset transistor 1904 are transistors including an oxide semiconductor, whereas an amplifying transistor 1902 and a selection transistor 1905 are transistors including a silicon semiconductor.

The fourth condition is to drive the VGA-size image sensor with global shutter, which has the pixel circuit of FIG. 9. The structure of a circuit is the same as that of the third condition except for a shutter system.

Note that each transistor including a silicon semiconductor in the pixel circuits of FIG. 8 and FIG. 9 had a channel length L of 3 [μm], a channel width W of 5 [μm], and a thickness d of a gate insulating film of 20 [nm]. In addition, each transistor including an oxide semiconductor had a channel length L of 3 [μm], a channel width W of 5 [μm], and a thickness d of a gate insulating film of 200 [nm].

Further, an imaging frequency was set to 60 [Hz], and the electrical characteristics of the transistor including a silicon semiconductor satisfied Icut=10 [pA], and the electrical characteristics of the transistor including an oxide semiconductor satisfied Icut=0.1 [aA]. The term Icut in this embodiment means the amount of current flowing between a source and a drain when gate voltage is set to 0 V and drain voltage is set to 5 V.

Figure 6:
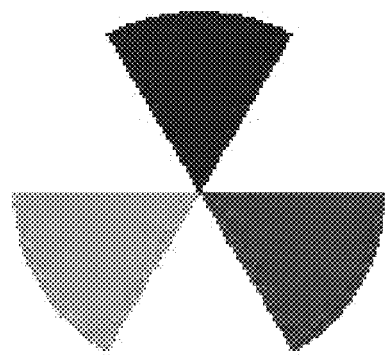
FIG. 6 is a diagram for illustrating scientific calculation.

The condition of rotational movement of the three blades shown in FIG. 6 was set to 640 [rpm] in a clockwise direction. Note that when the number of rotations is 640 [rpm], the three blades rotate by approximately 60 degrees during one frame (1/60 [s]) at the time of the accumulation operation of the rolling shutter.

Figure 7A:
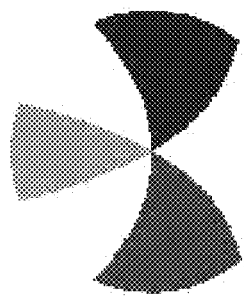
FIGS. 7A to 7D are diagrams illustrating results of scientific calculation.

In the case of the first condition (the transistors were only silicon semiconductor transistors and the rolling shutter system was used), the timing to accumulate charge in the signal charge accumulation portion of the pixel is different from each row; therefore, a distortion occurs in an image as illustrated in FIG. 7A.

Figure 7B:
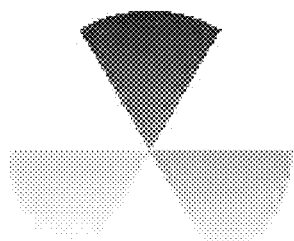

In the case of the second condition (the transistors were only silicon semiconductor transistors and the global shutter system was used), a change of gray scale is seen as illustrated in FIG. 7B, which is caused by charge leakage due to the off-state current of the charge accumulation control transistor 1803 and the reset transistor 1804. The charge holding period gets longer as a read operation is closer to the read operation of the last row on the lower side in the image sensor with global shutter; therefore, the change becomes remarkable.

Figure 7C:
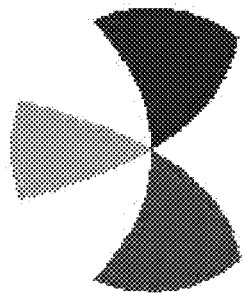

In the case of the third condition (the charge accumulation control transistor and the reset transistor were oxide semiconductor transistors, and the rolling shutter system was used), an image is distorted as illustrated in FIG. 7C, which is similar to the case of the first condition.

Figure 7D:
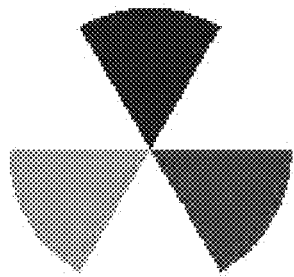

In the case of the fourth condition (the charge accumulation control transistor and the reset transistor were oxide semiconductor transistors, and the global shutter system was driven), there is little charge leakage due to the off-state current of the transistor and the gray scale is properly displayed as illustrated in FIG. 7D as in FIG. 6.

It is found from the results illustrated in FIGS. 7A to 7D that the rolling shutter causes an image distortion in either pixel circuit of FIG. 8 or FIG. 9 and there is no strong correlation between the image distortion and the off-state current. In other words, in order to decrease the image distortion, it is effective to drive an image sensor with global shutter by which the timing to accumulate charge in the signal charge accumulation portion of the pixel is the same in all the pixels.

In contrast, when a circuit is formed using a conventional transistor including a silicon semiconductor, it is found that the global shutter system has a problem that a gray scale varies due to charge leakage due to the off-state current of the charge accumulation control transistor and the reset transistor.

In one embodiment of the present invention, a transistor including an oxide semiconductor showing characteristics of extremely low off-state current is used for each of the charge accumulation control transistor and the reset transistor in order to solve this problem. Therefore, the global shutter system can be adopted for a CMOS image sensor, and even an image of an object with movement can be taken without a distortion.

Next, an example of a peripheral circuit in the case where an image sensor with global shutter is used in this embodiment is described.

In an image sensor with rolling shutter, in order to accumulate and read a signal potential per row, a high-performance sequential circuit such as a shift register was used for each of a gate driver circuit for a charge accumulation control signal line and a driver circuit for a reset signal line, for example.

In one embodiment of the present invention, the charge accumulation control transistors in all the pixels operate at the same time because the global shutter system is used. Therefore, a sequential circuit is not needed for the operation of the transistors. In addition, the same can be applied to the reset transistors.

That is, the number of driver circuits for a charge accumulation control signal line and driver circuits for a reset signal line which are formed with sequential circuits such as shift registers can be reduced. A structure may be used in which gates of the charge accumulation control transistors in all the pixels are electrically connected to each other, gates of the reset transistors in all the pixels are electrically connected to each other, and the charge accumulation control transistors in all the pixels or the reset transistors in all the pixels are operated at the same time with one signal.

With this structure, power consumption of the semiconductor device can be reduced, and further, an area required for the driver circuits can be greatly reduced. In addition, the area of the wiring can be reduced; therefore, flexibility in layout of the charge accumulation control signal line and the reset signal line can be improved.

Next, a driving method of a semiconductor device with the above-mentioned structure is described with reference to FIGS. 10A and 10B. Note that a VGA-size semiconductor device in which the number of rows in a pixel matrix is 480 is used as an example here.

Figure 10A:
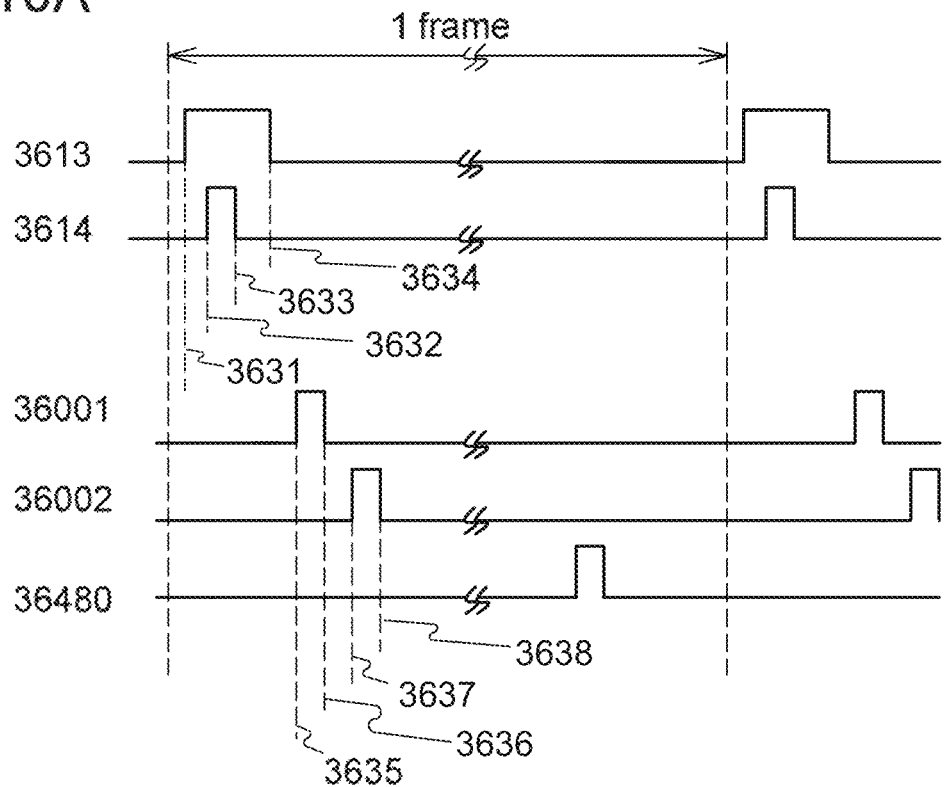
FIGS. 10A and 10B are timing charts each illustrating the operation of a pixel circuit in an image sensor.
Figure 10B:
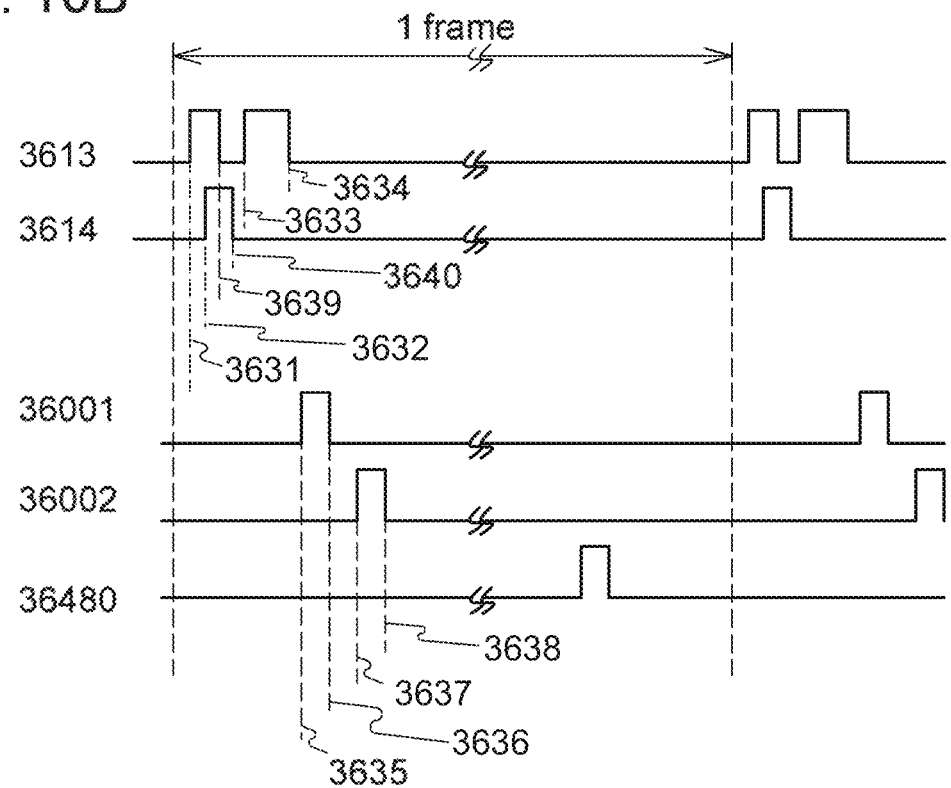

For simple description in FIGS. 10A and 10B, a potential 3613 of the charge accumulation control signal line 113, a potential 3614 of the reset signal line 114, and potentials of a potential 36001 of the first selection signal line 115 to a potential 36480 of the 480th selection signal line are provided as signals which vary between two levels. Note that because each potential is an analog signal, the potential can, in practice, have various levels in accordance with situations without limitation on two levels.

First, an operation mode according to FIG. 10A is described.

The potential 3613 of the charge accumulation control signal line 113 is set to a high level at time 3631. Next, when the potential 3614 of the reset signal line 114 is set to a high level at time 3632, the reset operation of the pixels from the first row to the 480th row is completed.

When the potential 3614 of the reset signal line 114 is set to a low level at time 3633, the charge accumulation operation in the signal charge accumulation portion 112 starts in all the pixels from the first row to the 480th row.

When the potential 3613 of the charge accumulation control signal line 113 is set to a low level at time 3634, the accumulation operation is terminated in all the pixels from the first row to the 480th row.

When the potential 36001 of the first the selection signal line 115 is set to a high level at time 3635, the read operation of charge accumulated in the signal charge accumulation portion 112 in the pixel of the first row starts.

When the potential 36001 of the first the selection signal line is set to a low level at time 3636, the read operation with respect to the pixel of the first row is completed.

When the potential 36002 of the second the selection signal line 115 is set to a high level at time 3637, the read operation of charge accumulated in the signal charge accumulation portion 112 in the pixel of the second row starts.

When the potential 36002 of the second the selection signal line 115 is set to a low level at time 3638, the read operation of the pixel of the second row is completed.

Similarly, signals are sequentially transmitted up to the potential 36480 of the 480th selection signal line 115, and the read operation with respect to all the pixels is performed, whereby a first frame image is obtained. After that, the operation returns to the operation at the time 3631, and the same operations are repeated, whereby a second frame image and subsequent frame images can be obtained.

Next, an operation mode according to FIG. 10B is described.

The potential 3613 of the charge accumulation control signal line 113 is set to a high level at the time 3631. Next, when the potential 3614 of the reset signal line 114 is set to a high level at the time 3632, the pixels from the first row to the 480th row are reset.

When the potential 3613 of the charge accumulation control signal line 113 is set to a low level at time 3639 and then the potential 3614 of the reset signal line 114 is set to a low level at time 3640; accordingly, the reset operation is terminated, whereby the charge accumulation operation by the photodiode 101 starts.

When the potential 3613 of the charge accumulation control signal line 113 is set to a high level again at the time 3633, the charge accumulation operation in the signal charge accumulation portion 112 starts in all the pixels from the first row to the 480th row.

The following operation is the same as the operation mode in FIG. 10A.

In this manner, the pixel in the image sensor can be driven without using a high-performance sequential circuit such as a shift register, reduction in power consumption and the area of the driver circuit, and improvement in flexibility in layout of the circuit and the wiring can be achieved.

As described above, when the transistor including an oxide semiconductor is used for the transistor used for forming the pixel in the image sensor, the image sensor with global shutter can be easily realized, which can provide a semiconductor device capable of taking an image without a distortion with respect to an object.

Note that the structure and operation of the image sensor in this embodiment may be applied not only to an imaging device aimed only at taking an image but also to a touch panel and the like in which a display element of a display device is provided with an imaging element, for example.

This embodiment can be implemented in combination with any of the other embodiments or the examples, as appropriate.

Embodiment 2

In this embodiment, a layout of a pixel circuit of a semiconductor device in one embodiment of the present invention will be described.

Figure 11:
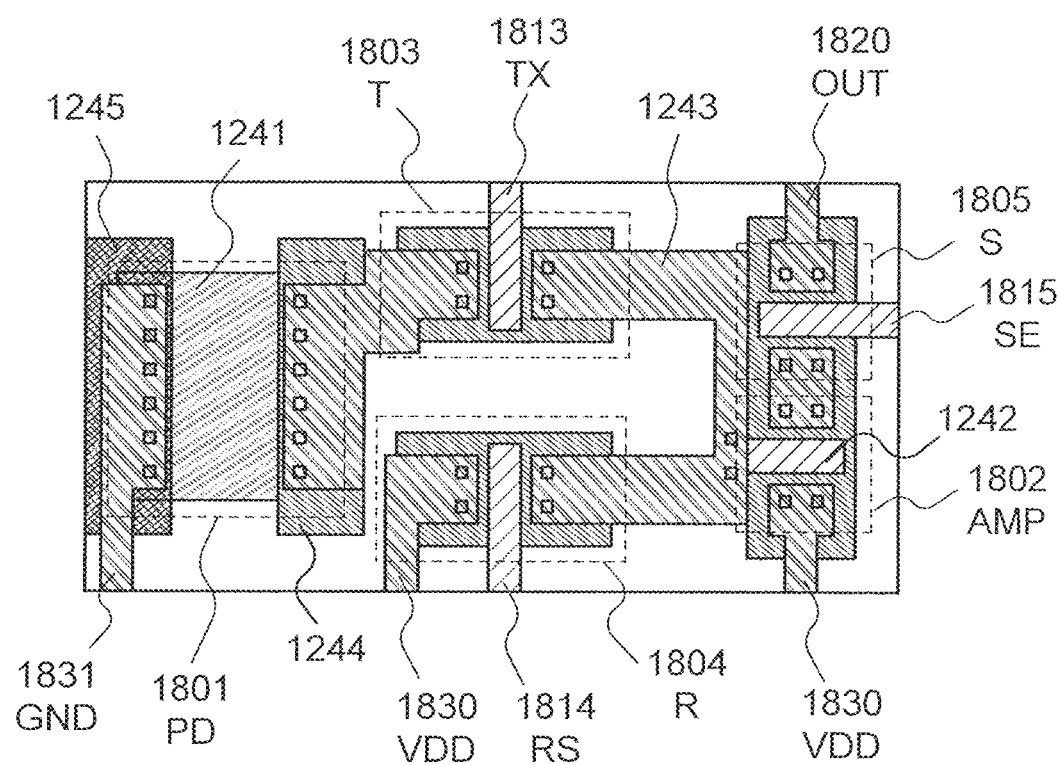
FIG. 11 is a top view illustrating a layout of a pixel circuit in an image sensor.

As an example of the case where the pixel circuit of FIG. 8 is actually formed, the top view of the layout of a pixel circuit is illustrated in FIG. 11. Note that all the transistors used for the pixel circuit of FIG. 8 are formed using a silicon semiconductor.

The pixel circuit illustrated in FIG. 11 is formed with a pin photodiode 1801, an amplifying transistor 1802, a charge accumulation control transistor 1803, a reset transistor 1804, a selection transistor 1805, a charge accumulation control signal line 1813, a reset signal line 1814, a selection signal line 1815, an output signal line 1820, a power supply line 1830, and a ground potential line 1831. Layers illustrated in the view are an i-type silicon semiconductor layer 1241, a gate wiring layer 1242, a wiring layer 1243, an n-type silicon semiconductor layer 1244, and a p-type silicon semiconductor layer 1245.

Figure 12:
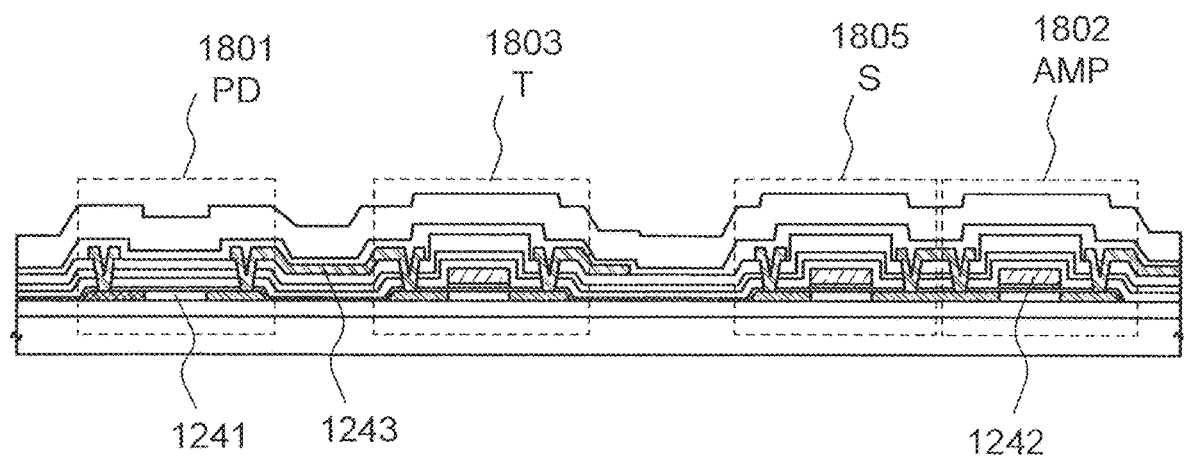
FIG. 12 is a cross-sectional view illustrating a layout of a pixel circuit in an image sensor.

Of these, the i-type silicon semiconductor layer 1241, the n-type silicon semiconductor layer 1244, and the p-type silicon semiconductor layer 1245 are semiconductor layers forming the pin photodiode 1801. As illustrated in a cross-sectional view of FIG. 12, a lateral junction photodiode is formed here. This lateral junction photodiode is an example, and a stacked photodiode or a bulk buried photodiode can be employed. Note that in the cross-sectional view of FIG. 12, a transistor including a silicon semiconductor is of SOI type; however, there is no limitation thereto, and a bulk transistor may be used.

The gate wiring layer 1242 is connected to a gate electrode of the amplifying transistor 1802 and is connected to one of a source and a drain of the charge accumulation control transistor 1803 and one of a source and a drain of the reset transistor 1804 with the wiring layer 1243. In addition, parts of these regions correspond to the signal charge accumulation portion.

Figure 13:
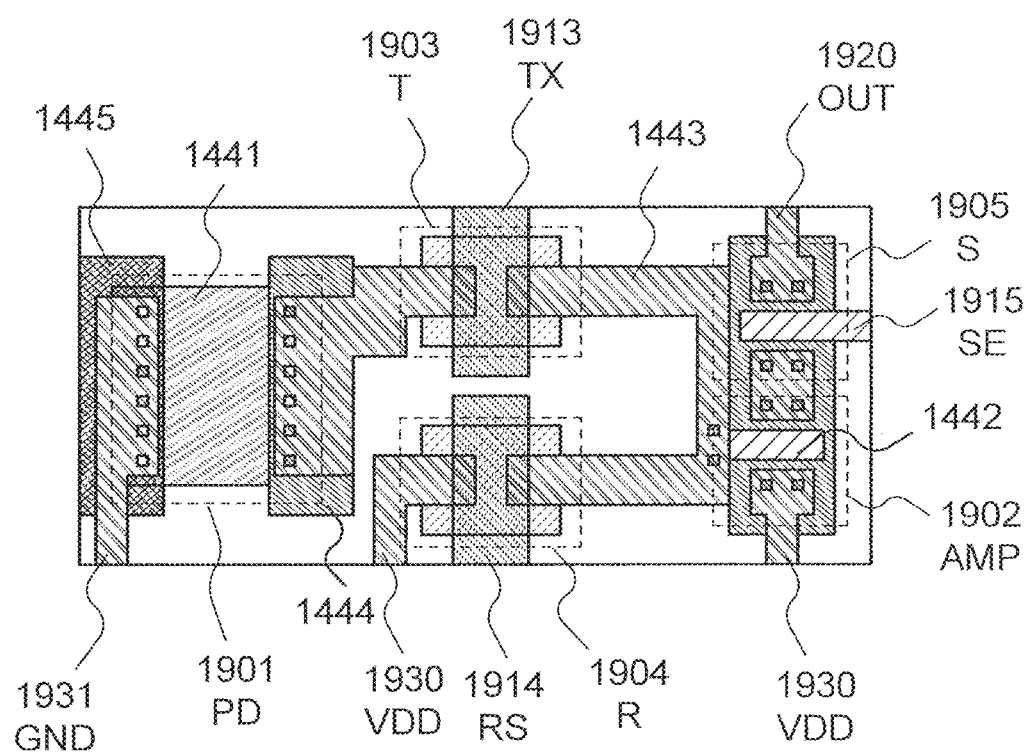
FIG. 13 is a top view illustrating a layout of a pixel circuit in an image sensor.

Next, as an example of the case where the pixel circuit of FIG. 9 is actually formed, the top view of the layout of a pixel circuit is illustrated in FIG. 13. Note that as for the transistors used for the pixel circuit of FIG. 9, the charge accumulation control transistor and the reset transistor are formed using an oxide semiconductor, whereas the amplifying transistor and the selection transistor are formed using a silicon semiconductor.

The pixel circuit illustrated in FIG. 13 is formed with a pin photodiode 1901, an amplifying transistor 1902, a charge accumulation control transistor 1903, a reset transistor 1904, a selection transistor 1905, a charge accumulation control signal line 1913, a reset signal line 1914, a selection signal line 1915, an output signal line 1920, a power supply line 1930, and a ground potential line 1931. Layers illustrated in the view are an i-type silicon semiconductor layer 1441, a gate wiring layer 1442, a wiring layer 1443, an n-type silicon semiconductor layer 1444, and a p-type silicon semiconductor layer 1445.

Figure 14:
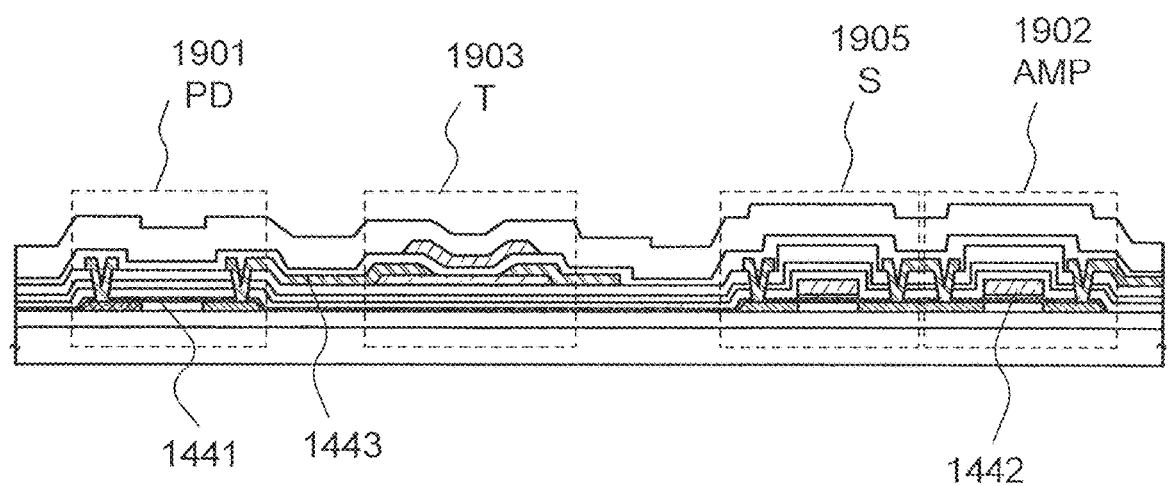
FIG. 14 is a cross-sectional view illustrating a layout of a pixel circuit in an image sensor.

Of these, the i-type silicon semiconductor layer 1441, the n-type silicon semiconductor layer 1444, and the p-type silicon semiconductor layer 1445 are semiconductor layers forming the pin photodiode 1901. As illustrated in a cross-sectional view of FIG. 14, a lateral junction photodiode is formed here. This lateral junction photodiode is an example, and a stacked photodiode or a bulk buried photodiode can be employed. Note that in the cross-sectional view of FIG. 14, a transistor including a silicon semiconductor is of SOI type; however, there is no limitation thereto, and a bulk transistor may be used.

The gate wiring layer 1442 is connected to a gate electrode of the amplifying transistor 1902 and is connected to one of a source and a drain of the charge accumulation control transistor 1903 and one of a source and a drain of the reset transistor 1904 with the wiring layer 1443. In addition, parts of these regions correspond to the signal charge accumulation portion.

Figure 15:
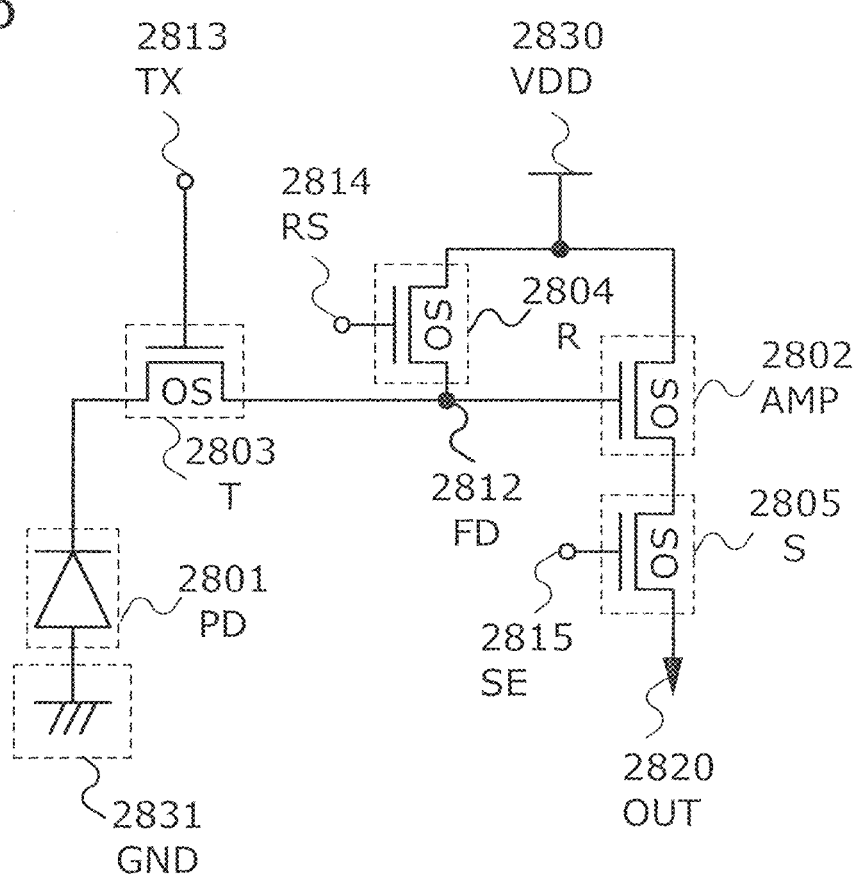
FIG. 15 is a diagram illustrating a circuit configuration of a pixel in an image sensor.
Figure 16:
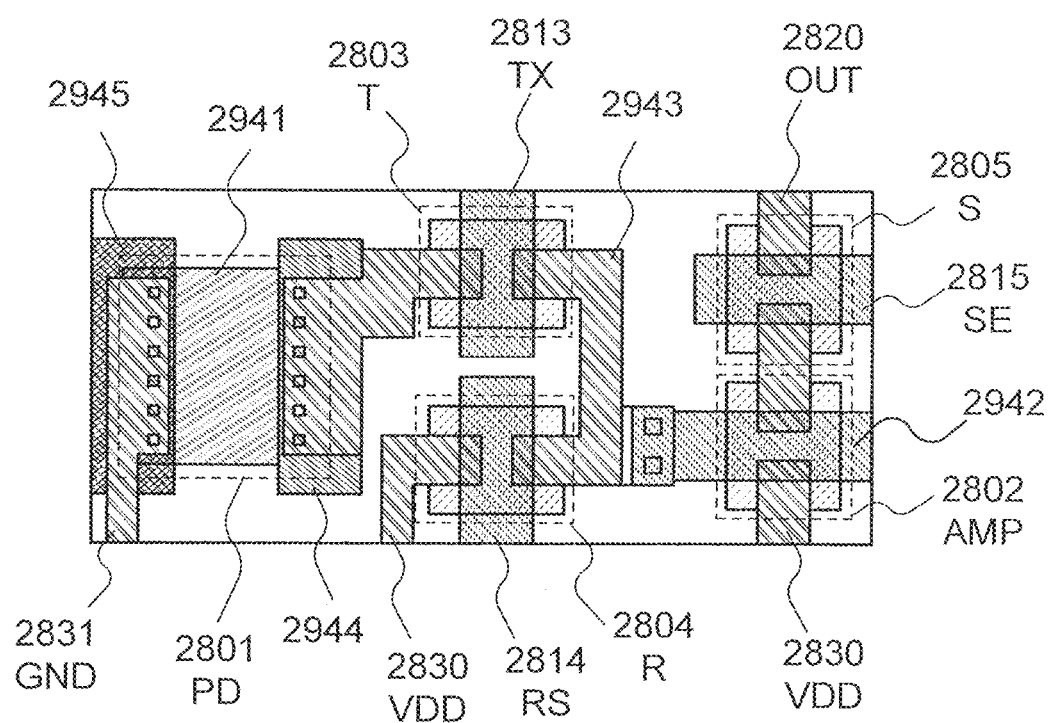
FIG. 16 is a top view illustrating a layout of a pixel circuit in an image sensor.

As another example of the pixel structure, a pixel circuit illustrated in FIG. 15 can be given. The top view of the layout is illustrated in FIG. 16. Note that all the transistors used for the pixel circuit of FIG. 15 are formed using an oxide semiconductor.

The pixel circuit illustrated in FIG. 16 is formed with a pin photodiode 2801, an amplifying transistor 2802, a charge accumulation control transistor 2803, a reset transistor 2804, a selection transistor 2805, a charge accumulation control signal line 2813, a reset signal line 2814, a selection signal line 2815, an output signal line 2820, a power supply line 2830, and a ground potential line 2831. Layers illustrated in the view are an i-type silicon semiconductor layer 2941, a gate wiring layer 2942, a wiring layer 2943, an n-type silicon semiconductor layer 2944, and a p-type silicon semiconductor layer 2945.

Figure 17:
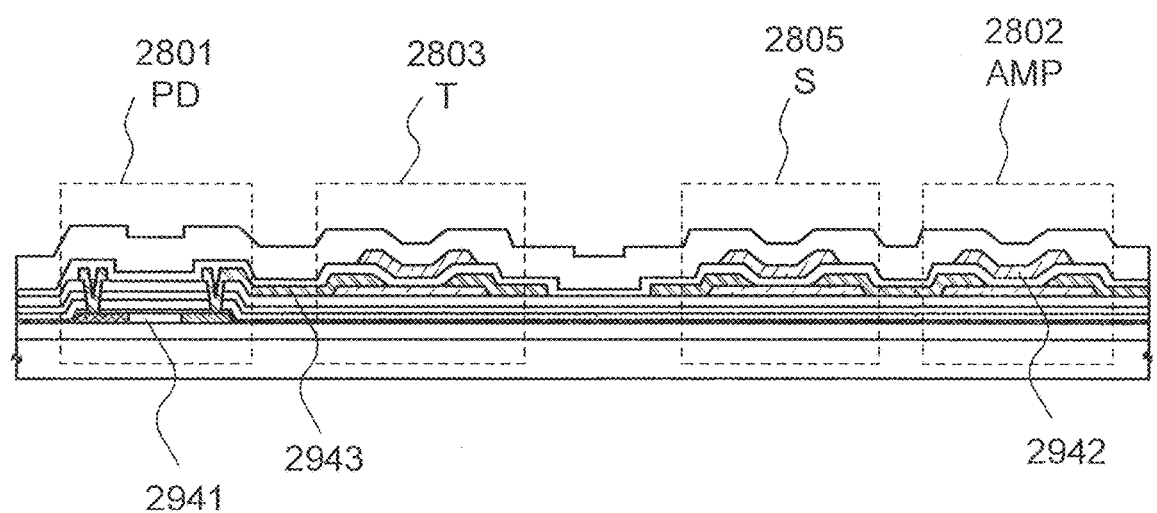
FIG. 17 is a cross-sectional view illustrating a layout of a pixel circuit in an image sensor.

Of these, the i-type silicon semiconductor layer 2941, the n-type silicon semiconductor layer 2944, and the p-type silicon semiconductor layer 2945 are semiconductor layers forming the pin photodiode 2801. As illustrated in a cross-sectional view of FIG. 17, a lateral junction photodiode is formed here. This lateral junction photodiode is an example, and a stacked photodiode can also be employed.

The gate wiring layer 2942 is connected to a gate electrode of the amplifying transistor 2802 and is connected to one of a source and a drain of the charge accumulation control transistor 2803 and one of a source and a drain of the reset transistor 2804 with the wiring layer 2943. In addition, parts of these regions correspond to the signal charge accumulation portion.

There is the saturation electron number as one of important parameters which determine an imaging capability of a CCD sensor or a CMOS sensor. This saturation electron number corresponds to the amount of maximum charge which can be held in the signal charge accumulation portion (FD) in the pixel in the CMOS sensor.

If charge lost from a capacitance (C) of the signal charge accumulation portion (FD) by off-state current (Ioff) of the transistor in a charge holding period ($\Delta t$) is smaller than charge corresponding to voltage ($\Delta V$) for one gray scale, the charge retention which does not have an influence on taking an image can be performed. A relational expression of a capacitance value of the signal charge accumulation portion (FD) and off-state current (Ioff) at this time satisfies $Ioff < C \cdot \Delta V / \Delta t$.

In addition, in the case where a 10-bit gray scale is expressed, at least 1023 electrons are needed. When the 10-bit gray scale is expressed using 1023 electrons, an effect of an error increases, and the influence of noise appears strongly. When the saturation electron number is very small, the influence of an optical shot noise is the strongest, whereby a statistical error is the square root of 1023. The electron number used for expressing one gray scale is increased approximately several times as large as the minimum electron number, whereby the influence of the optical shot noise can be reduced. Therefore, as the saturation electron number increases, the influence of the noise can be reduced.

Accordingly, in the case where each element is miniaturized to reduce the pixel area, a capacitance value also decreases; therefore, the saturation electron number is reduced and there is a strong influence of the noise.

In one embodiment of the present invention, a transistor which is formed using an oxide semiconductor and which has very low off-state current is used in a pixel; therefore, the saturation electron number for leakage is not needed to be considered. Accordingly, the pixel is easily miniaturized. In addition, as compared to the case where a transistor which is formed using a silicon semiconductor is used in a pixel, the noise resistance can be improved in a pixel with the same size.

This embodiment can be implemented in combination with any of the other embodiments or the examples, as appropriate.

Embodiment 3

In this embodiment, a structure of a pixel circuit of a semiconductor device which is one embodiment of the present invention will be described.

In one embodiment of the present invention, various structures can be used for the pixel circuit of the semiconductor device. Although an example based on the pixel circuit configuration illustrated in FIG. 1 is used for description in Embodiments 1 and 2, another pixel circuit configuration is described in this embodiment.

Note that transistors and wirings in this embodiment are named for convenience. Any of names is acceptable as long as functions of the transistors and the wirings are described.

Figure 18:
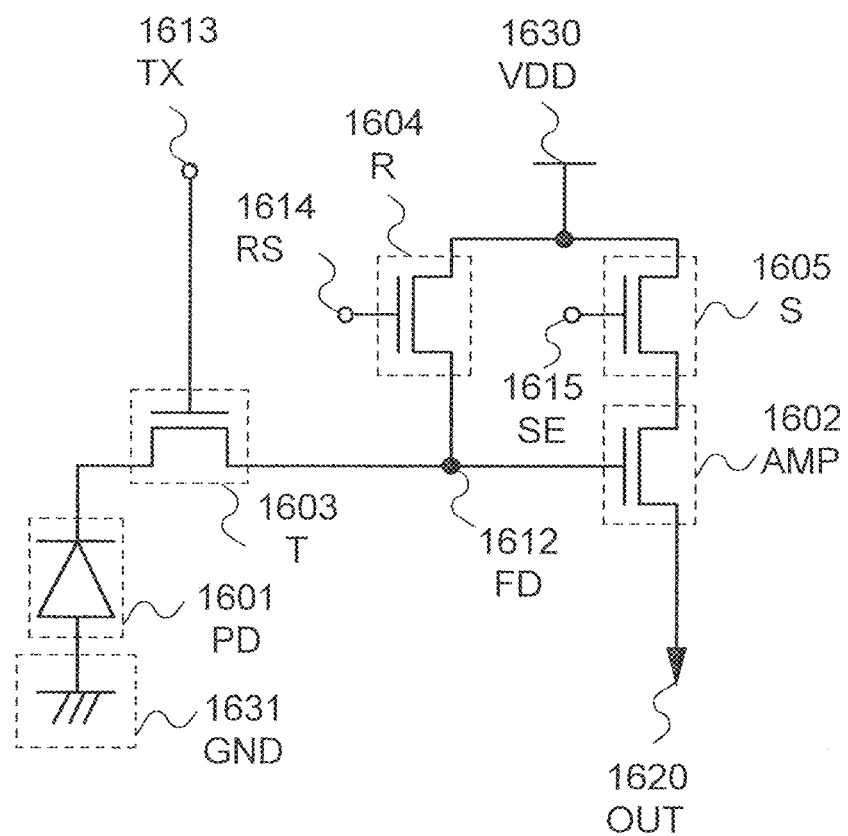
FIG. 18 is a diagram illustrating a circuit configuration of a pixel in an image sensor.

FIG. 18 is a pixel circuit configuration of four transistors, which is similar to that in FIG. 1. A pixel circuit is formed with a photodiode 1601, an amplifying transistor 1602, a charge accumulation control transistor 1603, a reset transistor 1604, and a selection transistor 1605. The circuit configuration of FIG. 18 is different from that of FIG. 1 in the position of the selection transistor 1605.

A gate of the charge accumulation control transistor 1603 is connected to a charge accumulation control signal line 1613, one of a source and a drain of the charge accumulation control transistor 1603 is connected to a cathode of the photodiode 1601, and the other of the source and the drain of the charge accumulation control transistor 1603 is connected to a signal charge accumulation portion 1612. An anode of the photodiode 1601 is connected to a ground potential line 1631.

A gate of the amplifying transistor 1602 is connected to the signal charge accumulation portion 1612, one of a source and a drain of the amplifying transistor 1602 is connected to one of a source and a drain of the selection transistor 1605, and the other of the source and the drain of the amplifying transistor 1602 is connected to an output signal line 1620.

A gate of the reset transistor 1604 is connected to a reset signal line 1614, one of a source and a drain of the reset transistor 1604 is connected to a power supply line 1630, and the other of the source and the drain of the reset transistor 1604 is connected to the signal charge accumulation portion 1612.

A gate of the selection transistor 1605 is connected to a selection signal line 1615, and the other of the source and the drain of the selection transistor 1605 is connected to the power supply line 1630. Here, a charge holding capacitor may be connected between the signal charge accumulation portion 1612 and the ground potential line 1631.

Next, functions of the elements forming the pixel circuit of FIG. 18 are described. The photodiode 1601 generates current in accordance with the amount of light incident on the pixel. The amplifying transistor 1602 outputs a signal which corresponds to a potential of the signal charge accumulation portion 1612. The charge accumulation control transistor 1603 controls charge accumulation in the signal charge accumulation portion 1612 performed by the photodiode 1601. The reset transistor 1604 controls the initialization of the potential of the signal charge accumulation portion 1612. The selection transistor 1605 controls the selection of the pixel in reading. The signal charge accumulation portion 1612 is a charge holding node and holds charge which varies depending on the amount of light received by the photodiode 1601.

The charge accumulation control signal line 1613 is a signal line which controls the charge accumulation control transistor 1603. The reset signal line 1614 is a signal line which controls the reset transistor 1604. The selection signal line 1615 is a signal line which controls the selection transistor 1605. The output signal line 1620 is a signal line serving as an output destination of a signal generated by the amplifying transistor 1602. The power supply line 1630 is a signal line which supplies power supply voltage. The ground potential line 1631 is a signal line which sets a reference potential.

The operation of the pixel circuit illustrated in FIG. 18 is similar to the operation of the pixel circuit illustrated in FIG. 1 described in Embodiment 1.

Figure 19:
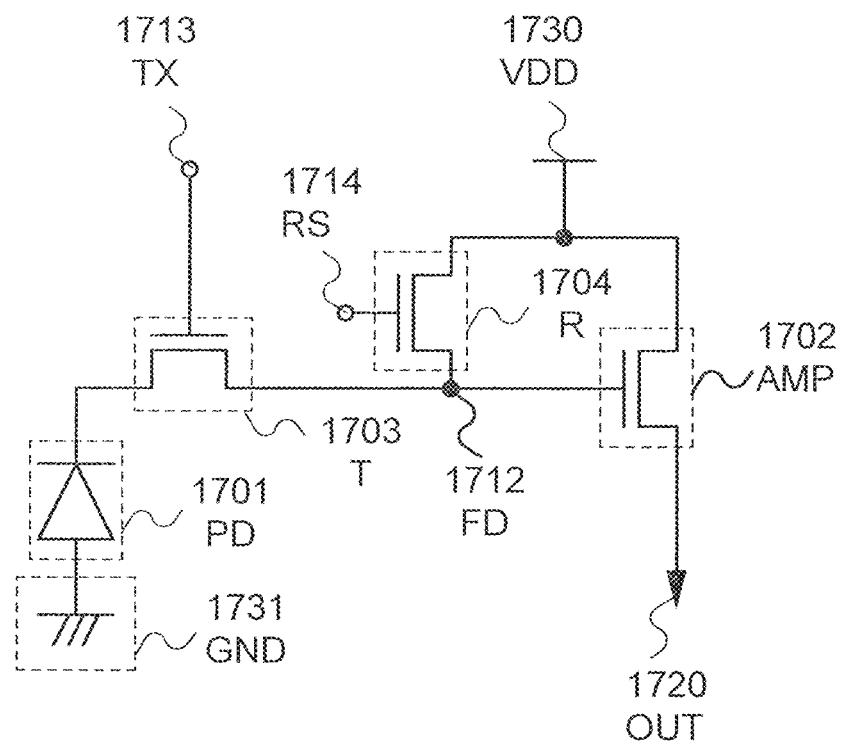
FIG. 19 is a diagram illustrating a circuit configuration of a pixel in an image sensor.

Next, a pixel circuit configuration of three transistors illustrated in FIG. 19 is described. A pixel circuit is formed with a photodiode 1701, an amplifying transistor 1702, a charge accumulation control transistor 1703, and a reset transistor 1704.

A gate of the charge accumulation control transistor 1703 is connected to a charge accumulation control signal line 1713, one of a source and a drain of the charge accumulation control transistor 1703 is connected to a cathode of the photodiode 1701, and the other of the source and the drain of the charge accumulation control transistor 1703 is connected to a signal charge accumulation portion 1712. An anode of the photodiode 1701 is connected to a ground potential line 1731.

A gate of the amplifying transistor 1702 is connected to the signal charge accumulation portion 1712, one of a source and a drain of the amplifying transistor 1702 is connected to a power supply line 1730, and the other of the source and the drain of the amplifying transistor 1702 is connected to an output signal line 1720.

A gate of the reset transistor 1704 is connected to a reset signal line 1714, one of a source and a drain of the reset transistor 1704 is connected to the power supply line 1730, and the other of the source and the drain of the reset transistor 1704 is connected to the signal charge accumulation portion 1712. Here, a charge holding capacitor may be connected between the signal charge accumulation portion 1712 and the ground potential line 1731.

Next, functions of the elements forming the pixel circuit of FIG. 19 are described. The photodiode 1701 generates current in accordance with the amount of light incident on the pixel. The amplifying transistor 1702 outputs a signal which corresponds to a potential of the signal charge accumulation portion 1712. The charge accumulation control transistor 1703 controls charge accumulation in the signal charge accumulation portion 1712 performed by the photodiode 1701. The reset transistor 1704 controls the initialization of the potential of the signal charge accumulation portion 1712. The signal charge accumulation portion 1712 is a charge holding node and holds charge which varies depending on the amount of light received by the photodiode 1701.

The charge accumulation control signal line 1713 is a signal line which controls the charge accumulation control transistor 1703. The reset signal line 1714 is a signal line which controls the reset transistor 1704. The output signal line 1720 is a signal line serving as an output destination of a signal generated by the amplifying transistor 1702. The power supply line 1730 is a signal line which supplies power supply voltage. The ground potential line 1731 is a signal line which sets a reference potential.

Figure 20:
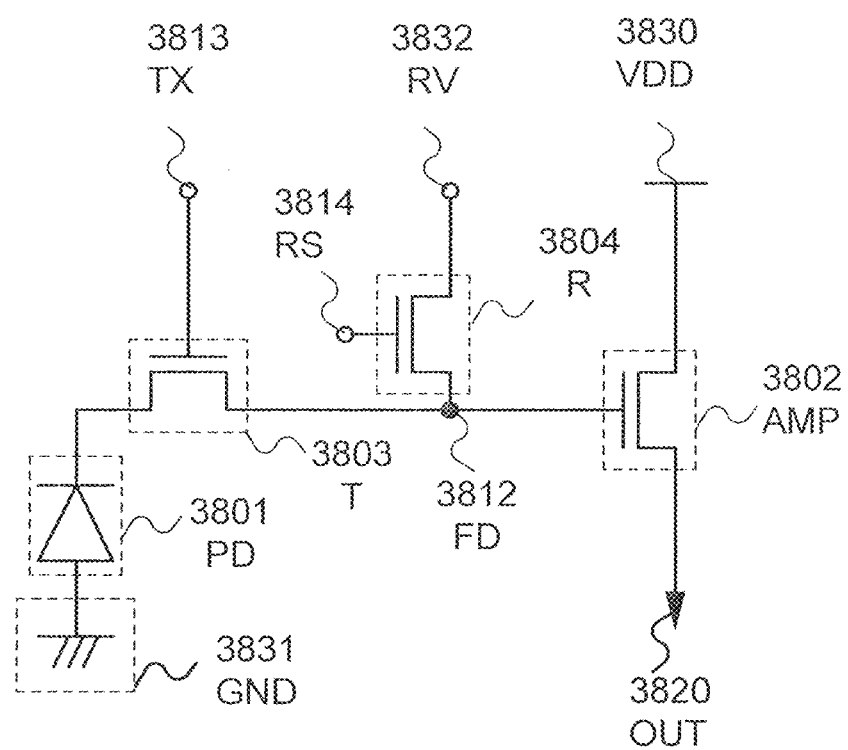
FIG. 20 is a diagram illustrating a circuit configuration of a pixel in an image sensor.

A pixel circuit configuration of three transistors, which is different from that in FIG. 19, is illustrated in FIG. 20. A pixel circuit is formed with a photodiode 3801, an amplifying transistor 3802, a charge accumulation control transistor 3803, and a reset transistor 3804.

A gate of the charge accumulation control transistor 3803 is connected to a charge accumulation control signal line 3813, one of a source and a drain of the charge accumulation control transistor 3803 is connected to a cathode of the photodiode 3801, and the other of the source and the drain of the charge accumulation control transistor 3803 is connected to a signal charge accumulation portion 3812. An anode of the photodiode 3801 is connected to a ground potential line 3831.

A gate of the amplifying transistor 3802 is connected to the signal charge accumulation portion 3812, one of a source and a drain of the amplifying transistor 3802 is connected to a power supply line 3830, and the other of the source and the drain of the amplifying transistor 3802 is connected to an output signal line 3820.

A gate of the reset transistor 3804 is connected to a reset signal line 3814, one of a source and a drain of the reset transistor 3804 is connected to a reset power supply line 3832, and the other of the source and the drain of the reset transistor 3804 is connected to the signal charge accumulation portion 3812. Here, a charge holding capacitor may be connected between the signal charge accumulation portion 3812 and the ground potential line 3831.

Next, functions of the elements forming the pixel circuit of FIG. 20 are described. The photodiode 3801 generates current in accordance with the amount of light incident on the pixel. The amplifying transistor 3802 outputs a signal which corresponds to a potential of the signal charge accumulation portion 3812. The charge accumulation control transistor 3803 controls charge accumulation in the signal charge accumulation portion 3812 performed by the photodiode 3801. The reset transistor 3804 controls the initialization of the potential of the signal charge accumulation portion 3812. The signal charge accumulation portion 3812 is a charge holding node and holds charge which varies depending on the amount of light received by the photodiode 3801.

The charge accumulation control signal line 3813 is a signal line which controls the charge accumulation control transistor 3803. The reset signal line 3814 is a signal line which controls the reset transistor 3804. The output signal line 3820 is a signal line serving as an output destination of a signal generated by the amplifying transistor 3802. The reset power supply line 3832 is a power supply line which is different from the power supply line 3830, and the reset power supply line 3832 can initialize the potential of the signal charge accumulation portion 3812, which is different from a potential of the power supply line 3830. The power supply line 3830 is a signal line which supplies power supply voltage. The ground potential line 3831 is a signal line which sets a reference potential.

Figure 21A:
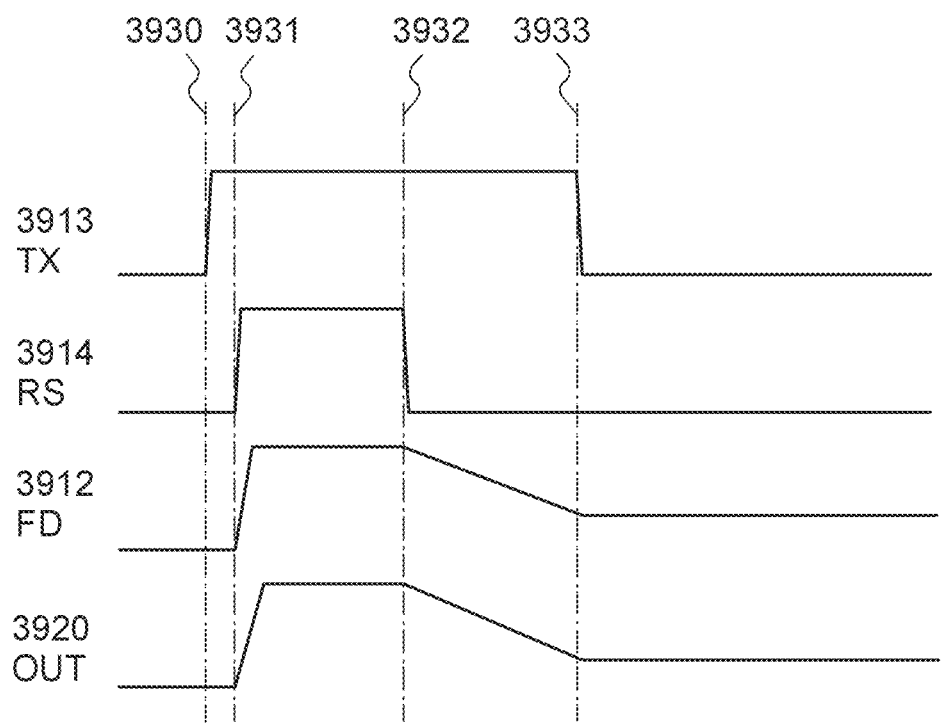
FIGS. 21A and 21B are timing charts each illustrating the operation of a pixel circuit in an image sensor.
Figure 21B:
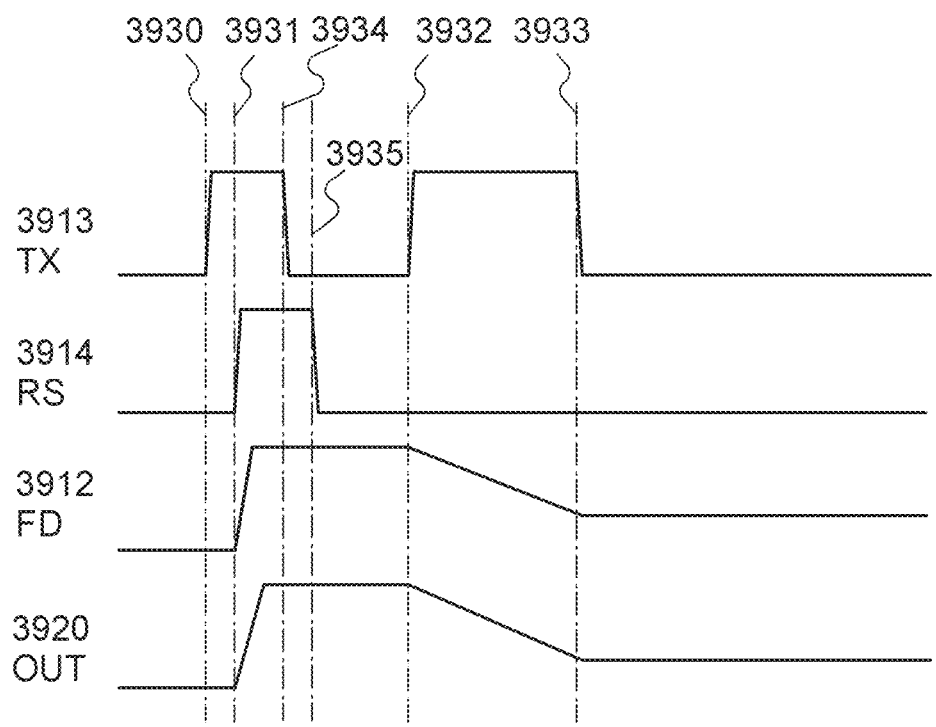

Next, the operations of the pixel circuits of FIG. 19 and FIG. 20 are described using timing charts shown in FIGS. 21A and 21B. Note that the operation of the circuit illustrated in FIG. 19 is basically the same as that in FIG. 20; therefore, the structure of FIG. 19 is described here.

For simple description in FIGS. 21A and 21B, a potential 3913 of the charge accumulation control signal line and a potential 3914 of the reset signal line are provided as signals which vary between two levels. Note that because each potential is an analog signal, the potential can, in practice, have various levels in accordance with situations without limitation on two levels.

First, an operation mode according to FIG. 21A is described.

The potential 3913 of the charge accumulation control signal line 1713 is set to a high level at time 3930. Next, when the potential 3914 of the reset signal line 1714 is set to a high level again at time 3931, a potential of the power supply line 1730 connected to one of the source and the drain of the reset transistor 1704 is supplied as a potential 3912 of the signal charge accumulation portion 1712. These steps are referred to as the reset operation.

When the potential 3914 of the reset signal line 1714 is set to a low level at time 3932, the potential 3912 of the signal charge accumulation portion 1712 holds the same potential as the potential of the power supply line 1730, whereby a reverse bias voltage is applied to the photodiode 1701. At this stage, the accumulation operation starts.

Then, because the reverse current corresponding to the amount of light flows to the photodiode 1701, the amount of charge accumulated in the signal charge accumulation portion 1712 varies in accordance with the amount of light. At the same time, charge is supplied from the power supply line 1730 to the output signal line 1720 in accordance with the potential 3912 of the signal charge accumulation portion 1712. At this stage, the read operation starts.

When the potential 3913 of the charge accumulation control signal line 1713 is set to a low level at time 3933, transfer of charge from the signal charge accumulation portion 1712 to the photodiode 1701 stops, whereby the amount of charge accumulated in the signal charge accumulation portion 1712 is determined. Here, the accumulation operation is terminated.

Then, charge supplied from the power supply line 1730 to the output signal line 1720 is stopped, and a potential 3920 of the output signal line is determined. Here, the read operation is terminated.

Next, an operation mode according to FIG. 21B is described.

The potential 3913 of the charge accumulation control signal line 1713 is set to a high level at the time 3930. Next, when the potential 3914 of the reset signal line 1714 is set to a high level at the time 3931, the potential 3912 of the signal charge accumulation portion 1712 and a potential of the cathode of the photodiode 1701 are initialized to the potential of the power supply line 1730 connected to one of the source and the drain of the reset transistor 1704. These steps are referred to as the reset operation.

When the potential 3913 of the charge accumulation control signal line 1713 is set to a low level at time 3934 and then the potential 3914 of the reset signal line 1714 is set to a low level at time 3935, the reset operation is terminated; accordingly, reverse current corresponding to the amount of light flows to the photodiode 1701 to which the reverse bias voltage is applied, whereby the potential of the cathode of the photodiode 1701 varies.

When the potential 3913 of the charge accumulation control signal line 1713 is set to a high level again at the time 3932, current flows by a difference in potential between the signal charge accumulation portion 1712 and the cathode of the photodiode 1701, and the potential 3912 of the signal charge accumulation portion 1712 varies.

The steps after that are the same as those of the operation mode according to FIG. 21A.

Next, a pixel circuit configuration of three transistors, which is different from that described above, is illustrated in FIG. 22. A pixel circuit is formed with a photodiode 2001, an amplifying transistor 2002, a charge accumulation control transistor 2003, and a reset transistor 2004. An anode of the photodiode 2001 is connected to a ground potential line 2031.

A gate of the charge accumulation control transistor 2003 is connected to a charge accumulation control signal line 2013, one of a source and a drain of the charge accumulation control transistor 2003 is connected to a cathode of the photodiode 2001, and the other of the source and the drain of the charge accumulation control transistor 2003 is connected to a signal charge accumulation portion 2012.

A gate of the amplifying transistor 2002 is connected to the signal charge accumulation portion 2012, one of a source and a drain of the amplifying transistor 2002 is connected to a power supply line 2030, and the other of the source and the drain of the amplifying transistor 2002 is connected to an output signal line 2020.

A gate of the reset transistor 2004 is connected to a reset signal line 2014, one of a source and a drain of the reset transistor 2004 is connected to the signal charge accumulation portion 2012, and the other of the source and the drain of the reset transistor 2004 is connected to the output signal line 2020. Here, a charge holding capacitor may be connected between the signal charge accumulation portion 2012 and the ground potential line 2031.

Figure 22:
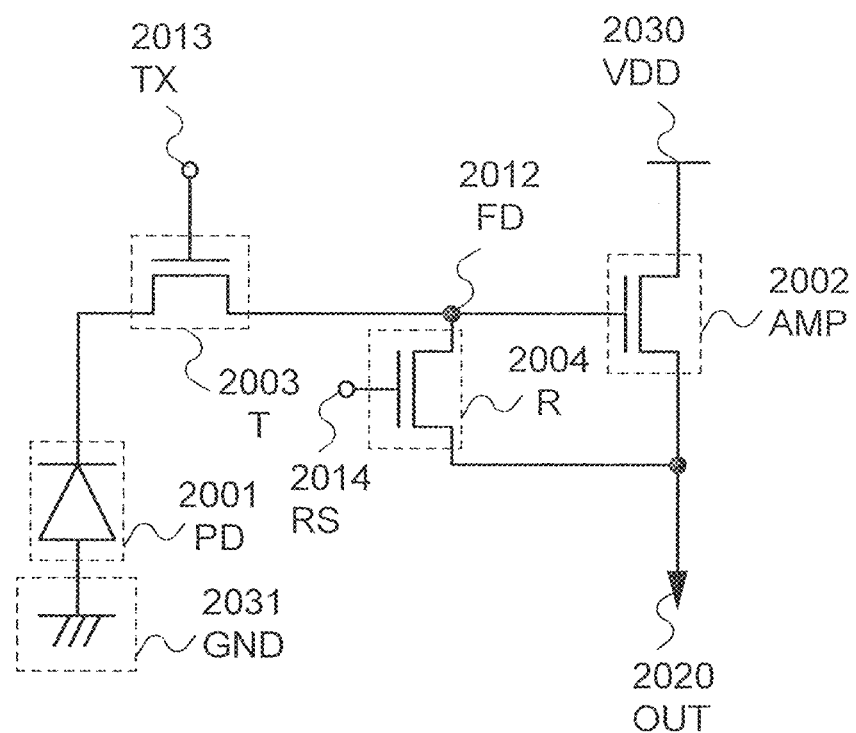
FIG. 22 is a diagram illustrating a circuit configuration of a pixel in an image sensor.

Next, functions of the elements forming the pixel circuit of FIG. 22 are described. The photodiode 2001 generates current in accordance with the amount of light incident on the pixel. The amplifying transistor 2002 outputs a signal which corresponds to a potential of the signal charge accumulation portion 2012. The charge accumulation control transistor 2003 controls charge accumulation in the signal charge accumulation portion 2012 performed by the photodiode 2001. The reset transistor 2004 controls the initialization of the potential of the signal charge accumulation portion 2012. The signal charge accumulation portion 2012 is a charge holding node and holds charge which varies depending on the amount of light received by the photodiode 2001.

The charge accumulation control signal line 2013 is a signal line which controls the charge accumulation control transistor 2003. The reset signal line 2014 is a signal line which controls the reset transistor 2004. The output signal line 2020 is a signal line serving as an output destination of a signal generated by the amplifying transistor 2002. The power supply line 2030 is a signal line which supplies power supply voltage. The ground potential line 2031 is a signal line which sets a reference potential.

Figure 23A:
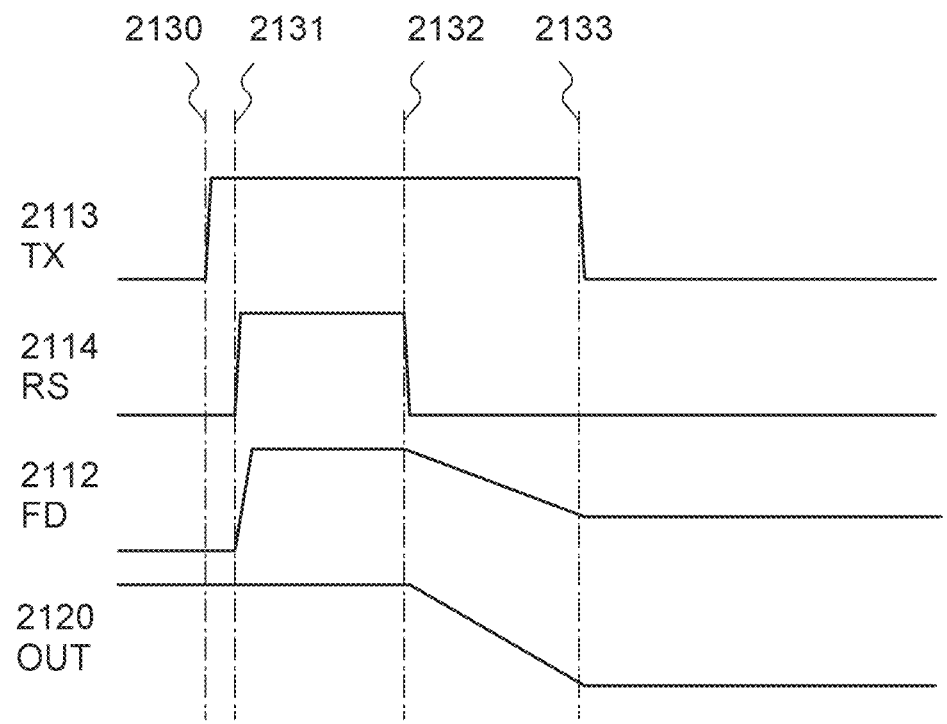
FIGS. 23A and 23B are timing charts each illustrating the operation of a pixel circuit in an image sensor.
Figure 23B:
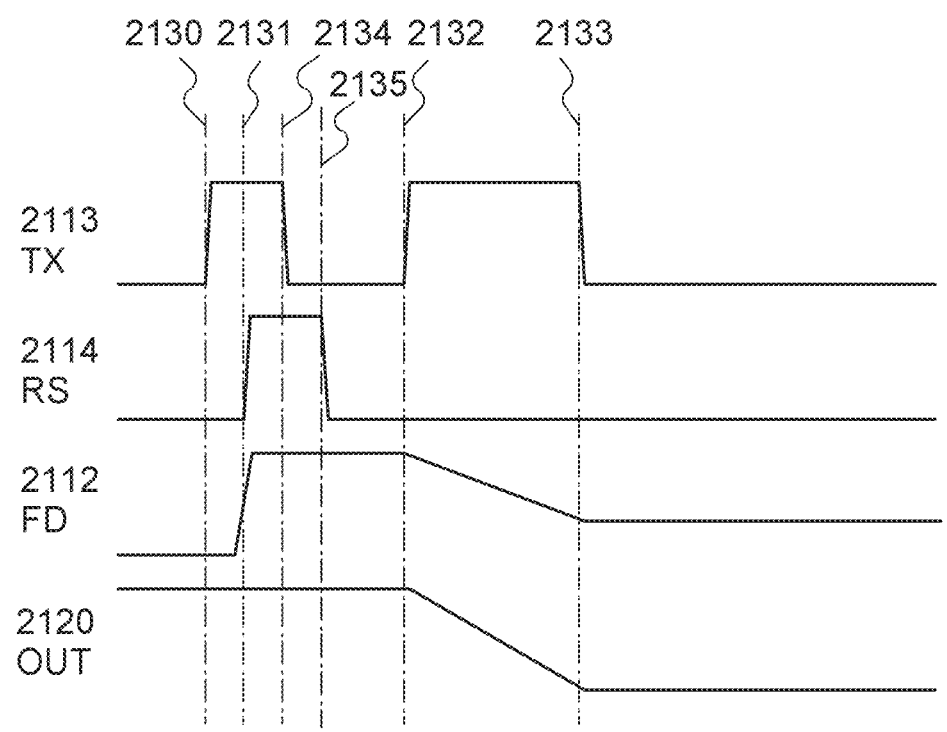

Next, the operation of the pixel circuit of FIG. 22 is described using timing charts shown in FIGS. 23A and 23B.

For simple description in FIGS. 23A and 23B, a potential 2113 of the charge accumulation control signal line 2013 and a potential 2114 of the reset signal line 2014 are provided as signals which vary between two levels. Note that because each potential is an analog signal, the potential can, in practice, have various levels in accordance with situations without limitation on two levels.

First, an operation mode according to FIG. 23A is described.

The potential 2113 of the charge accumulation control signal line 2013 is set to a high level at time 2130. Next, when the potential 2114 of the reset signal line 2014 is set to a high level again at time 2131, a reset potential is supplied from a potential 2120 of the output signal line 2020 connected to the other of the source and the drain of the reset transistor 2004 to the signal charge accumulation portion 2012 as a potential 2112 of the signal charge accumulation portion 2012. These steps are referred to as the reset operation.

When the potential 2114 of the reset signal line 2014 is set to a low level at time 2132, the potential 2112 of the signal charge accumulation portion 2012 holds the reset potential of the signal charge accumulation portion 2012, whereby a reverse bias voltage is applied to the photodiode 2001. At this stage, the accumulation operation starts.

Then, because the reverse current corresponding to the amount of light flows to the photodiode 2001, the amount of charge accumulated in the signal charge accumulation portion 2012 varies in accordance with the amount of light. At the same time, charge is supplied from the power supply line 2030 to the output signal line 2020 in accordance with the potential 2112 of the signal charge accumulation portion 2012. At this stage, the read operation starts.

When the potential 2113 of the charge accumulation control signal line 2013 is set to a low level at time 2133, transfer of charge from the signal charge accumulation portion 2012 to the photodiode 2001 stops, whereby the amount of charge accumulated in the signal charge accumulation portion 2012 is determined. Here, the accumulation operation is terminated.

Then, charge supplied from the power supply line 2030 to the output signal line 2020 is stopped, and the potential 2120 of the output signal line 2020 is determined. Here, the read operation is terminated.

Next, an operation mode according to FIG. 23B is described.

The potential 2113 of the charge accumulation control signal line 2013 is set to a high level at the time 2130. Next, when the potential 2114 of the reset signal line 2014 is set to a high level at the time 2131, the potential 2112 of the signal charge accumulation portion 2012 and a potential of the cathode of the photodiode 2001 are initialized to the potential 2120 of the output signal line 2020 connected to the other of the source and the drain of the reset transistor 2004. These steps are referred to as the reset operation.

When the potential 2113 of the charge accumulation control signal line 2013 is set to a low level at time 2134 and then the potential 2114 of the reset signal line 2014 is set to a low level at time 2135, the reset operation is terminated; accordingly, reverse current corresponding to the amount of light flows to the photodiode 2001 to which the reverse bias voltage is applied, whereby the potential of the cathode of the photodiode 2001 varies.

When the potential 2113 of the charge accumulation control signal line 2013 is set to a high level again at the time 2132, current flows by a difference in potential between the signal charge accumulation portion 2012 and the cathode of the photodiode 2001, and the potential 2112 of the signal charge accumulation portion 2012 varies.

The steps after that are the same as those of the operation mode according to FIG. 23A.

Next, a pixel circuit configuration of three transistors, which is different from that described above, is illustrated in FIG. 24. A pixel circuit is formed with a photodiode 2201, an amplifying transistor 2202, a charge accumulation control transistor 2203, and a selection transistor 2205. An anode of the photodiode 2201 is connected to a reset signal line 2216.

A gate of the charge accumulation control transistor 2203 is connected to a charge accumulation control signal line 2213, one of a source and a drain of the charge accumulation control transistor 2203 is connected to a cathode of the photodiode 2201, and the other of the source and the drain of the charge accumulation control transistor 2203 is connected to a signal charge accumulation portion 2212.

A gate of the amplifying transistor 2202 is connected to the signal charge accumulation portion 2212, one of a source and a drain of the amplifying transistor 2202 is connected to a power supply line 2230, and the other of the source and the drain of the amplifying transistor 2202 is connected to one of a source and a drain of the selection transistor 2205.

A gate of the selection transistor 2205 is connected to a selection signal line 2215, and the other of the source and the drain of the selection transistor 2205 is connected to an output signal line 2220. Here, a charge holding capacitor may be connected between the signal charge accumulation portion 2212 and a ground potential line.

Figure 24:
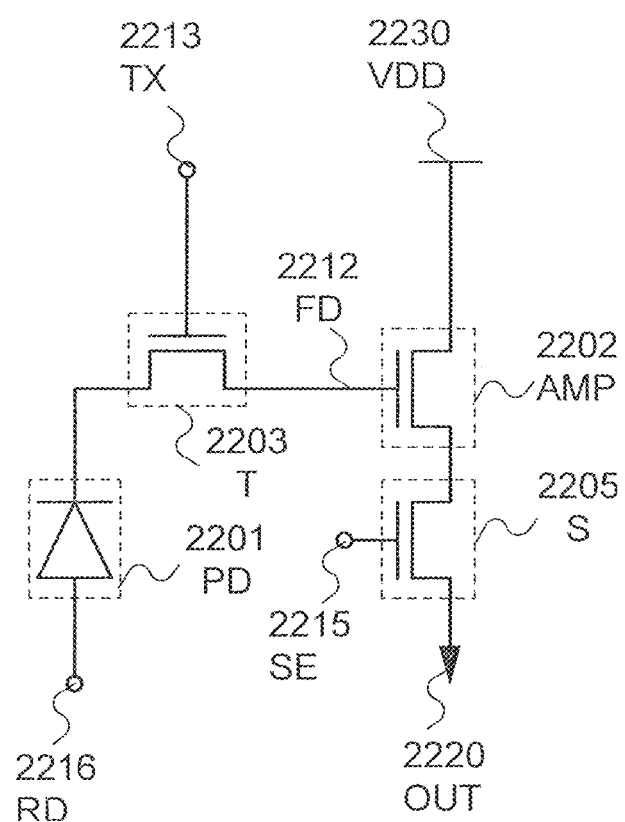
FIG. 24 is a diagram illustrating a circuit configuration of a pixel in an image sensor.

Next, functions of the elements forming the pixel circuit of FIG. 24 are described. The photodiode 2201 generates current in accordance with the amount of light incident on the pixel. The amplifying transistor 2202 outputs a signal which corresponds to a potential of the signal charge accumulation portion 2212. The charge accumulation control transistor 2203 controls charge accumulation in the signal charge accumulation portion 2212 performed by the photodiode 2201. The selection transistor 2205 controls the selection of the pixel in reading. The signal charge accumulation portion 2212 is a charge holding node and holds charge which varies depending on the amount of light received by the photodiode 2201.

The charge accumulation control signal line 2213 is a signal line which controls the charge accumulation control transistor 2203. The reset signal line 2216 is a signal line which supplies a reset potential to the signal charge accumulation portion 2212. The output signal line 2220 is a signal line serving as an output destination of a signal generated by the amplifying transistor 2202. The selection signal line 2215 is a signal line which controls the selection transistor 2205. The power supply line 2230 is a signal line which supplies power supply voltage.

Figure 25A:
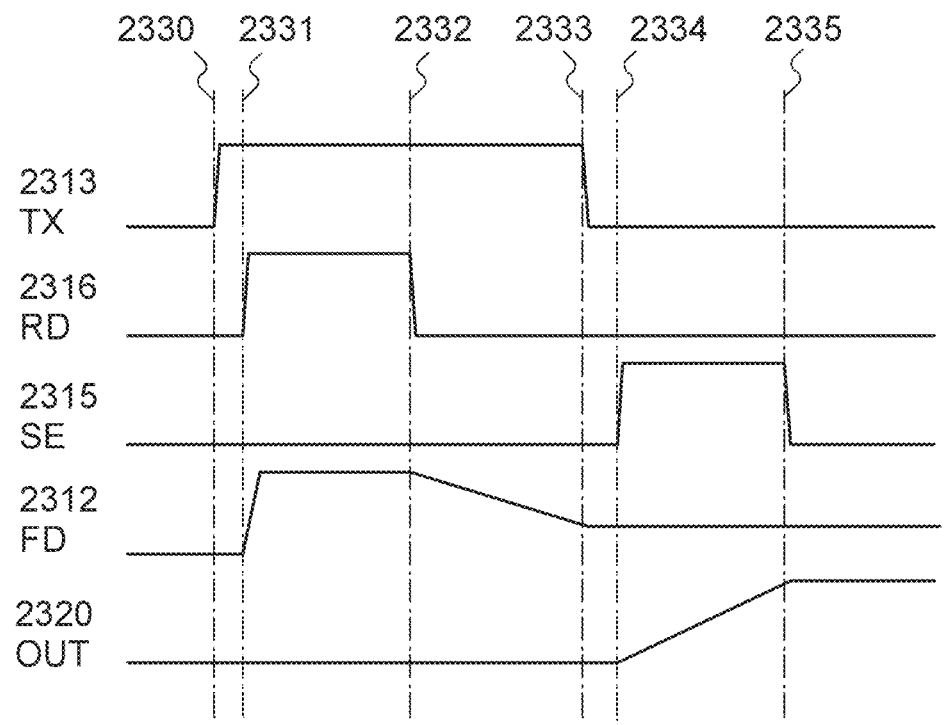
FIGS. 25A and 25B are timing charts each illustrating the operation of a pixel circuit in an image sensor.
Figure 25B:
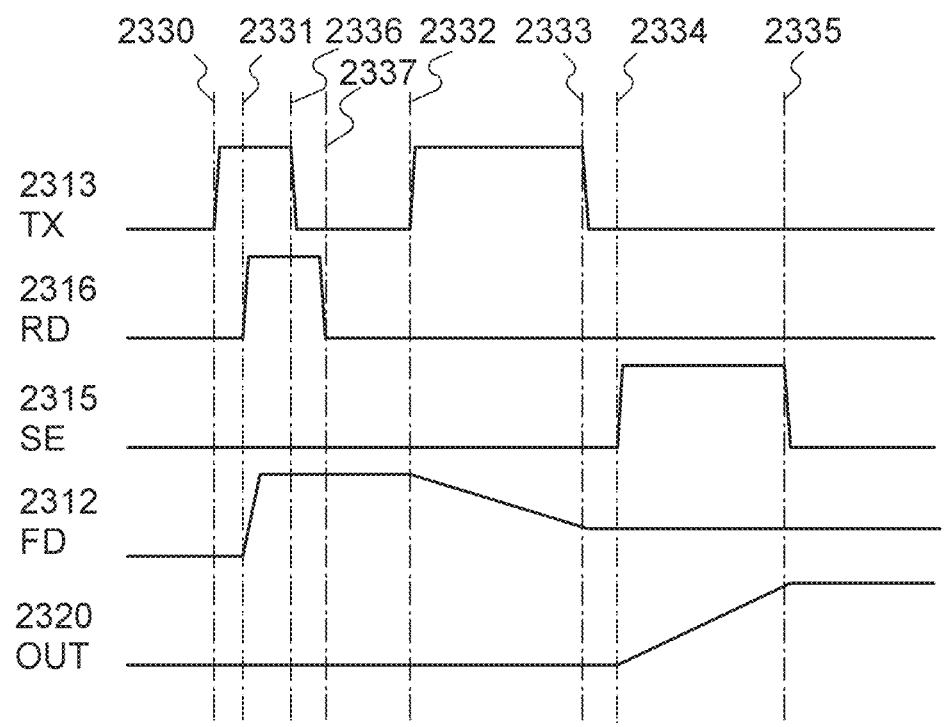

Next, the operations of the pixel circuits of FIG. 24 are described using timing charts shown in FIGS. 25A and 25B.

For simple description in FIGS. 25A and 25B, a potential 2313 of the charge accumulation control signal line 2213, a potential 2316 of the reset signal line 2216, and a potential 2315 of the selection signal line 2215 are provided as signals which vary between two levels. Note that because each potential is an analog signal, the potential can, in practice, have various levels in accordance with situations without limitation on two levels.

First, an operation mode according to FIG. 25A is described.

The potential 2313 of the charge accumulation control signal line 2213 is set to a high level at time 2330. Next, when the potential 2316 of the reset signal line 2216 is set to a high level at time 2331, a potential 2312 of the signal charge accumulation portion 2212 and a potential of the cathode of the photodiode 2201 are initialized to the potential which is lower than the potential 2316 of the reset signal line 2216 by forward voltage of the photodiode 2201. These steps are referred to as the reset operation.

When the potential 2316 of the reset signal line 2216 is set to a low level at time 2332, the potential 2312 of the signal charge accumulation portion 2212 is kept at a high level, whereby a reverse bias voltage is applied to the photodiode 2201. At this stage, the accumulation operation starts.

Then, because the reverse current corresponding to the amount of light flows to the photodiode 2201, the amount of charge accumulated in the signal charge accumulation portion 2212 varies in accordance with the amount of light.

When the potential 2313 of the charge accumulation control signal line 2213 is set to a low level at time 2333, transfer of charge from the signal charge accumulation portion 2212 to the photodiode 2201 stops, whereby the amount of charge accumulated in the signal charge accumulation portion 2212 is determined. Here, the accumulation operation is terminated.

When the potential 2315 of the selection signal line 2215 is set to a high level at time 2334, charge is supplied from the power supply line 2230 to the output signal line 2220 in accordance with the potential 2312 of the signal charge accumulation portion 2212. At this stage, the read operation starts.

When the potential 2315 of the selection signal line 2215 is set to a low level at time 2335, charge supplied from the power supply line 2230 to the output signal line 2220 is stopped, and a potential 2320 of the output signal line 2220 is determined. Here, the read operation is terminated.

Next, an operation mode according to FIG. 25B is described.

The potential 2313 of the charge accumulation control signal line 2213 is set to a high level at the time 2330. Next, when the potential 2316 of the reset signal line 2216 is set to a high level at the time 2331, the potential 2312 of the signal charge accumulation portion 2212 and the potential of the cathode of the photodiode 2201 are initialized to the reset potential which is lower than the potential 2316 of the reset signal line 2216 by forward voltage of the photodiode 2201. These steps are referred to as the reset operation.

When the potential 2313 of the charge accumulation control signal line 2213 is set to a low level at time 2336 and then the potential 2316 of the reset signal line 2216 is set to a low level at time 2337, the reset operation is terminated; accordingly, reverse current corresponding to the amount of light flows to the photodiode 2201 to which the reverse bias voltage is applied, whereby the potential of the cathode of the photodiode 2201 varies.

When the potential 2313 of the charge accumulation control signal line 2213 is set to a high level again at the time 2332, current flows by a difference in potential between the signal charge accumulation portion 2212 and the cathode of the photodiode 2201, and the potential 2312 of the signal charge accumulation portion 2212 varies.

The steps after that are the same as those of the operation mode according to FIG. 25A.

Figure 26:
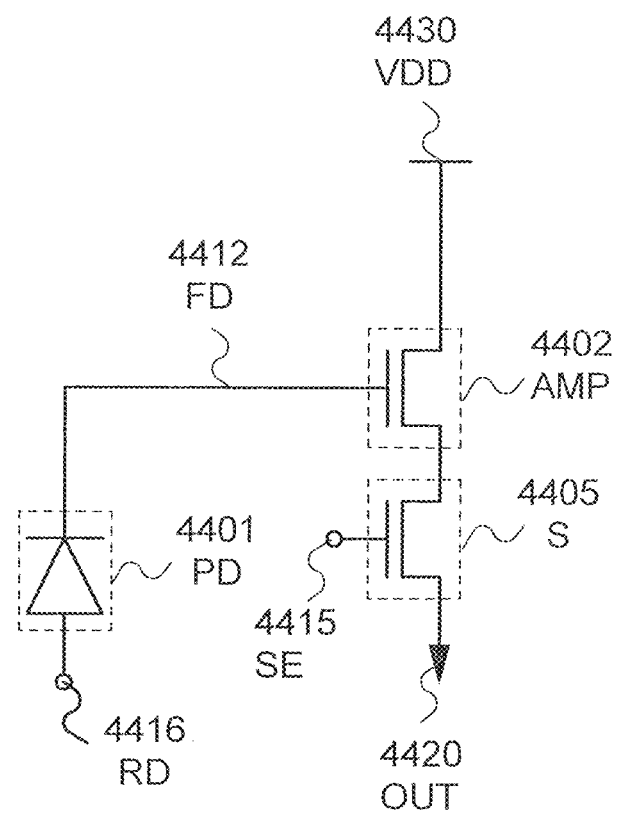
FIG. 26 is a diagram illustrating a circuit configuration of a pixel in an image sensor.

Next, a pixel circuit configuration of two transistors illustrated in FIG. 26 is described.

A pixel circuit is formed with a photodiode 4401, an amplifying transistor 4402, and a selection transistor 4405.

A gate of the amplifying transistor 4402 is connected to a signal charge accumulation control signal portion 4412, one of a source and a drain of the amplifying transistor 4402 is connected to a power supply line 4430, and the other of the source and the drain of the amplifying transistor 4402 is connected to one of a source and a drain of the selection transistor 4405.

A gate of the selection transistor 4405 is connected to a selection signal line 4415, and the other of the source and the drain of the selection transistor 4405 is connected to an output signal line 4420.

A cathode of the photodiode 4401 is connected to the signal charge accumulation portion 4412, and an anode of the photodiode 4401 is connected to a reset signal line 4416. Here, a charge holding capacitor may be connected between the signal charge accumulation portion 4412 and a ground potential line.

Next, a function of an element included in the pixel circuit in FIG. 26 is described. The photodiode 4401 generates current in accordance with the amount of light incident on the pixel. The amplifying transistor 4402 outputs a signal which corresponds to the potential of a signal charge accumulation portion 4412. The selection transistor 4405 controls the selection of the pixel in reading. The signal charge accumulation portion 4412 is a charge holding node and holds charge which varies depending on the amount of light received by the photodiode 4401.

The reset signal line 4416 is a signal line which supplies a reset potential to the signal charge accumulation portion 4412. The output signal line 4420 is a signal line to serve as an output destination of a signal generated by the amplifying transistor 4402. The selection signal line 4415 is a signal line which controls the selection transistor 4405. The power supply line 4430 is a signal line which supplies power supply voltage.

Next, the operations of the pixel circuits of FIG. 26 will be described using timing charts shown in FIG. 27.

Figure 27:
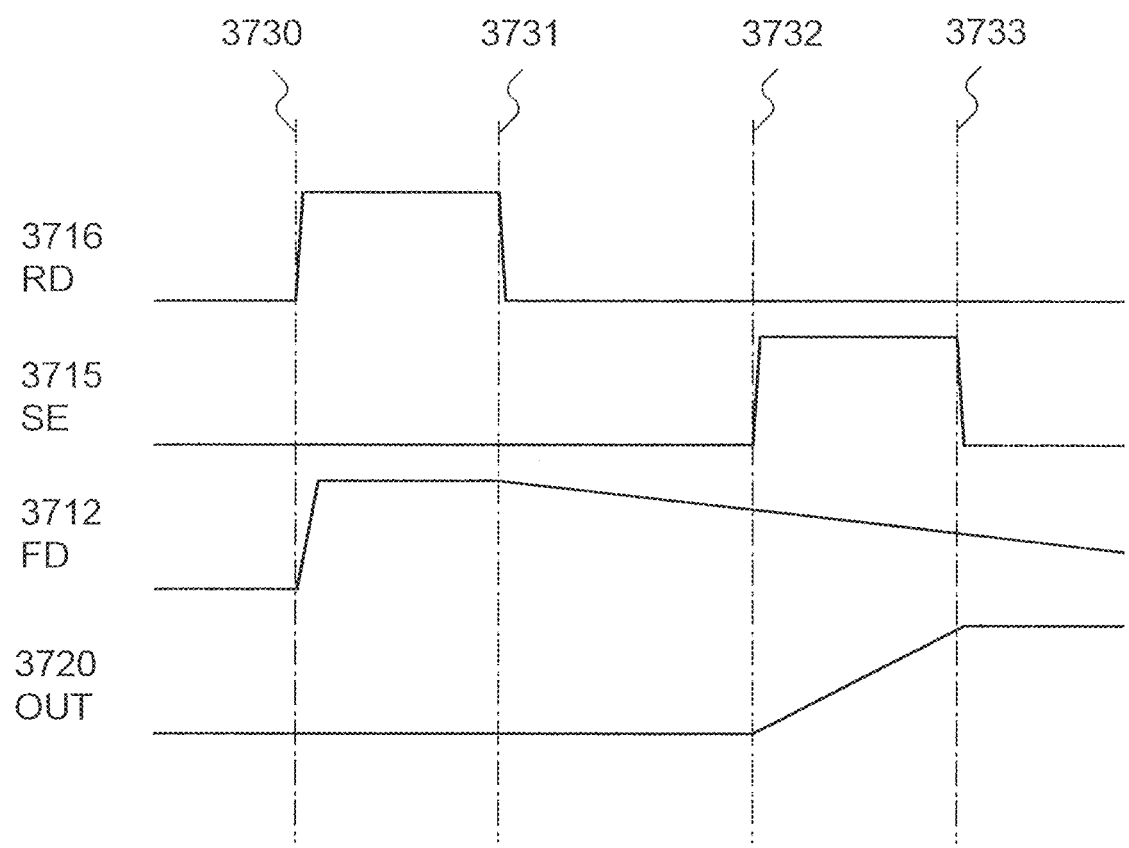
FIG. 27 is a timing chart illustrating the operation of a pixel circuit in an image sensor.

For simple description in FIG. 27, a potential 3716 of the reset signal line 4416 and a potential 3715 of the selection signal line 4415 are provided as signals which vary between two levels. Note that because each potential is an analog signal, the potential can, in practice, have various levels in accordance with situations without limitation on two levels.

When the potential 3716 of the reset signal line 4416 is set to a high level at time 3730, a potential 3712 of the signal charge accumulation portion 4412 is initialized to the reset potential which is lower than the potential 3716 of the reset signal line 4416 by forward voltage of the photodiode 4401. These steps are referred to as the reset operation.

When the potential 3716 of the reset signal line 4416 is set to a low level at time 3731, the potential 3712 of the signal charge accumulation portion 4412 holds the reset potential, whereby a reverse bias voltage is applied to the photodiode 4401. At this stage, the accumulation operation starts.

Then, because the reverse current corresponding to the amount of light flows to the photodiode 4401, the amount of charge accumulated in the signal charge accumulation portion 4412 varies in accordance with the amount of light.

When the potential 3715 of the selection signal line 4415 is set to a high level at time 3732, charge is supplied from the power supply line 4430 to the output signal line 4420 in accordance with the potential 3712 of the signal charge accumulation portion 4412. At this stage, the read operation starts.

When the potential 3715 of the selection signal line 4415 is set to a low level at time 3733, transfer of charge from the signal charge accumulation portion 4412 to the photodiode 4401 stops, whereby the amount of charge accumulated in the signal charge accumulation portion 4412 is determined. Here, the accumulation operation is terminated.

Then, charge supply from the power supply line 4430 to the output signal line 4420 is stopped, and a potential 3720 of the output signal line is determined. Here, the read operation is terminated.

Figure 28:
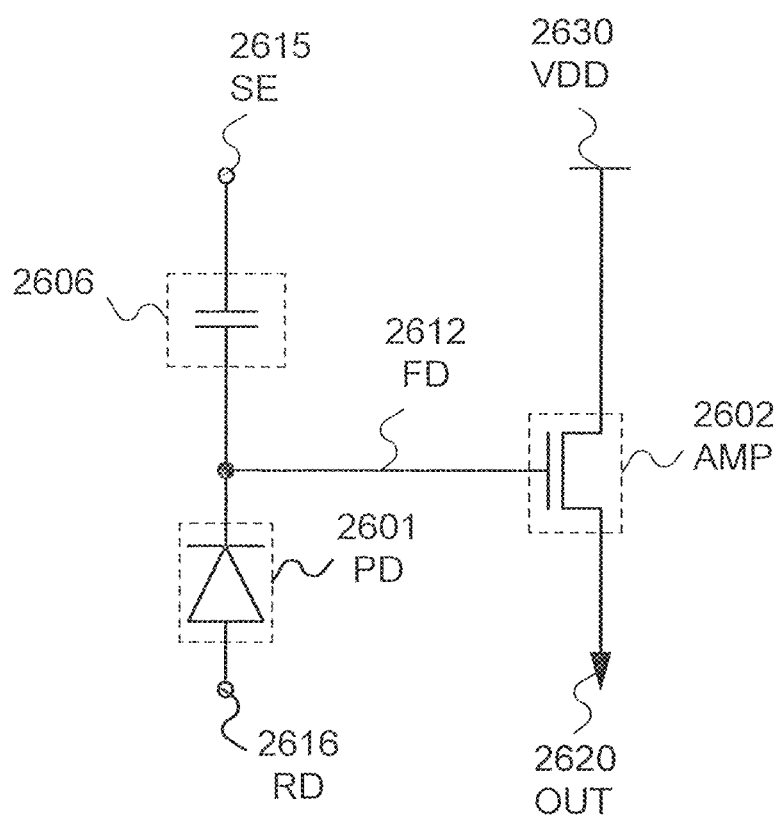
FIG. 28 is a diagram illustrating a circuit configuration of a pixel in an image sensor.

Next, a pixel circuit configuration of one transistor is illustrated in FIG. 28. The pixel circuit includes a photodiode 2601, an amplifying transistor 2602, and a capacitor 2606.

A gate of the amplifying transistor 2602 is connected to a signal charge accumulation portion 2612, one of a source and a drain of the amplifying transistor 2602 is connected to a power supply line 2630, and the other of the source and the drain of the amplifying transistor 2602 is connected to an output signal line 2620.

A cathode of the photodiode 2601 is connected to the signal charge accumulation portion 2612, and an anode of the photodiode 2601 is connected to a reset signal line 2616. One of terminals of the capacitor 2606 is connected to the signal charge accumulation portion 2612 and the other is connected to a selection signal line 2615. Here, a charge holding capacitor is connected between the signal charge accumulation portion 2612 and a ground potential line.

Next, functions of the elements forming the pixel circuit of FIG. 28 are described. The photodiode 2601 generates current in accordance with the amount of light incident on the pixel. The amplifying transistor 2602 outputs a signal which corresponds to the potential of the signal charge accumulation portion 2612. The signal charge accumulation portion 2612 is a charge holding node and holds charge which varies depending on the amount of light received by the photodiode 2601. Note that the selection signal line 2615 controls the potential of the signal charge accumulation portion 2612 with the use of capacitive coupling.

The reset signal line 2616 is a signal line which supplies a reset potential to the signal charge accumulation portion 2612. The output signal line 2620 is a signal line serving as an output destination of a signal generated by the amplifying transistor 2602. The selection signal line 2615 is a signal line which controls the capacitor 2606. The power supply line 2630 is a signal line which supplies power supply voltage.

Next, the operations of the pixel circuits of FIG. 28 will be described using timing charts shown in FIG. 29.

Figure 29:
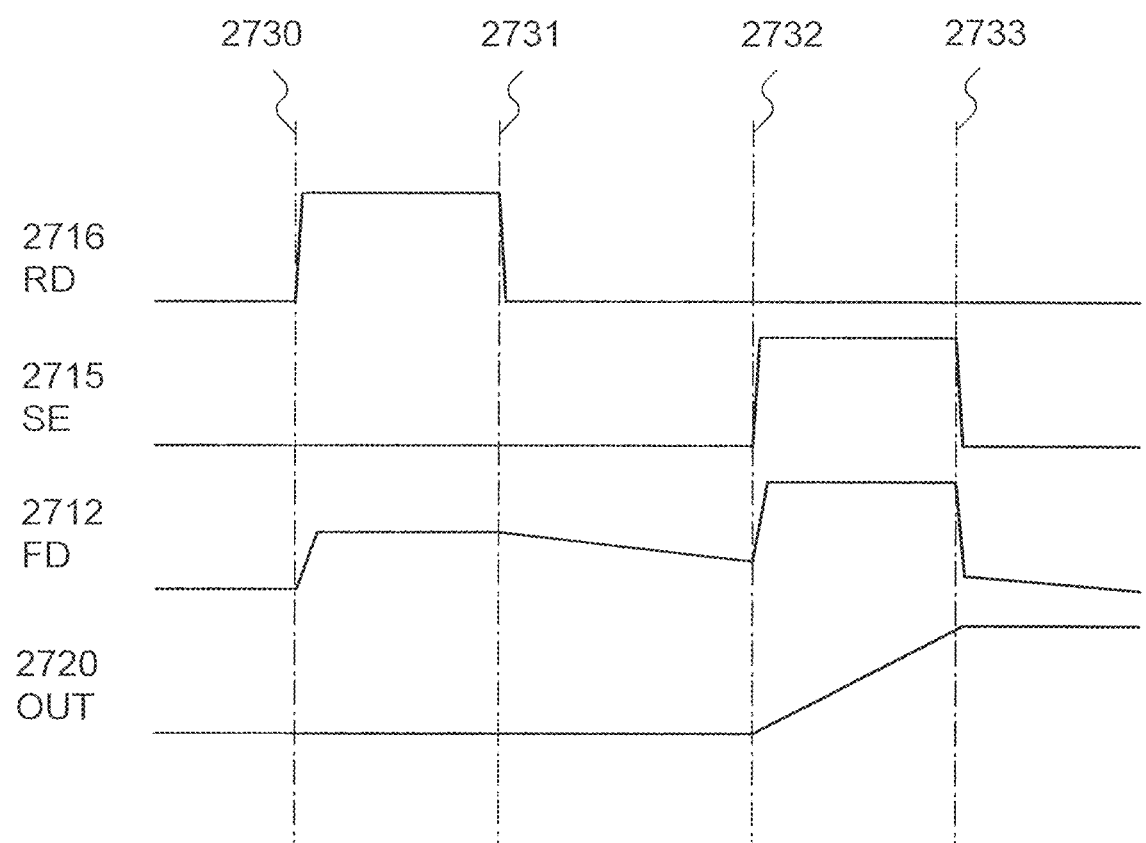
FIG. 29 is a timing chart illustrating the operation of a pixel circuit in an image sensor.

For simple description in FIG. 29, a potential 2716 of the reset signal line 2616 and a potential 2715 of the selection signal line 2615 are provided as signals which vary between two levels. Note that because each potential is an analog signal, the potential can, in practice, have various levels in accordance with situations without limitation on two levels.

When the potential 2716 of the reset signal line 2616 is set to a high level at time 2730, a potential 2712 of the signal charge accumulation portion 2612 is initialized to the reset potential which is lower than the potential 2716 of the reset signal line 2616 by forward voltage of the photodiode 2601. These steps are referred to as the reset operation.

Next, when the potential 2716 of the reset signal line 2616 is set to a low level at time 2731, the potential 2712 of the signal charge accumulation portion 2612 holds the reset potential, whereby a reverse bias voltage is applied to the photodiode 2601. At this stage, the accumulation operation starts.

Then, because the reverse current corresponding to the amount of light flows to the photodiode 2601, the amount of charge accumulated in the signal charge accumulation portion 2612 varies in accordance with the amount of light.

The potential 2715 of the selection signal line 2615 is set to a high level at time 2732, so that the potential 2712 of the signal charge accumulation portion 2612 becomes higher due to capacitive coupling; accordingly, the amplifying transistor 2602 is turned on. Further, charge is supplied from the power supply line 2630 to the output signal line 2620 in accordance with the potential 2712 of the signal charge accumulation portion 2612. At this stage, the read operation starts.

When the potential 2715 of the selection signal line 2615 is set to a low level at time 2733, the potential 2712 of the signal charge accumulation portion 2612 is decreased by capacitive coupling and transfer of charge from the signal charge accumulation portion 2612 to the photodiode 2601 stops, whereby the amount of charge accumulated in the signal charge accumulation portion 2612 is determined. Here, the accumulation operation is terminated.

Then, charge supply from the power supply line 2630 to the output signal line 2620 is stopped, and a potential 2720 of the output signal line is determined. Here, the read operation is terminated.

Note that the pixel circuit structures in FIG. 26 and FIG. 28 have preferably a structure of shielding incident light to the photodiode because charge of the signal charge accumulation portion flows out through the photodiode with the above structures.

This embodiment can be implemented in combination with any of the other embodiments or the examples, as appropriate.

Embodiment 4

In this embodiment, conditions required by leakage current of a transistor used for a semiconductor device in one embodiment of the present invention will be described.

A transistor including a silicon semiconductor has high off-state current. In the case where a CMOS sensor with global shutter which is formed using the transistor is operated, a charge holding period which ends when the last row is read gets longer and more charge flows due to the off-state current in that period. The amount of charge is changed, which appears as a change in the gray scale of an image, and a normal image is not obtained.

In this embodiment, in the case where a CMOS sensor with global shutter is used, conditions required for the off-state current of a transistor connected to a signal charge accumulation portion in a pixel is described.

Charge stored in the signal charge accumulation portion (FD) is lost by the off-state current (Ioff) of the transistor connected to the signal charge accumulation portion (FD). The amount of variations in charge which does not affect the gray scale of an image means the amount of charge ($\Delta Q_{FD}$) in a charge holding period ($\Delta t$) is smaller than the amount of charge corresponding to voltage ($\Delta V_{FD}$) which is changed by one gray scale of the capacitance ($C_{FD}$) of the signal charge accumulation portion (FD). The relation between the capacitance value ($C_{FD}$) of the signal charge accumulation portion (FD) and the off-state current (Ioff) at this time is expressed by Formula 1.

$$C_{FD} \cdot \Delta V_{FD} \geq I_{off} \cdot \Delta t = \Delta Q_{FD} \quad \text{Formula (1)}$$

Here, when the maximum voltage ($V_{FD}$) of the signal charge accumulation portion (FD), a ratio (a) of effective value with respect to a change of one gray scale, and the number of n-bit gray scales ($2^n$) are used, the voltage ($\Delta V_{FD}$) which is changed by one gray scale can be expressed by Formula 2.

$$\Delta V_{FD} = V_{FD} \cdot a/2^n \quad \text{Formula (2)}$$

In addition, because the charge holding period ($\Delta t$) needs a charge holding period for one frame at the maximum, the charge holding period ($\Delta t$) can be expressed by Formula 3 when a frame frequency (f) is used.

$$\Delta t = 1/f \quad \text{Formula (3)}$$

Here, Formulae 1, 2, and 3 are arranged, and Formula 4 is obtained.

$$2^n \leq C_{FD} \cdot V_{FD} \cdot f \cdot a/I_{off} \quad \text{Formula (4)}$$

Figure 37:
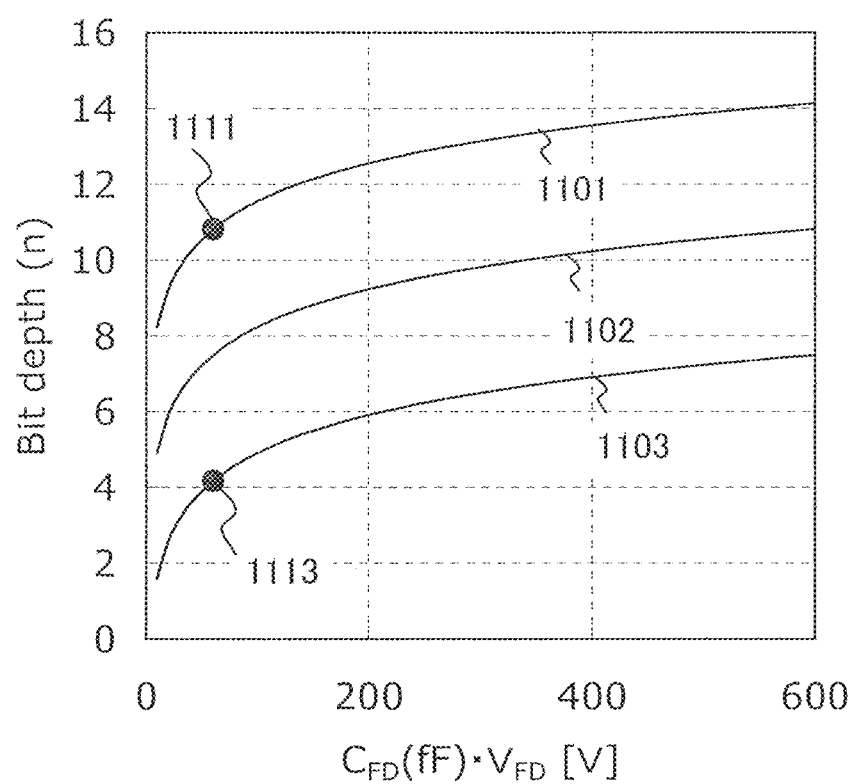
FIG. 37 is a diagram expressing a relation between the number of gray scales of a taken image and charge.

FIG. 37 is a graph showing the case where the relational expression of Formula 4 is expressed with an equal sign. The vertical axis represents the number of gray scales (n) of an image, and the horizontal axis represents charge $Q_{FD}$ ($=C_{FD} \cdot V_{FD}$). Three curves show states in which the off-state currents (Ioff) of the transistor are different from one another, and a curve 1101 shows 1 [fA], a curve 1102 shows 10 [fA], and a curve 1103 shows 100 [fA]. Areas below the curve 1101, the curve 1102, and the curve 1103 respectively show the number of gray scales which can be provided. Note that FIG. 37 shows calculation results of the case where the relations of f=60 [Hz] and a=50 [%] are satisfied.

It is found from FIG. 37 and Formula 4 that the number of gray scales (n) of an image is logarithmically proportional to the capacitance ($C_{FD}$) and the voltage ($V_{FD}$). Reduction in the pixel size is accompanied with a decrease in the capacitance ($C_{FD}$). Reduction in power consumption is accompanied with a decrease in voltage ($V_{FD}$). Therefore, it is necessary to decrease the off-state current (Ioff) in order to realize improvement in quality of an image as well as reduction in the pixel size and power consumption. That is, when the off-state current (Ioff) is reduced, the pixel size and power consumption can be decreased; accordingly, an image sensor by which a high quality image is taken can be provided.

As an example, an image sensor with the condition in which the relations of $C_{FD}$=20 [fF] and $V_{FD}$=3 [V] are satisfied. A point 1111 and a point 1113 corresponding to this condition in FIG. 37 are described. The number of gray scales n of an image at the point 1113 is 4.17 [bit], whereas the number thereof at the point 1111 is 10.81 [bit]. Therefore, it is necessary to employ a transistor whose Ioff is approximately less than or equal to 1 [fA] in order to provide an image sensor with global shutter in which the relations of $C_{FD}$=20 [fF], $V_{FD}$=3 [V], and n=10 [bit] are satisfied. Such a transistor with very low off-state current can be provided by use of a transistor including an oxide semiconductor.

The minimum value of the amount of charge corresponding to one gray scale is ideally the amount of charge for one electron (1 e=1.902×10$^{-19}$ [C]). Needless to say, because the noise caused by a statistical error, such as a variation in the electron number should be removed in an actual semiconductor device, several or more electrons are required in practical. Here, when an ideal limit is considered, the charge ($\Delta Q_{FD}$) which is to be lost in the charge holding period should be smaller than the amount of charge for one electron (1 e). Accordingly, Formula 1 can be expressed as Formula 5.

$$C_{FD} \cdot \Delta V_{FD} = 1e \geq I_{off} \cdot \Delta t \quad \text{Formula (5)}$$

Figure 38:
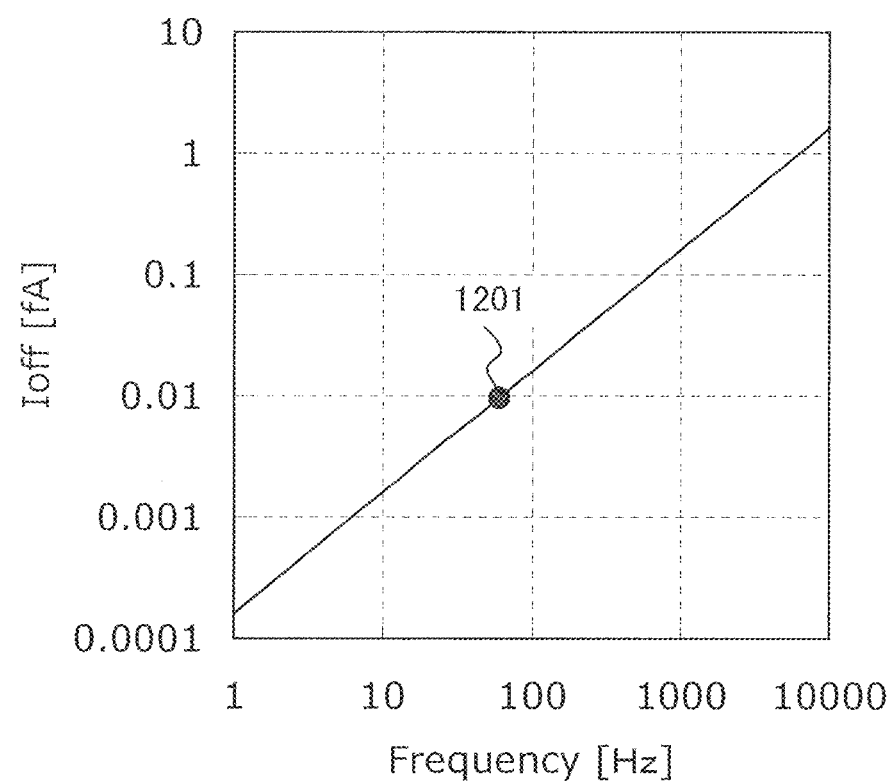
FIG. 38 is a diagram expressing a relation between off-state current and frame frequency of a transistor which is necessary for holding charge.

Further, Formula 5 can be expressed as Formula 6. FIG. 38 is a graph showing the case where the relational expression of Formula 6 is expressed with an equal sign. The vertical axis represents the off-state current (Ioff) of the transistor, and the horizontal axis represents the frame frequency (f). For example, in the case where f is 60 [Hz] illustrated as a point 1201 in FIG. 38, the required off-state current Ioff of the transistor is less than or equal to 0.01 [fA] (=1.902×10$^{-19}$ [C]×60 [Hz]).

$$I_{off} \leq 1e/\Delta t = 1 \ e \cdot f \quad \text{Formula (6)}$$

That is, in order to realize a CMOS image sensor with global shutter, a transistor whose off-state current is less than or equal to 0.01 [fA] may be used as a transistor connected to the signal charge accumulation portion in the pixel. Such an image sensor becomes feasible by use of a transistor including an oxide semiconductor as a transistor whose off-state current is very low.

This embodiment can be implemented in combination with any of the other embodiments or the examples, as appropriate.

Embodiment 5

In this embodiment, an example of a transistor including an oxide semiconductor will be described.

There is no particular limitation on a structure of a transistor including an oxide semiconductor disclosed in this specification. For example, a staggered type transistor or a planar type transistor having a top-gate structure or a bottom-gate structure can be employed. Further, the transistor may have a single gate structure including one channel formation region, a double gate structure including two channel formation regions, or a triple gate structure including three channel formation regions.

FIGS. 30A to 30D each illustrate an example of a cross-sectional structure of a transistor.

Transistors illustrated in FIGS. 30A to 30D each include an oxide semiconductor. An advantage of using an oxide semiconductor is that relatively high mobility and very low off-state current can be obtained; needless to say, other semiconductors can be used.

Figure 30A:
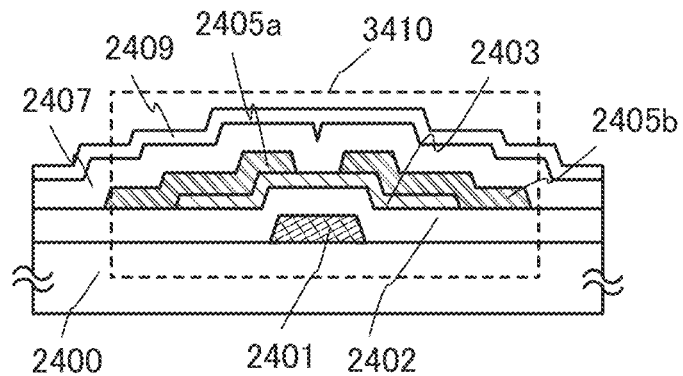
FIGS. 30A to 30D are cross-sectional views each illustrating a structure of a transistor.

A transistor 3410 illustrated in FIG. 30A is one of bottom-gate transistors, and is also referred to as an inverted staggered transistor.

The transistor 3410 includes, over a substrate 2400 having an insulating surface, a gate electrode layer 2401, a gate insulating layer 2402, an oxide semiconductor layer 2403, a source electrode layer 2405a, and a drain electrode layer 2405b. An insulating layer 2407 and a protective insulating layer 2409 are formed so as to cover these.

Figure 30B:
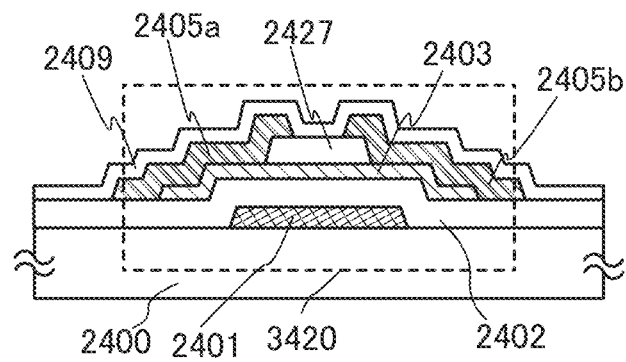

A transistor 3420 illustrated in FIG. 30B is one of bottom-gate transistors referred to as a channel-protective type and is also referred to as an inverted staggered transistor.

The transistor 3420 includes, over the substrate 2400 having an insulating surface, the gate electrode layer 2401, the gate insulating layer 2402, the oxide semiconductor layer 2403, an insulating layer 2427 functioning as a channel protective layer which covers a channel formation region of the oxide semiconductor layer 2403, the source electrode layer 2405a, and the drain electrode layer 2405b. In addition, the protective insulating layer 2409 is formed so as to cover these.

Figure 30C:
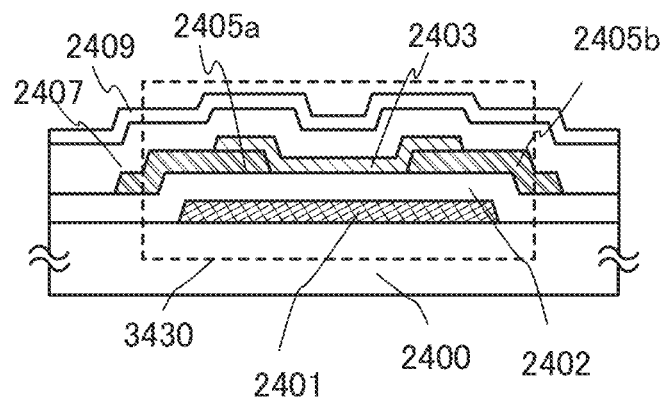

A transistor 3430 illustrated in FIG. 30C is a bottom-gate transistor, and includes, over the substrate 2400 having an insulating surface, the gate electrode layer 2401, the gate insulating layer 2402, the source electrode layer 2405a, the drain electrode layer 2405b, and the oxide semiconductor layer 2403. In addition, the insulating layer 2407 and the protective insulating layer 2409 are formed so as to cover these.

In the transistor 3430, the gate insulating layer 2402 is provided on and in contact with the substrate 2400 and the gate electrode layer 2401, and the source electrode layer 2405a and the drain electrode layer 2405b are provided on and in contact with the gate insulating layer 2402. Further, the oxide semiconductor layer 2403 is provided over the gate insulating layer 2402, the source electrode layer 2405a, and the drain electrode layer 2405b.

Figure 30D:
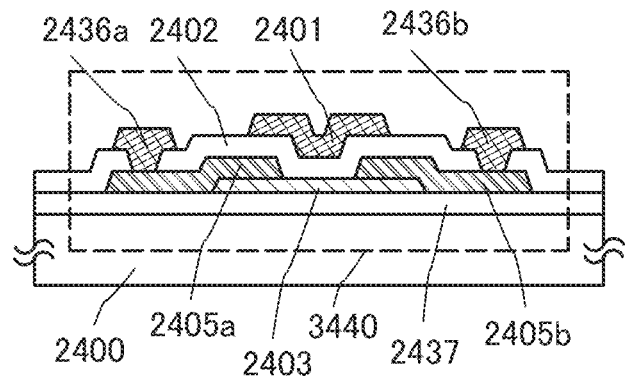

A transistor 3440 illustrated in FIG. 30D is a kind of top-gate transistor. The transistor 3440 includes, over the substrate 2400 having an insulating surface, an insulating layer 2437, the oxide semiconductor layer 2403, the source electrode layer 2405a, the drain electrode layer 2405b, the gate insulating layer 2402, and the gate electrode layer 2401. A wiring layer 2436a and a wiring layer 2436b are provided to be in contact with and electrically connected to the source electrode layer 2405a and the drain electrode layer 2405b, respectively.

In this embodiment, the oxide semiconductor layer 2403 is used as a semiconductor layer included in a transistor as described above. As an oxide semiconductor material used for the oxide semiconductor layer 2403, any of the following metal oxides can be used: an In—Sn—Ga—Zn—O-based metal oxide which is a four-component metal oxide; an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, and a Sn—Al—Zn—O-based metal oxide which are three-component metal oxides; an In—Zn—O-based metal oxide, a Sn—Zn—O-based metal oxide, an Al—Zn—O-based metal oxide, a Zn—Mg—O-based metal oxide, a Sn—Mg—O-based metal oxide, and an In—Mg—O-based metal oxide which are two-component metal oxides; an In—O-based metal oxide; a Sn—O-based metal oxide; and a Zn—O-based metal oxide. Further, Si may be contained in the oxide semiconductor. Here, for example, an In—Ga—Zn—O-based oxide semiconductor is an oxide containing at least In, Ga, and Zn, and there is no particular limitation on the composition ratio thereof. Further, the In—Ga—Zn—O-based oxide semiconductor may contain an element other than In, Ga, and Zn.

For the oxide semiconductor layer 2403, a thin film represented by the chemical formula, $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the transistors 3410, 3420, 3430, and 3440 each including the oxide semiconductor layer 2403, the current value in an off state (off-state current value) can be small. Accordingly, in the case where the transistors 3410, 3420, 3430, and 3440 are connected to a charge storage node, flow of charge can be prevented as much as possible.

In addition, each of the transistors 3410, 3420, 3430, and 3440 which include the oxide semiconductor layer 2403 can operate at high speed because they can achieve field-effect mobility that is relatively higher. Therefore, a driver circuit portion which drives a pixel can be formed on one substrate of, for example, a display device, an imaging device, or the like; therefore, the number of components can be reduced.

As the substrate 2400 having an insulating surface, a glass substrate formed of barium borosilicate glass, aluminoborosilicate glass, or the like can be used.

In the bottom-gate transistors 3410, 3420, and 3430, an insulating film serving as a base film may be provided between the substrate and the gate electrode layer. The base film has a function of preventing diffusion of an impurity element from the substrate, and can be formed to have a single-layer structure or a stacked structure using one or more films selected from a silicon nitride film, a silicon oxide film, a silicon nitride oxide film, and a silicon oxynitride film.

The gate electrode layer 2401 can be formed using a metal material such as molybdenum, titanium, chromium, tantalum, tungsten, aluminum, copper, neodymium, or scandium or an alloy material which contains any of these materials as its main component. The gate electrode layer 2401 is not limited to a single layer, and a stacked layer of different films may also be used.

The gate insulating layer 2402 can be formed using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer, by a plasma-enhanced CVD method, a sputtering method, or the like. The gate insulating layer 2402 is not limited to the single layer, and a stacked layer of different films may also be used. For example, by a plasma-enhanced CVD method, a silicon nitride layer ($SiN_y$ (y>0)) with a thickness greater than or equal to 50 nm and less than or equal to 200 nm is formed as a first gate insulating layer, and a silicon oxide layer ($SiO_x$ (x>0)) with a thickness greater than or equal to 5 nm and less than or equal to 200 nm is formed as a second gate insulating layer over the first gate insulating layer, so that a gate insulating layer with a total thickness of 200 nm is formed.

As the conductive film used for the source electrode layer 2405a and the drain electrode layer 2405b, for example, a film of an element selected from Al, Cr, Cu, Ta, Ti, Mo, and W, a film of alloy containing any of these elements, or the like can be used. Alternatively, a structure may be employed in which a high-melting-point metal layer of Ti, Mo, W, or the like is stacked over and/or below a metal layer of Al, Cu, or the like. In addition, heat resistance can be improved by using an Al material to which an element (Si, Nd, Sc, or the like) which prevents generation of a hillock or a whisker in an Al film is added.

A material similar to that of the source electrode layer 2405a and the drain electrode layer 2405b can be used for a conductive film such as the wiring layer 2436a and the wiring layer 2436b which are connected to the source electrode layer 2405a and the drain electrode layer 2405b, respectively.

Alternatively, the conductive film to be the source electrode layer 2405a and the drain electrode layer 2405b (including a wiring layer formed using the same layer as the source and drain electrode layers) may be formed using a conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO), indium oxide-zinc oxide alloy ($In_2O_3$—ZnO), or any of these metal oxide materials in which silicon oxide is contained can be used.

As the insulating layers 2407, 2427, and 2437, an inorganic insulating film typical examples of which are a silicon oxide film, a silicon oxynitride film, an aluminum oxide film, and an aluminum oxynitride film can be used.

As the protective insulating layer 2409, an inorganic insulating film such as a silicon nitride film, an aluminum nitride film, a silicon nitride oxide film, or an aluminum nitride oxide film can be used.

A planarization insulating film may be formed over the protective insulating layer 2409 in order to reduce surface unevenness caused by the structure of the transistor. As the planarization insulating film, an organic material such as polyimide, acrylic, or benzocyclobutene can be used. Other than such organic materials, it is also possible to use a low-dielectric constant material (a low-k material) or the like. Note that the planarization insulating film may be formed by stacking a plurality of insulating films formed from these materials.

Thus, a high-performance semiconductor device can be provided by using a transistor including an oxide semiconductor layer described in this embodiment.

This embodiment can be implemented in appropriate combination with the structures described in the other embodiments.

Embodiment 6

In this embodiment, an example of a method for manufacturing a transistor including an oxide semiconductor layer will be described in detail with reference to drawings.

FIGS. 31A to 31E are cross-sectional views illustrating an example of a process of manufacturing a transistor 2510.

The transistor 2510 is an inverted staggered transistor having a bottom-gate structure, which is similar to the transistor 3410 illustrated in FIG. 30A.

An oxide semiconductor used for a semiconductor layer in this embodiment is an i-type (intrinsic) oxide semiconductor or a substantially i-type (intrinsic) oxide semiconductor. The i-type (intrinsic) oxide semiconductor or substantially i-type (intrinsic) oxide semiconductor is obtained in such a manner that hydrogen, which serves as a donor, is removed from an oxide semiconductor as much as possible, and the oxide semiconductor is highly purified so as to contain as few impurities that are not main components of the oxide semiconductor as possible. In other words, a feature is that a purified i-type (intrinsic) semiconductor, or a semiconductor close thereto, is obtained not by adding impurities but by removing impurities such as hydrogen or water as much as possible. Accordingly, the oxide semiconductor layer included in the transistor 2510 is an oxide semiconductor layer which is highly purified and made to be electrically i-type (intrinsic).

In addition, a purified oxide semiconductor includes extremely few carriers (close to zero), and the carrier concentration thereof is lower than $1\times10^{14}$/cm$^3$, preferably lower than $1\times10^{12}$/cm$^3$, more preferably $1\times10^{11}$/cm$^3$.

Because the oxide semiconductor includes extremely few carriers, the off-state current can be reduced in a transistor. The smaller the amount of off-state current is, the better.

Specifically, in the transistor including the oxide semiconductor layer, off-state current density per micrometer in a channel width at room temperature can be less than or equal to 10 aA/μm ($1\times10^{-17}$ A/μm), further less than or equal to 1 aA/μm ($1\times10^{-18}$ A/μm), still further less than or equal to 10 zA/μm ($1\times10^{-20}$ A/μm).

In addition, in the transistor 2510 including the oxide semiconductor layer, the temperature dependence of on-state current is hardly observed, and the variations in off-state current are extremely small.

A process of manufacturing the transistor 2510 over a substrate 2505 is described below with reference to FIGS. 31A to 31E.

First, a conductive film is formed over the substrate 2505 having an insulating surface, and then a gate electrode layer 2511 is formed in a first photolithography step and an etching step. Note that a resist mask may be formed by an inkjet method. Formation of the resist mask by an inkjet method needs no photomask; thus, manufacturing cost can be reduced.

As the substrate 2505 having an insulating surface, a substrate similar to the substrate 2400 described in Embodiment 5 can be used. In this embodiment, a glass substrate is used as the substrate 2505.

An insulating film serving as a base film may be provided between the substrate 2505 and the gate electrode layer 2511. The base film has a function of preventing diffusion of an impurity element from the substrate 2505, and can be formed to have a single-layer structure or a stacked structure using one or more of a silicon nitride film, a silicon oxide film, a silicon nitride oxide film, and a silicon oxynitride film.

The gate electrode layer 2511 can be formed using a metal material such as molybdenum, titanium, tantalum, tungsten, aluminum, copper, neodymium, or scandium, or an alloy material which contains any of these materials as its main component. The gate electrode layer 2511 is not limited to the single layer, and a stacked layer of different films may also be used.

Next, a gate insulating layer 2507 is formed over the gate electrode layer 2511. The gate insulating layer 2507 can be formed using a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer by a plasma-enhanced CVD method, a sputtering method, or the like. The gate insulating layer 2507 is not limited to the single layer, and a stacked layer of different films may also be used.

For the oxide semiconductor in this embodiment, an oxide semiconductor which is made to be an i-type semiconductor or a substantially i-type semiconductor by removing impurities is used. Such a highly-purified oxide semiconductor is highly sensitive to an interface state and interface charge; thus, an interface between the oxide semiconductor layer and the gate insulating layer is important. For that reason, the gate insulating layer that is to be in contact with a highly-purified oxide semiconductor needs to have high quality.

For example, high-density plasma-enhanced CVD using microwaves (e.g., a frequency of 2.45 GHz) is preferable because a dense high-quality insulating layer having high withstand voltage can be formed. The highly-purified oxide semiconductor and the high-quality gate insulating layer are in close contact with each other, whereby the interface state can be reduced and favorable interface characteristics can be obtained.

Needless to say, a different deposition method such as a sputtering method or a plasma-enhanced CVD method can be employed as long as a high-quality insulating layer can be formed as a gate insulating layer. Further, an insulating layer whose film quality and characteristic of the interface between the insulating layer and an oxide semiconductor are improved by heat treatment which is performed after formation of the insulating layer may be formed as a gate insulating layer. In any case, any insulating layer may be used as long as the insulating layer has characteristics of enabling reduction in interface state density of the interface between the insulating layer and an oxide semiconductor and formation of a favorable interface as well as having favorable film quality as a gate insulating layer. An example of using a sputtering method is described here.

In order that hydrogen, hydroxyl, and moisture might be contained in the gate insulating layer 2507 and an oxide semiconductor film 2530 as little as possible, it is preferable that the substrate 2505 over which the gate electrode layer 2511 is formed or the substrate 2505 over which layers up to and including the gate insulating layer 2507 are formed be preheated in a preheating chamber of a sputtering apparatus as pretreatment for deposition of the oxide semiconductor film 2530 so that impurities such as hydrogen or moisture adsorbed to the substrate 2505 are eliminated and removed. As an exhaustion unit provided in the preheating chamber, a cryopump is preferable. Note that this preheating treatment can be omitted. This preheating treatment may be similarly performed on the substrate 2505 over which layers up to and including a source electrode layer 2515a and a drain electrode layer 2515b are formed before formation of an insulating layer 2516.

Figure 31A:
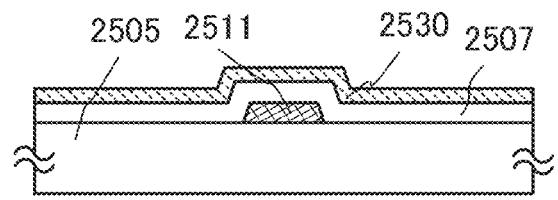
FIGS. 31A to 31E are cross-sectional views illustrating a manufacturing process of a transistor.
Figure 31B:
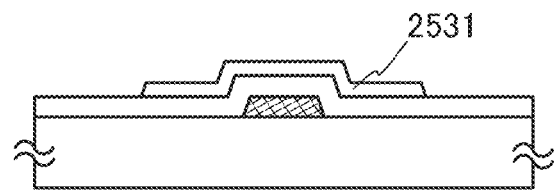
Figure 31C:
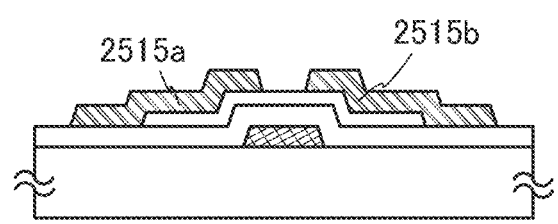

Next, the oxide semiconductor film 2530 having a thickness greater than or equal to 2 nm and less than or equal to 200 nm, preferably greater than or equal to 5 nm and less than or equal to 30 nm is formed over the gate insulating layer 2507 (see FIG. 31A).

Note that before the oxide semiconductor film 2530 is formed by a sputtering method, powder substances (also referred to as particles or dust) attached on a surface of the gate insulating layer 2507 are preferably removed by reverse sputtering in which an argon gas is introduced and plasma is generated. The reverse sputtering refers to a method in which an RF power source is used for application of voltage to a substrate side in an argon atmosphere so that ionized argon collides with the substrate to modify a surface. Note that instead of argon, nitrogen, helium, oxygen, or the like may be used.

As an oxide semiconductor used for the oxide semiconductor film 2530, the oxide semiconductor described in Embodiment 5, such as a four-component metal oxide, a three-component metal oxide, a two-component metal oxide, an In—O-based metal oxide, a Sn—O-based metal oxide, or a Zn—O-based metal oxide can be used. Further, Si may be contained in the oxide semiconductor. In this embodiment, the oxide semiconductor film 2530 is deposited by a sputtering method using an In—Ga—Zn—O-based oxide semiconductor target. Alternatively, the oxide semiconductor film 2530 can be formed by a sputtering method in a rare gas (typically, argon) atmosphere, an oxygen atmosphere, or a mixed atmosphere containing a rare gas (typically, argon) and oxygen.

As a target for forming the oxide semiconductor film 2530 by a sputtering method, for example, a metal oxide having the following composition ratio is used: the composition ratio of $In_2O_3:Ga_2O_3:ZnO$ is 1:1:1 [molar ratio]. Alternatively, a metal oxide having the following composition ratio may be used: the composition ratio of $In_2O_3:Ga_2O_3:ZnO$ is 1:1:2 [molar ratio]. The filling factor of such a target is from 90% to 100%, inclusive, preferably 95% to 99.9%, inclusive. With the use of a metal oxide target with high filling factor, the deposited oxide semiconductor film has high density.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, in a target used for forming an In—Zn—O-based oxide semiconductor which has an atomic ratio of In:Zn:O=X:Y:Z, the relation of Z>1.5X+Y is satisfied.

It is preferable that a high-purity gas from which impurities such as hydrogen, water, hydroxyl, or hydride are removed be used as the sputtering gas for the deposition of the oxide semiconductor film 2530.

The substrate is placed in a deposition chamber under reduced pressure, and the substrate temperature is set to a temperature higher than or equal to 100° C. and lower than or equal to 600° C., preferably higher than or equal to 200° C. and lower than or equal to 400° C. By forming the oxide semiconductor film in a state where the substrate is heated, the impurity concentration in the formed oxide semiconductor film can be reduced. Moreover, damage to the film due to sputtering is reduced. The oxide semiconductor film 2530 is formed over the substrate 2505 in such a manner that a sputtering gas from which hydrogen and moisture have been removed is introduced into the deposition chamber while moisture remaining therein is removed, and the above-described target is used. In order to remove the moisture remaining in the deposition chamber, an entrapment vacuum pump, for example, a cryopump, an ion pump, or a titanium sublimation pump is preferably used. As an exhaustion unit, a turbo molecular pump to which a cold trap is added may be used. In the deposition chamber which is evacuated with the cryopump, a hydrogen atom, a compound containing a hydrogen atom, such as water ($H_2O$), (more preferably, also a compound containing a carbon atom), and the like are removed, whereby the impurity concentration in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse direct current power source is preferable because powder substances (also referred to as particles or dust) generated in deposition can be reduced and the film thickness can be uniform.

Then, the oxide semiconductor film 2530 is processed into an island-shaped oxide semiconductor layer in a second photolithography step and an etching step. Here, a resist mask used for formation of the island-shaped oxide semiconductor layer may be formed by an inkjet method. Formation of the resist mask by an inkjet method needs no photomask; thus, manufacturing cost can be reduced.

In the case where a contact hole is formed in the gate insulating layer 2507, a step of forming the contact hole can be performed at the same time as processing of the oxide semiconductor film 2530.

Note that the etching of the oxide semiconductor film 2530 may be dry etching, wet etching, or both dry etching and wet etching. As an etchant used for wet etching of the oxide semiconductor film 2530, for example, a mixed solution of phosphoric acid, acetic acid, and nitric acid, or the like can be used. Alternatively, ITO-07N (produced by KANTO CHEMICAL CO., INC.) may be used.

Next, the oxide semiconductor layer is subjected to first heat treatment. The oxide semiconductor layer can be dehydrated or dehydrogenated by this first heat treatment. The first heat treatment is performed at a temperature higher than or equal to 400° C. and lower than or equal to 750° C., alternatively, higher than or equal to 400° C. and lower than the strain point of the substrate in an atmosphere of nitrogen or a rare gas such as helium, neon, or argon. Here, the substrate is introduced into an electric furnace which is one of heat treatment apparatuses, and heat treatment is performed on the oxide semiconductor layer at 450° C. for one hour in a nitrogen atmosphere; thus, an oxide semiconductor layer 2531 which is subjected to dehydration or dehydrogenation is formed (see FIG. 31B).

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the first heat treatment, GRTA may be performed as follows. The substrate is transferred and put in an inert gas heated at a high temperature of 650° C. to 700° C., inclusive, is heated for several minutes, and is transferred and taken out of the inert gas heated at the high temperature.

Note that in the first heat treatment, it is preferable that water, hydrogen, and the like be not contained in an inert gas which is introduced into a heat treatment apparatus. Alternatively, the purity of the inert gas is preferably 6N (99.9999%) or more, more preferably 7N (99.99999%) or more (that is, the impurity concentration is 1 ppm or less, preferably 0.1 ppm or less).

Further, after the oxide semiconductor layer is heated in the first heat treatment, a high-purity oxygen gas, a high-purity $N_2O$ gas, or an ultra-dry air (the dew point is lower than or equal to −40° C., preferably lower than or equal to −60° C.) may be introduced into the same furnace. The purity of an oxygen gas or an $N_2O$ gas which is introduced into the heat treatment apparatus is preferably 6N or more, more preferably 7N or more (that is, the impurity concentration in the oxygen gas or the $N_2O$ gas is 1 ppm or less, preferably 0.1 ppm or less). It is preferable that water, hydrogen, and the like be not contained in these gases in particular. By the action of the oxygen gas or the $N_2O$ gas, oxygen which is a main component of the oxide semiconductor and which has been eliminated at the same time as the step for removing impurities by dehydration or dehydrogenation can be supplied. Through this step, the oxide semiconductor layer can be highly purified and made to be an electrically i-type (intrinsic) oxide semiconductor.

The first heat treatment for the oxide semiconductor layer can be performed on the oxide semiconductor film 2530 that has not been processed into the island-shaped oxide semiconductor layer. In that case, the substrate is taken out from the heat apparatus after the first heat treatment, and then a photolithography step is performed.

Note that the first heat treatment may be performed at any of the following timings in addition to the above timing as long as after deposition of the oxide semiconductor layer: after a source electrode layer and a drain electrode layer are formed over the oxide semiconductor layer and after an insulating layer is formed over the source electrode layer and the drain electrode layer.

Further, in the case where a contact hole is formed in the gate insulating layer 2507, the formation of the contact hole may be performed either before or after the first heat treatment is performed on the oxide semiconductor film 2530.

An oxide semiconductor layer formed in the following manner may also be used: an oxide semiconductor is deposited twice, and heat treatment is performed thereon twice. Through such steps, a crystal region which is c-axis-aligned perpendicularly to a surface of the film and has a large thickness can be formed without depending on a base component.

For example, a first oxide semiconductor film with a thickness greater than or equal to 3 nm and less than or equal to 15 nm is deposited, and first heat treatment is performed in a nitrogen, an oxygen, a rare gas, or a dry air atmosphere at a temperature higher than or equal to 450° C. and lower than or equal to 850° C. or preferably higher than or equal to 550° C. and lower than or equal to 750° C., so that a first oxide semiconductor film having a crystal region in a region including a surface is formed. Then, a second oxide semiconductor film which has a larger thickness than the first oxide semiconductor film is formed, and second heat treatment is performed at a temperature higher than or equal to 450° C. and lower than or equal to 850° C., preferably higher than or equal to 600° C. and lower than or equal to 700° C.

Through such steps, in the entire second oxide semiconductor film, crystal growth can proceed from the lower part to the upper part using the first oxide semiconductor film as a seed crystal, whereby an oxide semiconductor layer having a thick crystal region can be formed.

Next, a conductive film to be the source electrode layer and the drain electrode layer (including a wiring formed from the same layer as the source electrode layer and the drain electrode layer) is formed over the gate insulating layer 2507 and the oxide semiconductor layer 2531. As the conductive film serving as the source electrode layer and the drain electrode layer, a material which is similar to the material used for the source electrode layer 2405a and the drain electrode layer 2405b described in Embodiment 5 can be used.

A resist mask is formed over the conductive film in a third photolithography step and selective etching is performed, so that the source electrode layer 2515a and the drain electrode layer 2515b are formed. Then, the resist mask is removed (see FIG. 31C).

Light exposure at the time of the formation of the resist mask in the third photolithography step may be performed using ultraviolet light, KrF laser light, or ArF laser light. The channel length L of the transistor that is completed later is determined by a distance between bottom end portions of the source electrode layer and the drain electrode layer, which are adjacent to each other over the oxide semiconductor layer 2531. In the case where the channel length L is less than 25 nm, the light exposure at the time of the formation of the resist mask in the third photolithography step may be performed using extreme ultraviolet light having an extremely short wavelength of several nanometers to several tens of nanometers. In the light exposure by extreme ultraviolet light, the resolution is high and the focus depth is large. Therefore, the channel length L of the transistor formed later can be 10 nm to 1000 nm, inclusive, operation speed of the circuit can be increased, and power consumption can be reduced because an off-state current value is extremely low.

In order to reduce the number of photomasks and steps in the photolithography step, the etching step may be performed using a resist mask formed by a multi-tone mask. Because light which passes through the multi-tone mask has a plurality of intensity levels, a resist mask which partly has a different thickness can be formed. The shape of the resist mask can be changed by ashing; therefore, a resist mask with different shapes can be formed without a photolithography process being performed. Thus, the number of light-exposure masks can be reduced and the number of corresponding photolithography steps can also be reduced, whereby simplification of a process can be realized.

Note that it is preferable that etching conditions be optimized so as not to etch and divide the oxide semiconductor layer 2531 when the conductive film is etched. However, it is difficult to obtain etching conditions in which only the conductive film is etched and the oxide semiconductor layer 2531 is not etched at all. In some cases, only part of the oxide semiconductor layer 2531 is etched to be an oxide semiconductor layer having a groove portion (a recessed portion) when the conductive film is etched.

In this embodiment, a Ti film is used as the conductive film and an In—Ga—Zn—O-based oxide semiconductor is used as the oxide semiconductor layer 2531; thus, an ammonia hydrogen peroxide solution (a mixed solution of ammonia, water, and a hydrogen peroxide solution) may be used as an etchant.

Next, the insulating layer 2516 serving as a protective insulating film is formed in contact with part of the oxide semiconductor layer. Before the formation of the insulating layer 2516, plasma treatment using a gas such as $N_2O$, $N_2$, or Ar may be performed to remove water or the like adsorbed on an exposed surface of the oxide semiconductor layer.

The insulating layer 2516 can be formed to a thickness of at least 1 nm by a method through which impurities such as water or hydrogen do not enter the insulating layer 2516, such as a sputtering method, as appropriate. When hydrogen is contained in the insulating layer 2516, hydrogen might enter the oxide semiconductor layer or oxygen might be extracted from the oxide semiconductor layer by hydrogen. In such a case, the resistance of the oxide semiconductor layer on the backchannel side might be decreased (the oxide semiconductor layer on the backchannel side might have n-type conductivity) and a parasitic channel might be formed. Therefore, it is important to form the insulating layer 2516 by a method through which hydrogen and impurities containing hydrogen are not contained therein.

In this embodiment, a silicon oxide film is formed to a thickness of 200 nm as the insulating layer 2516 by a sputtering method. The substrate temperature in film formation may be higher than or equal to room temperature and lower than or equal to 300° C. and in this embodiment, is 100° C. The silicon oxide film can be deposited by a sputtering method in a rare gas (typically, argon) atmosphere, an oxygen atmosphere, or a mixed atmosphere containing a rare gas and oxygen. As a target, a silicon oxide or silicon can be used. For example, with the use of silicon for the target, a silicon oxide film can be formed by sputtering under an atmosphere containing oxygen. For the insulating layer 2516 which is formed in contact with the oxide semiconductor layer, an inorganic insulating film that hardly contains impurities such as moisture, a hydrogen ion, and hydroxyl and that blocks entry of such impurities from the outside is preferably used. Typically, a silicon oxide film, a silicon oxynitride film, an aluminum oxide film, an aluminum oxynitride film, or the like can be used.

In order to remove moisture remaining in the deposition chamber for forming the insulating layer 2516 at the same time as deposition of the oxide semiconductor film 2530, an entrapment vacuum pump (such as a cryopump) is preferably used. When the insulating layer 2516 is deposited in the deposition chamber evacuated using a cryopump, the impurity concentration in the insulating layer 2516 can be reduced. In addition, as an evacuation unit for removing moisture remaining in the deposition chamber of the insulating layer 2516, a turbo molecular pump provided with a cold trap may be used.

It is preferable that a high-purity gas from which impurities such as hydrogen, water, hydroxyl, or hydride are removed be used as the sputtering gas for the deposition of the insulating layer 2516.

Next, second heat treatment is performed in an inert gas atmosphere or an oxygen gas atmosphere (preferably at a temperature of 200° C. to 400° C. inclusive, for example, 250° C. to 350° C. inclusive). For example, the second heat treatment is performed in a nitrogen atmosphere at 250° C. for one hour. In the second heat treatment, part of the oxide semiconductor layer (channel formation region) is heated in the state where it is in contact with the insulating layer 2516.

Through the above steps, oxygen which is one of main components of the oxide semiconductor and which is reduced together with impurities such as hydrogen, moisture, hydroxyl, or hydride (also referred to as a hydrogen compound) through the first heat treatment performed on the oxide semiconductor film can be supplied. Thus, the oxide semiconductor layer is highly purified and is made to be an electrically i-type (intrinsic) semiconductor.

Figure 31D:
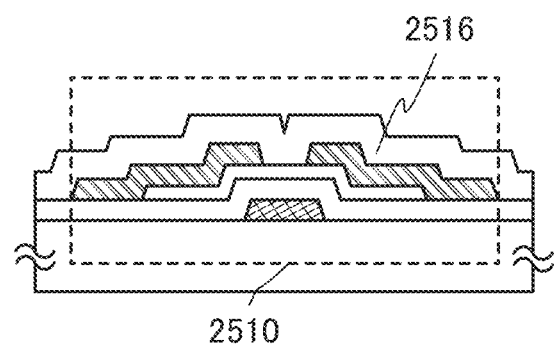
Figure 31E:
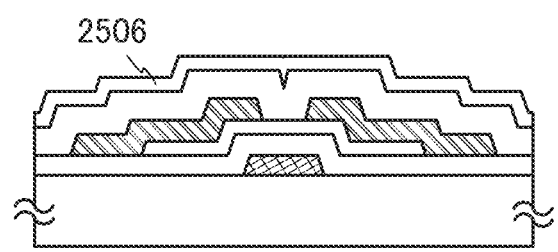

Through the above steps, the transistor 2510 is formed (see FIG. 31D).

When a silicon oxide layer having a lot of defects is used as the oxide insulating layer, impurities such as hydrogen, moisture, hydroxyl, or hydride contained in the oxide semiconductor layer can be diffused into the silicon oxide layer through the heat treatment performed after the silicon oxide layer is formed. That is, the impurities in the oxide semiconductor layer can be further reduced.

A protective insulating layer 2506 may be further formed over the insulating layer 2516. For example, a silicon nitride film is formed by a sputtering method. An inorganic insulating film which hardly contains impurities such as moisture and can prevents entry of the impurities from the outside, such as a silicon nitride film or an aluminum nitride film, is preferably used as the protective insulating layer. In this embodiment, the protective insulating layer 2506 is formed using a silicon nitride film (see FIG. 31E).

A silicon nitride film used for the protective insulating layer 2506 is formed in such a manner that the substrate 2505 over which layers up to and including the insulating layer 2516 are formed is heated to higher than or equal to 100° C. and lower than or equal to 400° C., a sputtering gas containing high-purity nitrogen from which hydrogen and moisture are removed is introduced, and a target of silicon is used. Also in that case, the protective insulating layer 2506 is preferably formed while moisture remaining in the treatment chamber is removed, similarly to the insulating layer 2516.

After the protective insulating layer is formed, heat treatment may be further performed at a temperature higher than or equal to 100° C. and lower than or equal to 200° C. in air for longer than or equal to 1 hour and shorter than or equal to 30 hours. This heat treatment may be performed at a fixed temperature. Alternatively, the following change in temperature is set as one cycle and may be repeated plural times: the temperature is increased from room temperature to a heating temperature and then decreased to room temperature.

In this manner, with the use of the transistor including a highly-purified oxide semiconductor layer manufactured using this embodiment, the value of current in an off state (an off-state current value) can be further reduced.

In addition, because the transistor including a highly-purified oxide semiconductor layer has high field-effect mobility, high-speed operation is possible. Therefore, a driver circuit portion can be formed on one substrate of, for example, a display device or the like; therefore, the number of components can be reduced.

This embodiment can be implemented in combination with any of the other embodiments, as appropriate.

Example 1

In this example, charge holding characteristics of an image sensor having a pixel circuit configuration which is one embodiment of the present invention will be described.

Figure 32A:
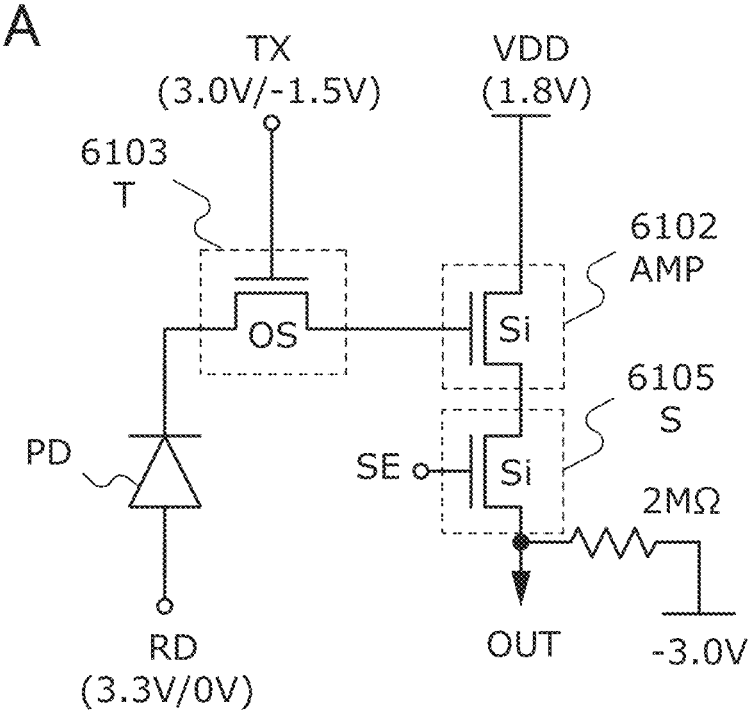
FIGS. 32A and 32B are diagrams each illustrating a circuit configuration of a pixel in an image sensor.
Figure 32B:
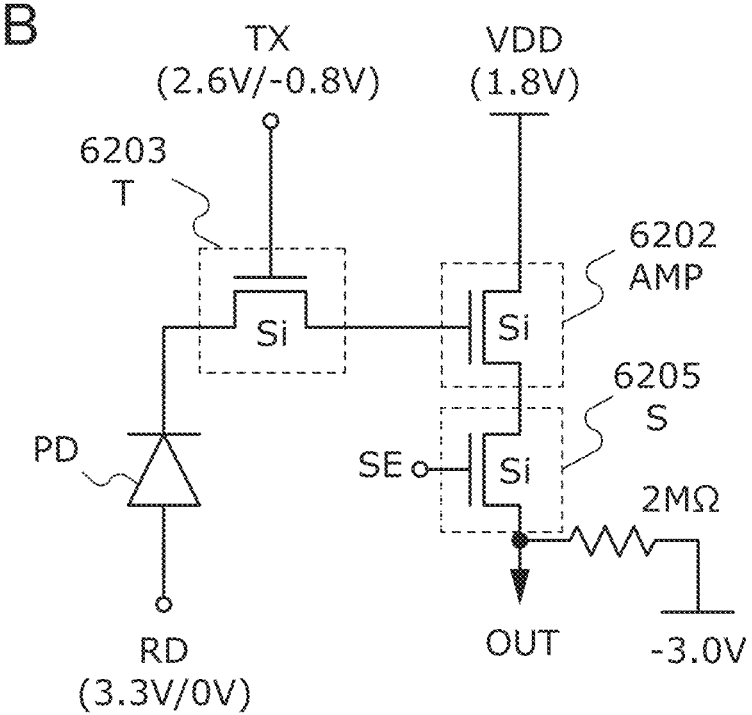

FIGS. 32A and 32B are circuit diagrams based on FIG. 24 according to Embodiment 3. In FIG. 32A, a transistor including an oxide semiconductor is used for a charge accumulation control transistor 6103, and a transistor including a silicon semiconductor is used for each of an amplifying transistor 6102 and a selection transistor 6105.

On the other hand, in FIG. 32B, a transistor including a silicon semiconductor is used for all of a charge accumulation control transistor 6203, an amplifying transistor 6202, and a selection transistor 6205.

In this example, image sensors are formed using the pixels illustrated in the circuit diagrams of FIGS. 32A and 32B, and results of comparison between charge holding capabilities using output characteristics of the image sensors are described.

The details of characteristics of the operations of the pixel circuits in FIGS. 32A and 32B are described in Embodiment 3; therefore, the description is omitted here. Note that a potential in each signal line is as follows.

First, as common potentials in the pixel circuits of FIGS. 32A and 32B, a power supply line was set to 1.8 V, a high level potential of a reset signal line was set to 3.3 V, and a low level potential of the reset signal line was set to 0 V.

Only a potential of a charge accumulation control signal line is not the same in order to correspond to characteristics of each transistor. In the pixel circuit of FIG. 32A, a high level potential of the charge accumulation control signal line was set to 3.0 V, and a low level potential thereof was set to −1.5 V. In the pixel circuit of FIG. 32B, a high level potential of the charge accumulation control signal line was set to 2.6 V, and a low level potential thereof was set to −0.8 V.

Figure 33:
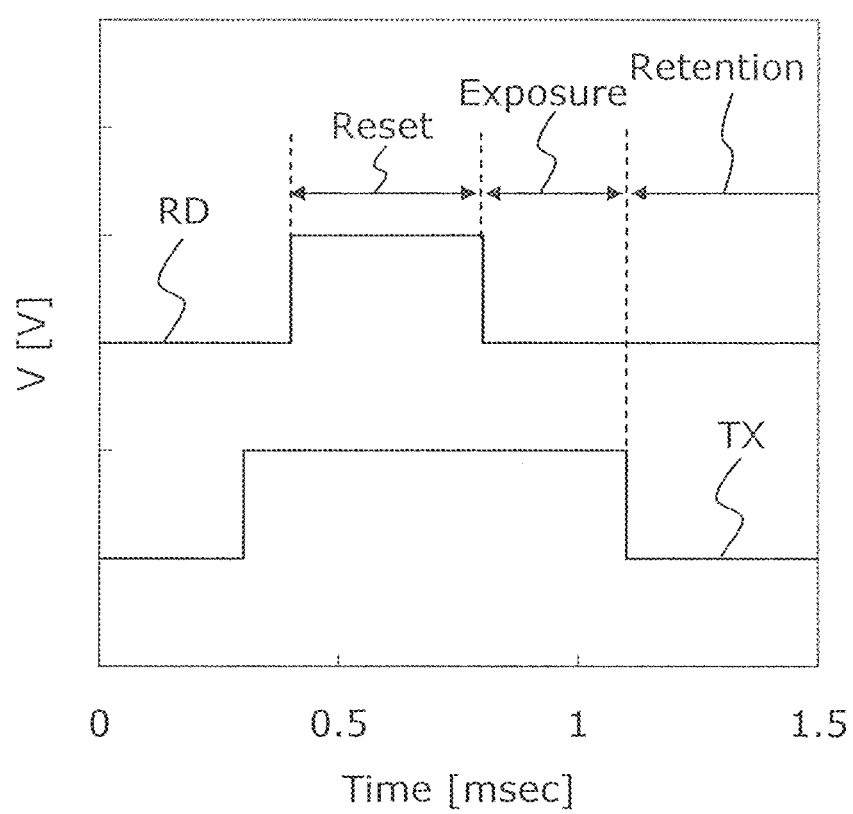
FIG. 33 is a timing chart illustrating an input signal of an image sensor.

FIG. 33 is a timing chart which illustrates input signals of a charge accumulation control signal line (TX) and a reset signal line (RD). Here, a period in which the reset signal line has a high level potential corresponds to a reset period; a period during which the potential of the reset signal line is set at a low level and the potential of the charge accumulation control signal line falls to a low level corresponds to a light-exposure period (accumulation period); and a period after the time when the potential of the charge accumulation control signal line is set to a low level corresponds to a holding period.

Figure 34A:
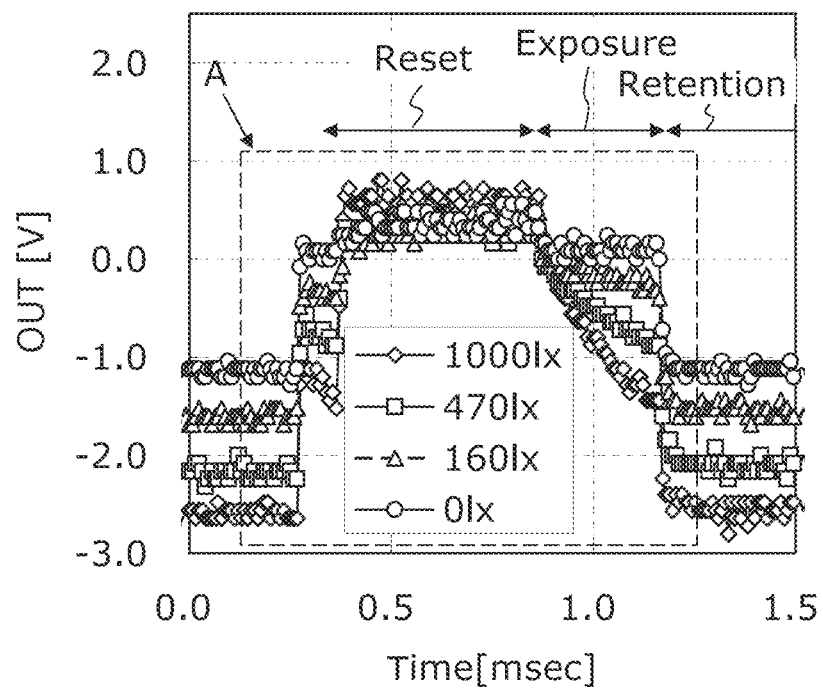
FIGS. 34A and 34B are diagrams each illustrating an output signal of an image sensor.

FIG. 34A shows output characteristics when the signal in FIG. 33 was input to an image sensor having the pixel circuit of FIG. 32A at each illuminance. The illuminance used for a test is 0 lx, 160 lx, 470 lx, and 1000 lx. During the reset period, a similar output is shown in each illuminance because the reset potential is supplied; and in the light-exposure period, the output changes with different slopes are shown. Then, in the holding period, an output in each illuminance is held. With such an operation, light intensity can be converted to a signal. Here, when the potential of the charge accumulation control signal line is set at a high level or a low level, a value of an output varies by an effect of capacitive coupling of a charge accumulation control transistor; however, there is no influence on an output signal in the holding period.

Figure 34B:
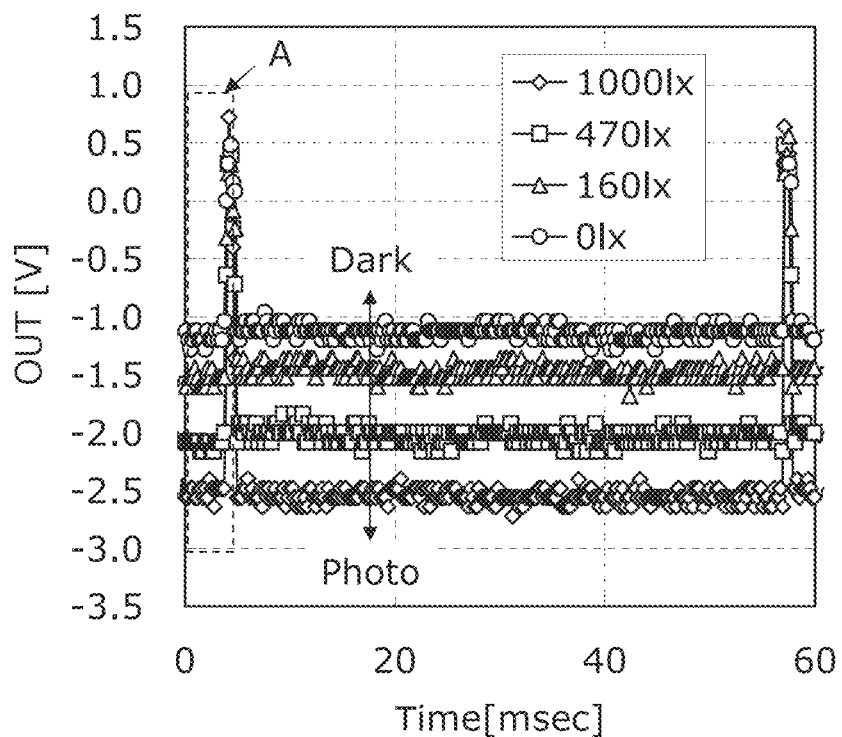

FIG. 34B shows output characteristics at each illuminance described above, which are obtained for a long time. A dotted frame A of FIG. 34A corresponds to a dotted frame A of FIG. 34B.

As is clear here, it is found that an output signal has almost no change with respect to the temporal axis at any illuminance and an image sensor having the pixel circuit in FIG. 32A has extremely good holding characteristics.

Figure 35A:
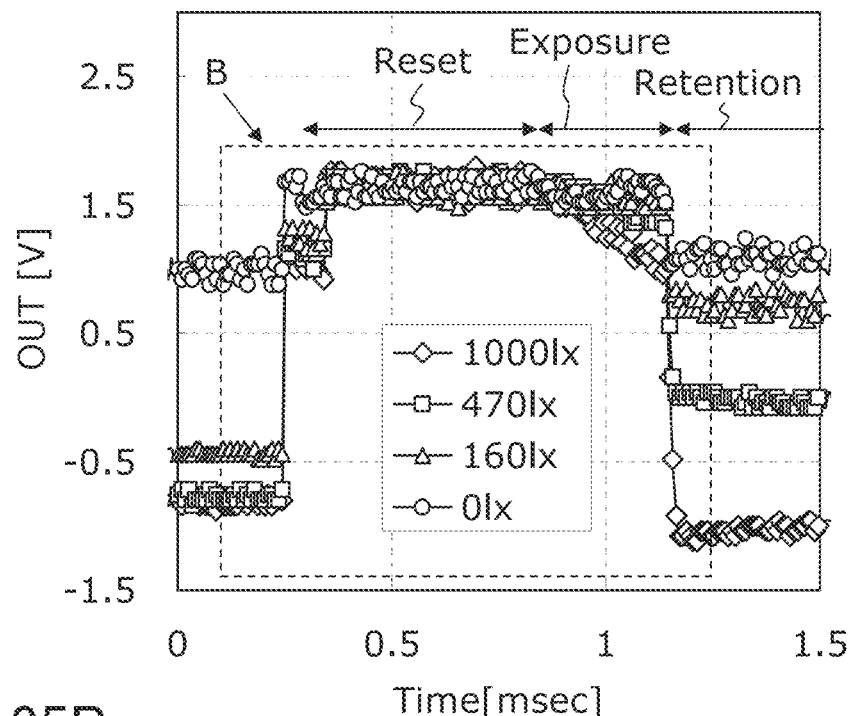
FIGS. 35A and 35B are diagrams each illustrating an output signal of an image sensor.

On the other hand, FIG. 35A shows output characteristics when the signal in FIG. 33 was input to an image sensor having the pixel circuit of FIG. 32B at each illuminance. The illuminance used for a test is 0 lx, 160 lx, 470 lx, and 1000 lx. It is found that different output characteristics are shown at each illuminance as in FIG. 34A. Note that 0 lx means a dark condition.

Figure 35B:
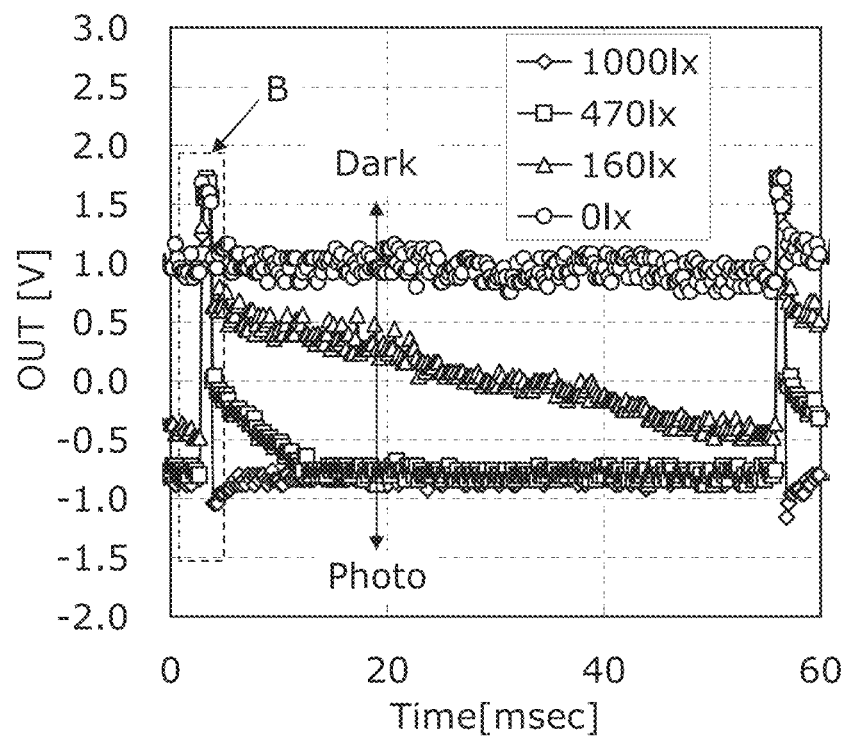

FIG. 35B shows output characteristics at each illuminance described above, which are obtained for a long time. Here, it is found that the output signal falls as time passes, which is largely different from that of FIG. 34B. In particular, it is remarkable in the case of high illuminance. A signal corresponding to illuminance is held while having a slope at the beginning of the holding time; however, the signal of 1000 lx and the signal of 470 lx eventually overlap with each other. This means that both signals cannot be held and determination becomes impossible.

In the case of 0 lx, the signal is held, which is caused by sufficiently small dark current of the photodiode. The cause of extremely weak holding capability of charge in the case of high illuminance is the leakage current of the transistor including a silicon semiconductor. Because the leakage current is high, when light current flows to the photodiode, charge flows out by the leakage current of the transistor. Needless to say, charge similarly flows out in the case where the photodiode has high dark current.

In this manner, because the transistor including an oxide semiconductor has extremely low leakage current, a circuit with extremely high charge holding capability as illustrated in FIG. 34B can be realized. Accordingly, it can be said that using a transistor including an oxide semiconductor for a transistor connected to the signal charge accumulation portion of the pixel is useful for the global shutter system which needs a long charge holding period.

This example can be implemented in combination with any of the embodiments or the other example, as appropriate.

Example 2

A display device according to one embodiment of the present invention is characterized by obtaining image data with high resolution. Therefore, an electronic device using the display device according to one embodiment of the present invention can be more sophisticated by adding the display device as a component.

For example, the display device can be used for display devices, laptop computers, or image reproducing devices provided with recording media (typically, devices which reproduce the content of recording media such as DVDs (digital versatile discs), and have displays for displaying the reproduced images). In addition to the above examples, as an electronic device which can include the display device according to one embodiment of the present invention, mobile phones, portable game machines, portable information terminals, e-book readers, video cameras, digital still cameras, goggle-type displays (head mounted displays), navigation systems, audio reproducing devices (e.g., car audio components and digital audio players), copiers, facsimiles, printers, multifunction printers, automated teller machines (ATM), vending machines, and the like can be given. Specific examples of such an electronic device are illustrated in FIGS. 36A to 36D.

Figure 36A:
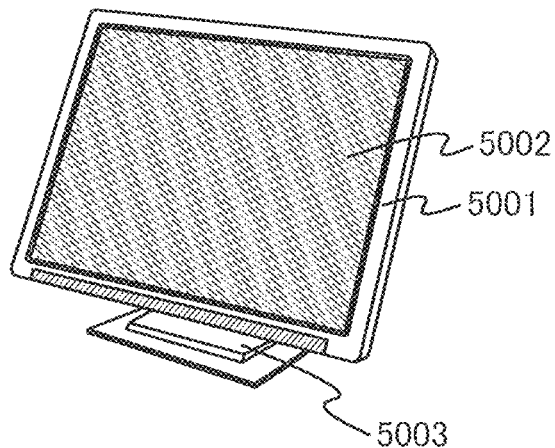
FIGS. 36A to 36D are diagrams each illustrating a specific example of an electronic device.

FIG. 36A illustrates a display device including a housing 5001, a display portion 5002, a supporting base 5003, and the like. The display device according to one embodiment of the present invention can be used for the display portion 5002. The use of the display device according to one embodiment of the present invention for the display portion 5002 can provide a display device capable of obtaining image data with high resolution and capable of being equipped with higher-functional applications. Note that the display device includes all display devices for displaying information, such as display devices for personal computers, display devices for receiving TV broadcasts, and display devices for displaying advertisements.

Figure 36B:
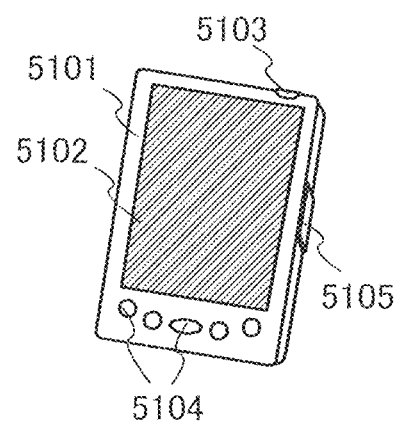

FIG. 36B illustrates a portable information terminal including a housing 5101, a display portion 5102, a switch 5103, operation keys 5104, an infrared rays port 5105, and the like. The display device according to one embodiment of the present invention can be used for the display portion 5102. The use of the display device according to one embodiment of the present invention for the display portion 5102 can provide a portable information terminal capable of obtaining image data with high resolution and being equipped with higher-functional applications.

Figure 36C:
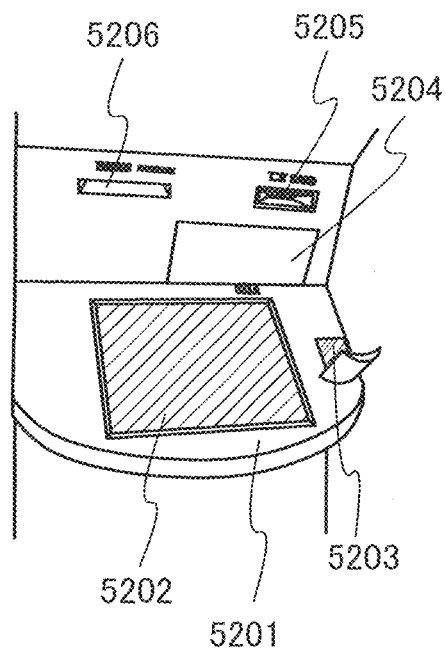

FIG. 36C illustrates an automated teller machine including a housing 5201, a display portion 5202, a coin slot 5203, a bill slot 5204, a card slot 5205, a bankbook slot 5206, and the like. The display device according to one embodiment of the present invention can be used for the display portion 5202. The use of the display device according to one embodiment of the present invention for the display portion 5202 can provide an automated teller machine capable of obtaining image data with high resolution and being more sophisticated. The automated teller machine using the display device according to one embodiment of the present invention can read information of living body such as a finger print, a face, a handprint, a palm print, a pattern of a hand vein, an iris, and the like which are used for biometrics with higher accuracy. Therefore, a false non-match rate which is caused by false recognition of a person to be identified as a different person and a false acceptance rate which is caused by false recognition of a different person as a person to be identified can be suppressed.

Figure 36D:
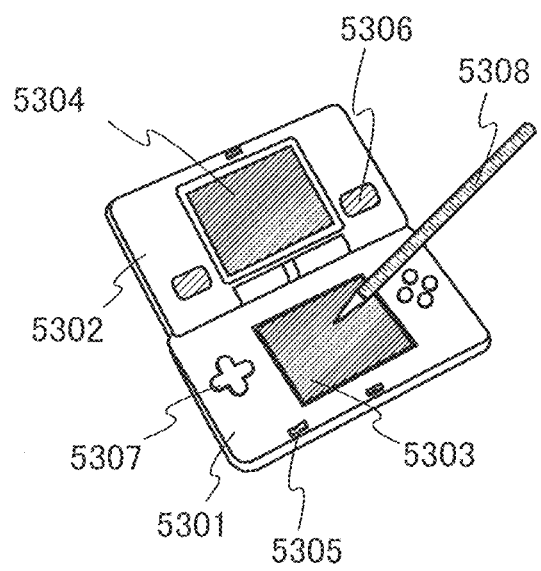

FIG. 36D illustrates a portable game machine including a housing 5301, a housing 5302, a display portion 5303, a display portion 5304, a microphone 5305, speakers 5306, an operation key 5307, a stylus 5308, and the like. The display device according to one embodiment of the present invention can be used for the display portion 5303 or the display portion 5304. The use of the display device according to one embodiment of the present invention for the display portion 5303 or the display portion 5304 can provide a portable game machine capable of obtaining image data with high resolution and being equipped with higher-functional applications. Note that although the portable game machine illustrated in FIG. 36D includes the two display portions 5303 and 5304, the number of display portions included in the portable game machine is not limited to two.

This example can be implemented in combination with any of the other embodiments or the other example, as appropriate.

This application is based on Japanese Patent Application serial no. 2010-050486 filed with the Japan Patent Office on Mar. 8, 2010, the entire contents of which are hereby incorporated by reference.

What is claimed is:
1. An image sensor comprising:
a first transistor comprising a silicon semiconductor;
a second transistor comprising a silicon semiconductor;
a third transistor comprising a silicon semiconductor;
a fourth transistor comprising a silicon semiconductor; and
a photodiode,
wherein one of a source and a drain of the first transistor is electrically connected to an output signal line,
wherein the other of the source and the drain of the first transistor is electrically connected to one of a source and a drain of the second transistor, wherein a gate of the second transistor is electrically connected to one of a source and a drain of the third transistor through a wiring layer,
wherein the gate of the second transistor is electrically connected to one of a source and a drain of the fourth transistor through the wiring layer,
wherein the other of the source and the drain of the fourth transistor is electrically connected to the photodiode,
wherein the other of the source and the drain of the second transistor is electrically connected to a power supply line,
wherein the other of the source and the drain of the third transistor is electrically connected to the power supply line,
wherein in a top view, a first part of the power supply line comprises a region overlapping with the second transistor,
wherein in the top view, a second part of the power supply line comprises a region overlapping with the third transistor,
wherein in the top view, the first part of the power supply line is parallel to the second part of the power supply line,
wherein the output signal line, the first and second parts of the power supply line, and a first part of the wiring layer extend along a first direction,
wherein in the top view, a second part of the wiring layer is parallel to a third part of the wiring layer,
wherein in the top view, the second and third parts of the wiring layer extend along a second direction intersecting with the first direction,
wherein in the top view, the first part of the wiring layer is positioned between the second and third parts of the wiring layer, and
wherein the output signal line and the first and second parts of the power supply line are positioned over and in direct contact with a same insulating surface.

2. A display device comprising:
the image sensor according to claim 1; and
a display element.

3. An image sensor comprising:
a first transistor comprising a silicon semiconductor;
a second transistor comprising a silicon semiconductor;
a third transistor comprising a silicon semiconductor;
a fourth transistor comprising a silicon semiconductor; and
a photodiode,
wherein one of a source and a drain of the first transistor is electrically connected to an output signal line,
wherein the other of the source and the drain of the first transistor is electrically connected to one of a source and a drain of the second transistor,
wherein a gate of the second transistor is electrically connected to one of a source and a drain of the third transistor through a wiring layer,
wherein the gate of the second transistor is electrically connected to one of a source and a drain of the fourth transistor through the wiring layer,
wherein the other of the source and the drain of the fourth transistor is electrically connected to one terminal of the photodiode,
wherein the other of the source and the drain of the second transistor is electrically connected to a power supply line,
wherein the other of the source and the drain of the third transistor is electrically connected to the power supply line,
wherein the other terminal of the photodiode is electrically connected to a potential line,
wherein in a top view, a first part of the power supply line comprises a region overlapping with the second transistor,
wherein in the top view, a second part of the power supply line comprises a region overlapping with the third transistor,
wherein in the top view, the first part of the power supply line is parallel to the second part of the power supply line,
wherein the output signal line, the first and second parts of the power supply line, a first part of the wiring layer, and the potential line extend along a first direction,
wherein in the top view, a second part of the wiring layer is parallel to a third part of the wiring layer,
wherein in the top view, the second and third parts of the wiring layer extend along a second direction intersecting with the first direction,
wherein in the top view, the first part of the wiring layer is positioned between the second and third parts of the wiring layer, and
wherein the output signal line and the first and second parts of the power supply line are positioned over and in direct contact with a same insulating surface.

4. A display device comprising:
the image sensor according to claim 3; and
a display element.

* * * * *